(12) United States Patent
Moline

(10) Patent No.: US 8,067,834 B2
(45) Date of Patent: Nov. 29, 2011

(54) SEMICONDUCTOR COMPONENT

(75) Inventor: Daniel D. Moline, Gilbert, AZ (US)

(73) Assignee: HVVi Semiconductors, Inc., Phoenix, AZ (US)

( * ) Notice: Subject to any disclaimer, the term of this patent is extended or adjusted under 35 U.S.C. 154(b) by 931 days.

(21) Appl. No.: 11/842,483

(22) Filed: Aug. 21, 2007

(65) Prior Publication Data

US 2009/0051018 A1 Feb. 26, 2009

(51) Int. Cl.
*H01L 23/34* (2006.01)

(52) U.S. Cl. .......... 257/712; 257/713; 257/E23.101; 257/E23.104

(58) Field of Classification Search .......... 257/675, 257/676, 688, 690, 692, 707, 719, 720, 735, 257/E23.101, E23.102
See application file for complete search history.

(56) References Cited

U.S. PATENT DOCUMENTS

| | | | |
|---|---|---|---|
| 5,008,736 A | 4/1991 | Davies et al. | |
| 6,307,755 B1 | 10/2001 | Williams et al. | |
| 6,455,925 B1 | 9/2002 | Laureanti | |
| 6,566,749 B1 * | 5/2003 | Joshi et al. | 257/706 |
| 6,586,833 B2 | 7/2003 | Baliga | |
| 6,617,686 B2 | 9/2003 | Davies | |
| 6,649,975 B2 | 11/2003 | Baliga | |
| 6,653,691 B2 | 11/2003 | Baliga | |
| 6,674,157 B2 | 1/2004 | Lang | |
| 6,727,117 B1 | 4/2004 | McCoy | |
| 6,759,746 B1 | 7/2004 | Davies | |
| 6,777,786 B2 | 8/2004 | Estacio | |
| 6,784,366 B1 | 8/2004 | Boucher et al. | |
| 6,867,481 B2 * | 3/2005 | Joshi et al. | 257/666 |
| 6,967,126 B2 | 11/2005 | Lee et al. | |
| 7,093,358 B2 | 8/2006 | Akram et al. | |
| 7,335,534 B2 | 2/2008 | Pavio | |
| 7,605,451 B2 | 10/2009 | Moline | |

(Continued)

FOREIGN PATENT DOCUMENTS

WO 2005/069378 7/2005

(Continued)

OTHER PUBLICATIONS

Davies, Robert B., "Power Semiconductor Device and Method Therefor", US Patent Application filed Mar. 23, 2006, U.S. Appl. No. 11/387,617, 176 pgs.

(Continued)

*Primary Examiner* — Evan Pert
*Assistant Examiner* — Leslie Pilar Cruz
(74) *Attorney, Agent, or Firm* — Cool Patent, P.C.; Kenneth J. Cool

(57) ABSTRACT

In various embodiments, semiconductor components and methods to manufacture these components are disclosed. In one embodiment, a method to manufacture a semiconductor component is disclosed. The semiconductor includes a heat sink and a semiconductor die that has a first terminal on a top surface of the semiconductor die, a second terminal on the top surface of the die, and a third terminal on the bottom surface of the die. The method includes attaching a first portion of a leadframe structure to the first terminal of the semiconductor die. The method further includes attaching the second terminal of the semiconductor die to the heat sink after the attaching of the first portion of the leadframe structure to the first terminal of the semiconductor die, wherein the leadframe structure is spaced apart from the heat sink and is electrically isolated from the heat sink. Other embodiments are described and claimed.

15 Claims, 43 Drawing Sheets

U.S. PATENT DOCUMENTS

| | | | |
|---|---|---|---|
| 2002/0056872 A1* | 5/2002 | Baliga | 257/330 |
| 2002/0135061 A1* | 9/2002 | Okamoto et al. | 257/703 |
| 2003/0020162 A1* | 1/2003 | Koike et al. | 257/712 |
| 2003/0062601 A1 | 4/2003 | Harnden et al. | |
| 2003/0218237 A1 | 11/2003 | Hall et al. | |
| 2004/0043539 A1 | 3/2004 | Lee et al. | |
| 2004/0065947 A1* | 4/2004 | Sugiyama et al. | 257/688 |
| 2004/0238934 A1* | 12/2004 | Warner et al. | 257/686 |
| 2005/0017339 A1 | 1/2005 | Yoshiba | |
| 2005/0121701 A1 | 6/2005 | Hirano et al. | |
| 2006/0189038 A1 | 8/2006 | Pavio | |
| 2006/0263944 A1 | 11/2006 | Lange | |
| 2007/0090434 A1 | 4/2007 | Davies et al. | |
| 2007/0096274 A1* | 5/2007 | Pavier et al. | 257/676 |
| 2007/0108594 A1* | 5/2007 | Ishii | 257/704 |
| 2007/0132091 A1 | 6/2007 | Wo et al. | |
| 2007/0296077 A1 | 12/2007 | Moline | |
| 2008/0017998 A1 | 1/2008 | Pavio | |
| 2008/0093718 A1 | 4/2008 | Pavio | |

FOREIGN PATENT DOCUMENTS

| | | |
|---|---|---|
| WO | 2009/025961 A2 | 2/2009 |

OTHER PUBLICATIONS

International Search Report and Written Opinion of the International Searching Authority; Dated Sep. 29, 2008; PCT/US2008/071142.

Office Action received for U.S. Appl. No. 12/392,391, mailed on Sep. 14, 2009, 12 pages.

Office Action received for U.S. Appl. No. 12/392,391, mailed on Feb. 17, 2010, 7 pages.

Office Action received for U.S. Appl. No. 11/475,625, mailed on Jun. 26, 2008, 11 pages.

Office Action received for U.S. Appl. No. 11/475,625, mailed on Mar. 18, 2009, 16 pages.

Office Action received for U.S. Appl. No. 11/458,566 mailed on Feb. 5, 2008, 18 pages.

Office Action received for U.S. Appl. No. 11/458,566, mailed on Aug. 15, 2008, 19 pages.

Office Action received for U.S. Appl. No. 11/458,566, mailed on Mar. 5 2009, 19 pages.

Office Action received for U.S. Appl. No. 11/958,889, mailed on Apr. 30, 2008, 5 pages.

Notice of Allowance received for U.S. Appl. No. 11/327,552, mailed on Oct. 2, 2007, 9 pages.

Advisory Action received for U.S. Appl. No. 11/475,625, mailed on May 28, 2009, 3 pages.

Notice of Allowance received for U.S. Appl. No. 11/475,625, mailed on Aug. 21, 2009, 10 pages.

Advisory Action Received for U.S. Appl. No. 11/458,566, mailed on Dec. 9, 2008, 3 pages.

Adamson, Philip, "Lead-free Packaging for Discrete Power Semiconductors", International IOR Rectifier—as presented at the 2002 JEDEC Conference, Apr./May 2002, 5 pages.

Bussarakons, Tiva, "New Materials and Technologies Solve Hermetic SMD Integration", International IOR Rectifier—as appeared in PCIM Power Electronic Systems Magazine, Dec. 1999, 5 pages.

Juhel, S., "PowerSO-10RF: The First True RF Power SMD Package", AN1294 Application Note, Feb. 2001, 12 pages.

Mahalingam, Mali, "Low Rth Device Packaging for High Power RF LDMOS Transistors for Cellular and 3G Base Station Use", Freescale Semiconductor, Inc. Motorola Inc. 2003, 4 pages.

Moline, Dan, "Semiconductor Component and Method of Manufacture", U.S. Appl. No. 11/475,625, filed Jun. 27, 2006; Confirmation #: 1042.

Pavio, Jeanne S., "Semiconductor Component and Method of Manufacture", U.S. Appl. No. 11/458,566, filed Jul. 19, 2006; Confirmation #: 8992.

Prophet, Graham, "Power FETs find their place", EDN Apr. 17, 2003, 6 pages.

Radivojevic, Z., "Novel Material for Improved Quality of RF-PA in Base-Station Applications", Presented at 10th International Workshop on Thermal Investigations of ICs and Systems Co-Authored by Nokia Research Center and Freescale Semiconductor Sep./Oct. 2004, 7 pages.

* cited by examiner

SEMICONDUCTOR COMPONENT

TECHNICAL FIELD

Embodiments disclosed in the present invention relate generally to electrical technology, and more specifically to a semiconductor component.

BACKGROUND

Semiconductor component manufacturers are constantly striving to increase the performance of their products. The packaging of semiconductor die may affect the performance of a semiconductor component that includes the semiconductor die. As those skilled in the art are aware, discrete semiconductor devices and integrated circuits are fabricated in wafers, which are then singulated or diced to produce semiconductor die. One or more semiconductor die are placed in a package to protect them from environmental and physical stresses.

The packing of semiconductor die should provide protection, permit transmission of electrical signals to and from the semiconductor die, and permit removal of heat generated by the semiconductor die. Further, different packing structures may increase the parasitic capacitances in a packaged semiconductor component which may decrease the frequency of operation of the packaged semiconductor component.

Accordingly, it would be desirable to have a semiconductor package that had improved thermal and electrical characteristics and a method for manufacturing the semiconductor package.

BRIEF DESCRIPTION OF THE DRAWINGS

The present invention will be better understood from a reading of the following detailed description, taken in conjunction with the accompanying drawing figures, in which like reference numbers designate like elements and in which.

Figure 1:
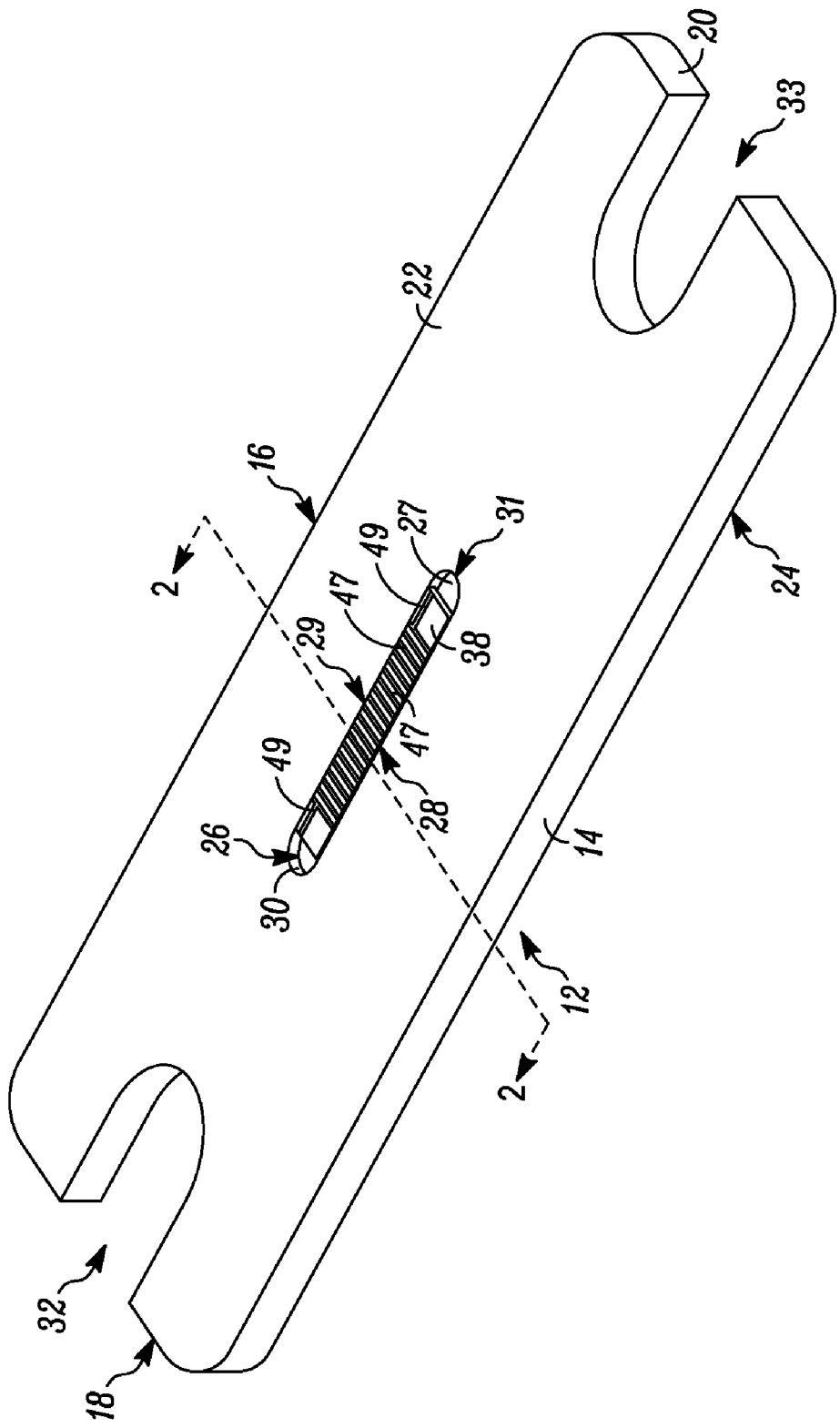
FIG. 1 is an isometric view of a flange used in the manufacture of a semiconductor component in accordance with an embodiment of the present invention.

For simplicity of illustration and ease of understanding, elements in the various figures are not necessarily drawn to scale, unless explicitly so stated. Further, if considered appropriate, reference numerals have been repeated among the figures to indicate corresponding and/or analogous elements. In some instances, well-known methods, procedures, components and circuits have not been described in detail so as not to obscure the present disclosure. The following detailed description is merely exemplary in nature and is not intended to limit the disclosure of this document and uses of the disclosed embodiments. Furthermore, there is no intention that the appended claims be limited by the title, technical field, background, or abstract.

DETAILED DESCRIPTION

In the following description and claims, the terms "comprise" and "include," along with their derivatives, may be used and are intended as synonyms for each other. In addition, in the following description and claims, the terms "coupled" and "connected," along with their derivatives, may be used. "Connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other. For example, "coupled" may mean that two or more elements do not contact each other but are indirectly joined together via another element or intermediate elements. Finally, the terms "on," "overlying," and "over" may be used in the following description and claims. "On," "overlying," and "over" may be used to indicate that two or more elements are in direct physical contact with each other. However, "over" may also mean that two or more elements are not in direct contact with each other. For example, "over" may mean that one element is above another element but not contact each other and may have another element or elements in between the two elements.

Generally, the present invention provides a semiconductor component and a method for manufacturing the semiconductor component. In some embodiments, a semiconductor component 10 (FIG. 18) is manufactured by forming a slot in a base structure such as, for example, a heat spreader or heat sink, and then inserting an interposer in the slot. Interposers may also be referred to as connectors and examples of interposers will be described in more detail below. The heat spreader or heat sink may also be referred to as a flange. In some embodiments, the interposer comprises a dielectric material and has an electrically conductive layer on the top surface of the dielectric material that may be patterned into a plurality of conductive strips such as, for example, metal strips, that are planar, or substantially planar, with the top surface of the flange after inserting the interposer in the slot. Because of the planarity between the top surface of the flange and the metal strips, semiconductor die having at least two terminals over the same surface of the semiconductor die can be coupled such that one terminal may be bonded to the surface of the flange and the other terminal is bonded to at least one of the metal strips. For example, semiconductor die having source and gate terminals on the same side of the semiconductor die can be coupled such that the source terminals are bonded to the surface of the flange and the gate terminals are bonded to the strips of the interposer. This side of the semiconductor die having the source and gate terminals may be referred to as the top or front of the semiconductor die. The strips of the interposer may be wirebonded to an input lead, for example, a gate lead, of the semiconductor component. The bottom or back of the semiconductor die may have an electrically conductive layer serving as the drain terminal of the semiconductor die, and the drain terminal may be wirebonded to an output lead, for example, a drain lead, of the semiconductor component. The source terminals, the gate terminals, and the drain terminal are electrically isolated from each other. The leads of the semiconductor component may comprise an electrically conductive material and may be referred to as electrical leads.

In other embodiments, a semiconductor component such as, for example, semiconductor component 198 (FIG. 26) or semiconductor component 298 (FIG. 33), is manufactured by forming a flex connector interposer having electrically conductive strips and coupling the flex connector to a semiconductor die. The semiconductor component may be a discrete semiconductor device and may include a discrete power transistor semiconductor die having gate and source terminals on the same side of the semiconductor die and a drain terminal on an opposite side of the semiconductor die. Gate terminals of the semiconductor die are bonded to one end of the electrically conductive strips of the flex connector and the other ends of the strips are bonded to a gate lead of the semiconductor component. The source terminals of the semiconductor die are bonded to a source lead of the semiconductor component and the drain terminal of the semiconductor die may be wirebonded to the drain lead of the semiconductor component.

In yet other embodiments, a semiconductor component 350 (FIG. 42) is manufactured by forming a leadframe interposer and coupling it to a semiconductor die. In these embodiments, a pedestal may be formed on a flange rather than a slot. The semiconductor component 350 may be a discrete semiconductor device and may include a discrete power transistor semiconductor die having gate and source terminals on the same side of the semiconductor die and a drain terminal on an opposite side of the semiconductor die. The source terminals of the semiconductor die are bonded to the pedestal of the flange and the gate terminals of the semiconductor die are coupled to the gate lead of the semiconductor component via the leadframe interposer and other elements such as, for example, wirebonds and a passive device in some embodiments. The drain terminal of the semiconductor die can be coupled to the drain lead of the semiconductor component using wirebonds. Semiconductor component 650 (FIG. 49) is another embodiment of a semiconductor component that includes a leadframe interposer.

FIG. 1 is an isometric view of a heatsink or flange 12 used in the manufacture of a semiconductor component 10 (FIG. 18) in accordance with an embodiment of the present invention. Flange 12 may also be referred to as a heat spreader, and has opposing sides 14 and 16 that are substantially parallel to each other, opposing sides 18 and 20 that are substantially parallel to each other, and opposing surfaces 22 and 24 that are substantially parallel to each other. Arrows are used in some of the figures to denote openings, voids, slots, cavities, and notches, and arrows are also used in some of the figures to denote surfaces or sides that are not visible in isometric views.

Surface 22 may be referred to as a top surface and surface 24 may be referred to as a bottom surface. In some embodiments, flange 12 is made from a material that is thermally and electrically conductive and has a coefficient of thermal expansion (CTE) matching, or substantially matching, that of silicon or ceramic. Examples of suitable materials for flange 12 include copper, an alloy such as a copper alloy, or a copper-tungsten alloy. In addition, the material for flange 12 may include metal laminates such as, for example, a copper-molybdenum-copper laminate. An advantage of using metal laminates is that their CTE's match that of silicon better than does the CTE of copper. The material for flange 12 is not a limitation of the present invention. Thus, flange 12 can be made from materials having CTE's that do not match those of silicon or ceramic.

Figure 11:
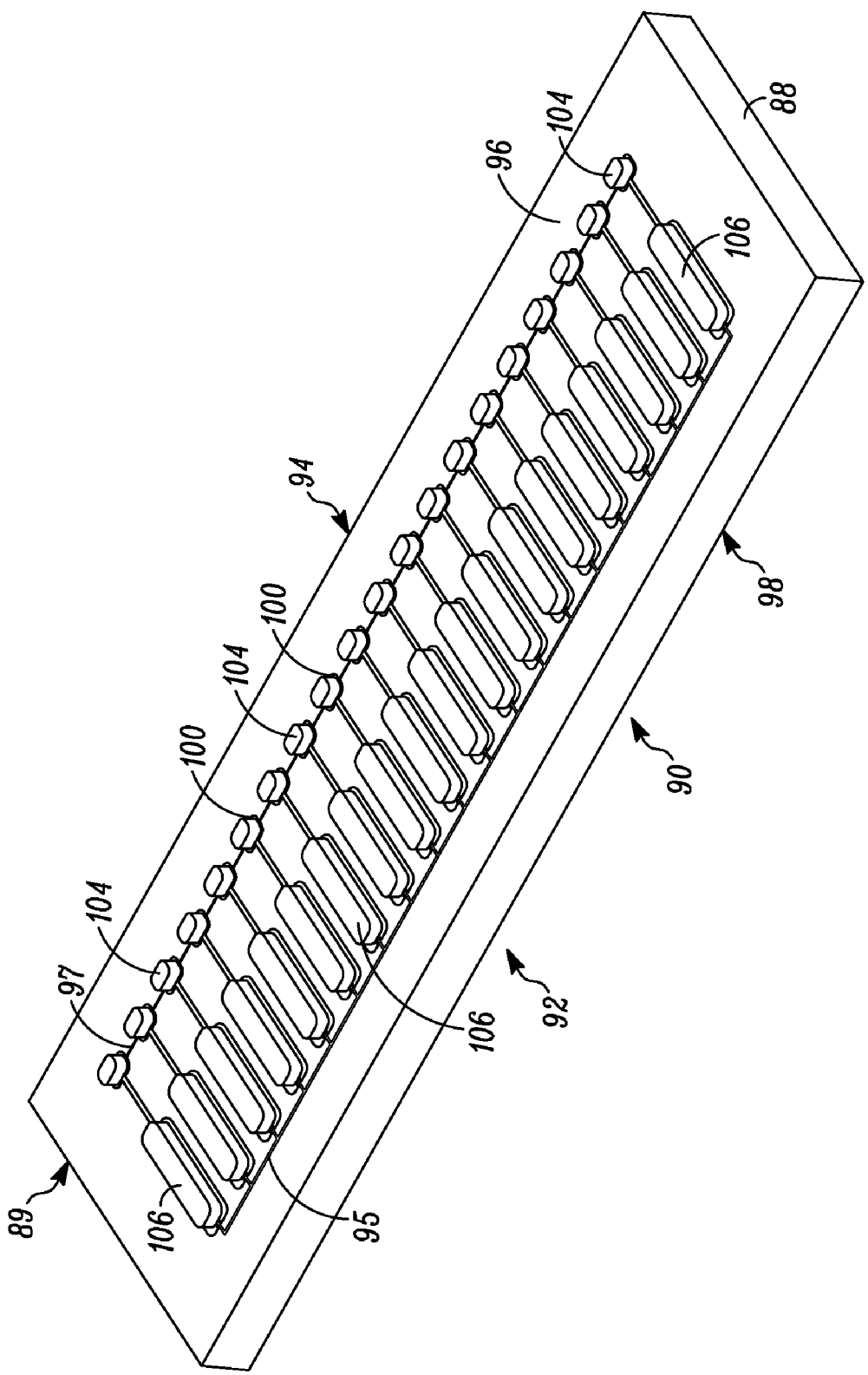
FIG. 11 is an isometric view of the semiconductor die of FIG. 7 at a later stage of manufacturing.

Flange 12 is sized to assist in maintaining the temperature of semiconductor die 90 at or below a predetermined temperature during operation of semiconductor die 90 (FIG. 11). For example, in some radio frequency (RF) applications, it may desirable to keep the junction temperature of a RF power transistor at a temperature of less than about 200 degrees Celsius (° C.) during operation. By way of example, flange 12 has a length ranging from about 20 millimeters (mm) to about 40 mm, a width ranging from about 5 mm to about 15 mm, and a thickness ranging from about 1 mm to about 3 mm. The dimensions of flange 12 are not limitations of the present invention.

A slot, groove, or cavity 26 having a floor 27, sidewalls 28 and 29, and ends 30 and 31 is formed in flange 12. Slot 26 may be formed by milling, etching, grinding, or stamping. Slot 26 may have a rectangular shape, a quadrilateral shape, or other polygonal shape. In addition, slot 26 may have an oval shape. The shape of slot 26 is not a limitation of the present invention; however, in some embodiments, it is desirable that slot 26 have at least one sidewall that is substantially straight.

Notches 32 and 33 extend inward from sides 18 and 20, respectively, into flange 12 and are typically used for securing semiconductor component 10 to another structure such as, for example, a printed circuit board (PCB) or heat sink, using, for example, a fastener means such as a screw or bolt. Notches 32 and 33 are optional, as other means may be used to secure flange 12 to other structures.

Figure 2:
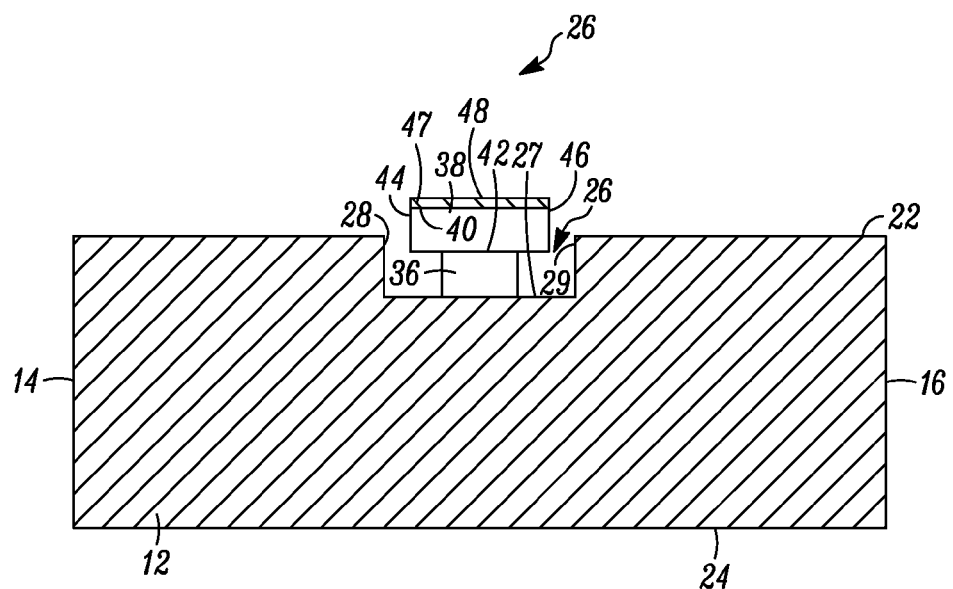
FIG. 2 is a cross-sectional side view of the flange taken along section line 2-2 of FIG. 1.

Briefly referring to FIG. 2, a cross-sectional side view of flange 12 taken along section line 2-2 of FIG. 1 is shown. A solder preform 36 is placed in slot 26. Suitable materials for solder preform 36 include a gold-germanium solder, a tin-silver-copper solder, a tin-silver solder, or a tin-copper solder. Alternatively, a high temperature adhesive such as, for example, an epoxy, may be placed in slot 26 rather than a solder preform. The solder preform materials and the adhesive materials are not limitations of the present invention. An interposer 38 is placed on solder preform 36. Interposer 38 may also be referred to as a connector and is further described hereinbelow.

Referring to FIGS. 1 and 2, in some embodiments, interposer 38 comprises a rectangular shaped dielectric material having opposing surfaces 40 and 42 that are substantially parallel to each other, and opposing sides 44 and 46 that are substantially parallel to each other. Surface 40 may also be referred to as a bonding pad surface. Suitable materials for interposer 38 include ceramic, polyimide, FR4, printed circuit board material, semiconductor material such as, for example, silicon or gallium arsenide, or organic polymers. The dimensions of interposer 38 are selected so that it fits within slot 26. In some embodiments, slot 26 has a length ranging from about 5 millimeters (mm) to about 12 mm, a width ranging from about 1 mm to about 2 mm, and a depth or thickness ranging from about 0.4 mm to about 0.6 mm. In these embodiments, interposer 38 has a length ranging from about 4 millimeters (mm) to about 10 mm, a width ranging from about 0.8 mm to about 1.8 mm, and a thickness ranging from about 0.35 mm to about 0.55 mm.

Interposer 38 may include gate interconnect pads 47 that are formed on bond pad surface 40. By way of example, gate interconnect pads 47 are rectangular metal strips that are substantially parallel to each other. Gate interconnect pads 47 have bonding surfaces 48. Extension pads 49 may extend from interconnect pads 47. In some embodiments, the depth of slot 26 and the amount of solder in solder preform 36 are selected so that the resulting melted solder preform 36A (FIG. 4) does not overflow out of slot 26 and onto portions of top surface 22 of flange 12.

Techniques for forming interconnect pads such as gate interconnect pads 47 and extension pads 49 on a dielectric surface 40 may include, for example, forming a layer of electrically conductive material such as, for example, copper or aluminum over bond pad surface 40 of interposer 38, and subsequently removing portions of this layer of electrically conductive material by, for example, an etching process to form pads 47 and 49. Although the material disposed on surface 40 has been described as being metal strips, it should be noted that this is not a limitation of the present invention. Rather than metal strips, in alternate embodiments, the metal strips 47 on surface 40 may be a single continuous piece of electrically conductive material such as, for example, a layer of material comprising copper that overlies a substantial portion of bond pad surface 40. However, in some embodiments, such as embodiments wherein a discrete transistor semiconductor die such as, die 90 (FIG. 11), is coupled to interposer 38 and flange 12, an advantage of using metal strips is that it reduces the amount of gate metal on interposer 38 that can capacitively couple to the drain of die 90, thereby lowering the gate-to-drain capacitance ("Cgd"). Alternatively, a multi-metal layer may be formed on surface 40, where a shield layer is formed over the metal layer comprising the metal strips. The shield layer may be an electrically conductive material such as, for example, copper, and may be electrically isolated from the metal strips but electrically coupled to the source of die 90. This may force any parasitic capacitance to be gate-to-source capacitance rather than gate-to-drain capacitance, which lowers the "Miller" capacitance associated with the transistors.

Figure 3:
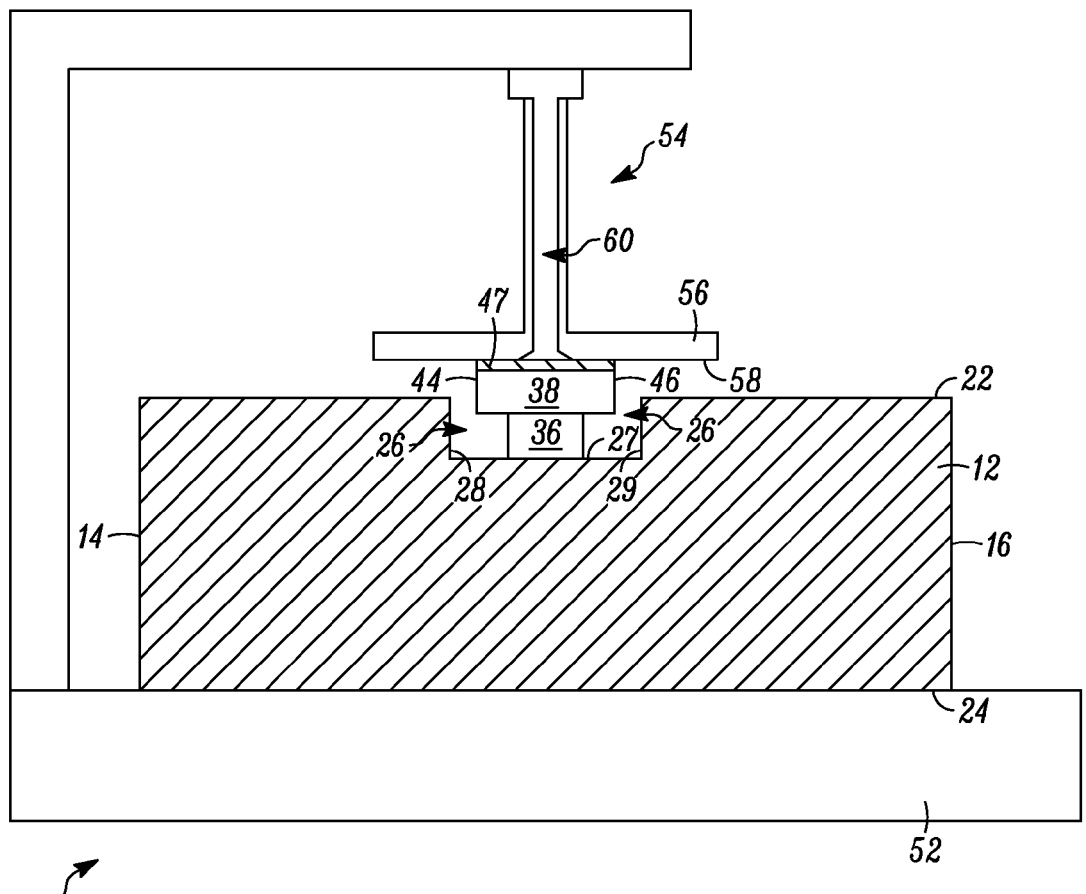
FIG. 3 is a partial cross-sectional view of a mounting fixture in a first position in accordance with an embodiment of the present invention.
Figure 4:
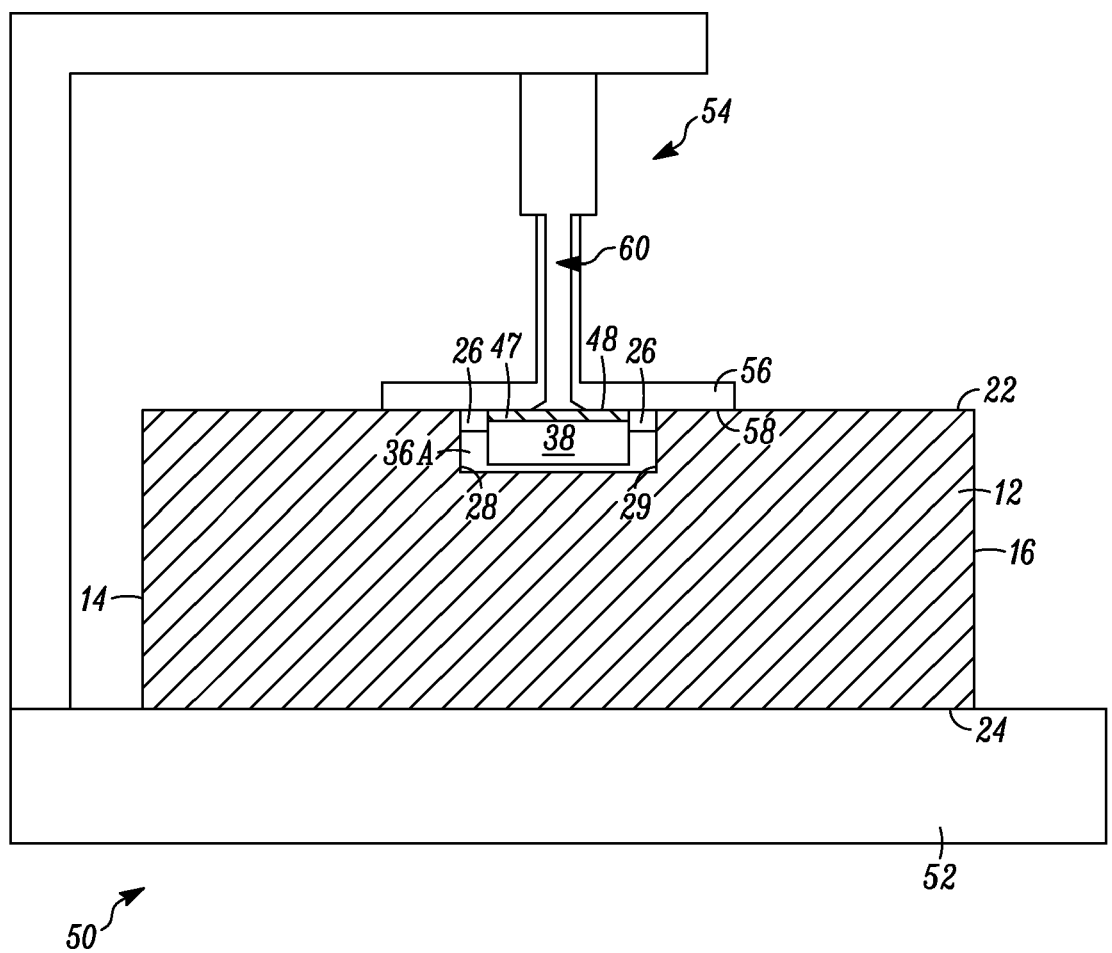
FIG. 4 is a partial cross-sectional view of the mounting fixture of FIG. 3 in a second position.

FIGS. 3 and 4 illustrate the bonding of interposer 38 to flange 12 using solder preform 36 in accordance with an embodiment of the present invention. What is shown in FIG. 3 is a mounting fixture 50 having a base or stage 52 and an interposer pick-up tool 54. Interposer pick-up tool 54 includes a pick-up head 56 having a pick-up surface 58 and a channel 60. Pick-up surface 58 is larger than interposer 38 and slot 26, and extends over edges 44 and 46 of interposer 38 and sidewalls 28 and 29 of slot 26. It should be noted that for the sake of clarity flange 12, interposer 38, and pick-up tool 54 are shown in cross-section, and the details of other portions of mounting fixture 50 are not shown.

Flange 12 is mounted on stage 52 and solder preform 36 is placed in slot 26. Pick-up surface 58 of interposer pick-up tool 54 is placed contacting gate interconnect pads 47. Then interposer 38 is secured to pick-up surface 58 by reducing the ambient pressure within channel 60. The pressure may be reduced by connecting channel 60 to a vacuum. Pick-up head 56 places interposer 38 on solder perform 36.

Referring now to FIG. 4, mounting fixture 50 includes a heater (not shown) that melts solder preform 36. In the melted or liquid state, solder preform 36 is identified by reference number 36A. Pick-up head 56 presses interposer 38 into slot 26 and into melted solder preform 36A. Surface 58 of interposer pick-up tool 54 is flush with surfaces 48 of gate interconnect pads 47 and surface 22 of flange 12. Thus, surfaces 48 of gate interconnect pads 47 and surface 22 of flange 12 are therefore planar, or substantially planar, with each other. In some embodiments, surfaces 48 and 22 are within approximately 5 microns (μm) of each other in terms of height or vertical distance.

Figure 5:
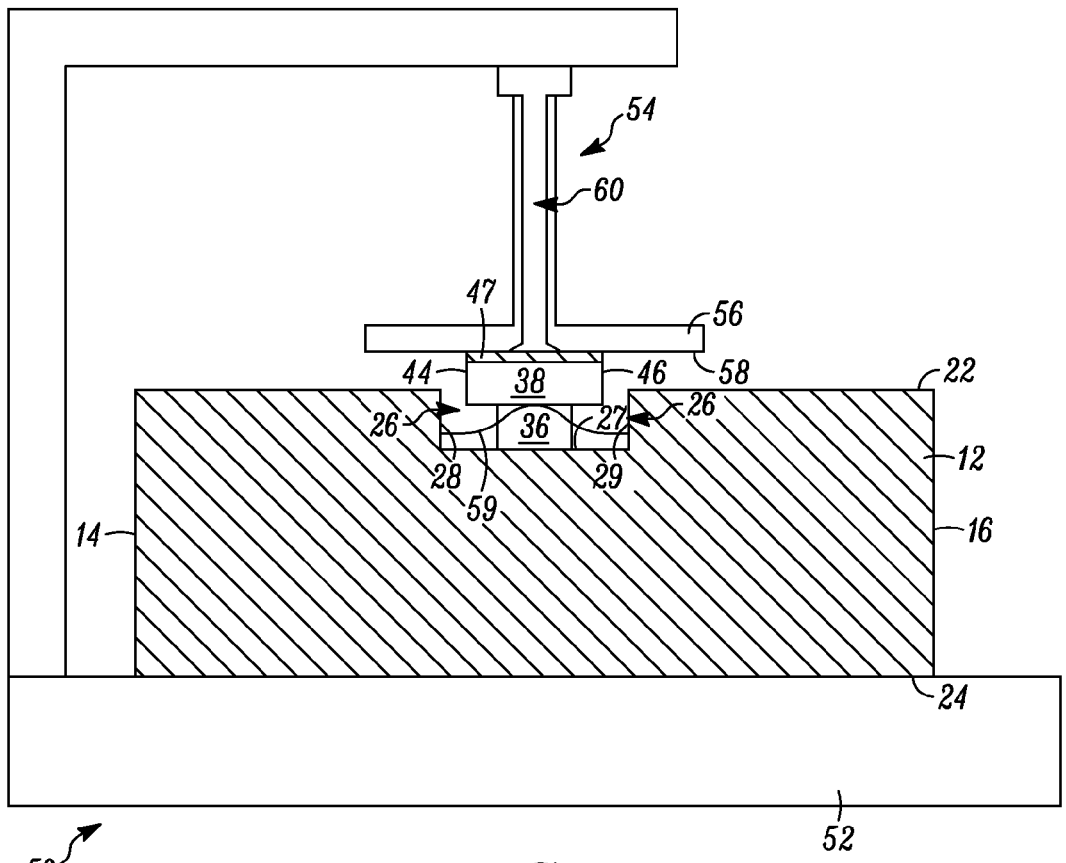
FIG. 5 is a partial cross-sectional view of a portion of the mounting fixture in a first position in accordance with another embodiment of the present invention.
Figure 6:
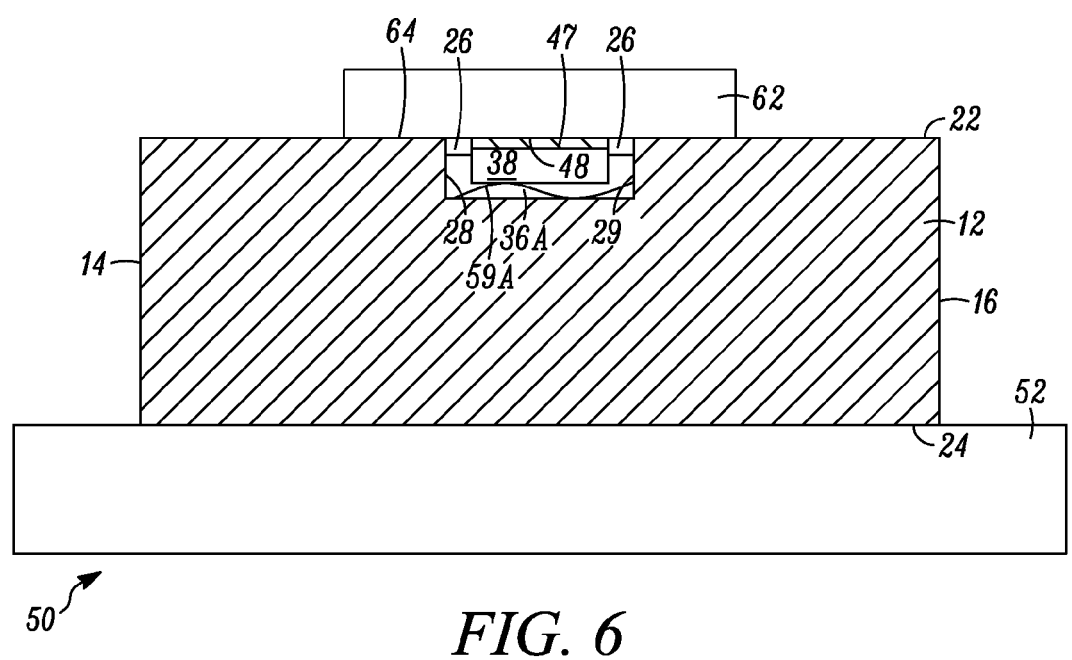
FIG. 6 is a partial cross-sectional view of the mounting fixture of FIG. 5 in a second position.

FIGS. 5 and 6 illustrate the bonding of interposer 38 to flange 12 using solder preform 36 in accordance with another embodiment of the present invention. Like the embodiment discussed with reference to FIGS. 3 and 4, flange 12 is mounted on stage 52 and solder preform 36 is placed in slot 26. In addition, a counter-force assertion member 59 is placed in slot 26. By way of example, counter-force assertion member 59 is a spring. Pick-up surface 58 of interposer pick-up tool 54 is placed contacting gate interconnect pads 47 that are disposed on interposer 38. Then interposer 38 is secured to pick-up surface 58 by reducing the ambient pressure within channel 60. The pressure may be reduced by connecting channel 60 to a vacuum. Pick-up head 56 places interposer 38 on solder perform 36.

Referring now to FIG. 6, in which pick-up head 56 is not shown for the sake of clarity, a weight 62 is placed on surface 42 of interposer 38. In some embodiments, weight 62 may be a piece of graphite. It should be understood that the material of weight 62 is not a limitation of the present invention as other kinds of materials may be used for weight 62. A gap (not shown) is present between a bottom surface 64 of weight 62 and surface 22 of flange 12 prior to the melting of solder preform 36 (FIG. 5). Mounting fixture 50 comprises a heater (not shown) to melt solder preform 36 and close the gap. As discussed hereinbefore, when solder preform 36 is in its liquid or melted state it is identified by reference number 36A. Further, counter-force assertion member 59 flexes in response to the use of weight 62 and is identified by reference number 59A in FIG. 6. Weight 62 presses interposer 38 into slot 26 and into melted solder preform 36A and counter-force assertion member 59 exerts a force in the opposite direction of the force that weight 62 exerts on interposer 38 so that surface 64 of weight 62 is flush with surfaces 48 of gate interconnect pads 47 and surface 22 of flange 12. Thus, surfaces 48 of gate interconnect pads 47 and surface 22 of flange 12 are planar, or substantially planar, with each other. After the melted solder cures or hardens and weight 62 is removed, surface 22 of flange 12 remains substantially planar with surfaces 48 of gate interconnect pads 47. In some embodiments, surfaces 48 and 22 are within approximately 5 microns (μm) of each other in terms of height or vertical distance after the melted solder cures or hardens and weight 62 is removed.

Figure 7:
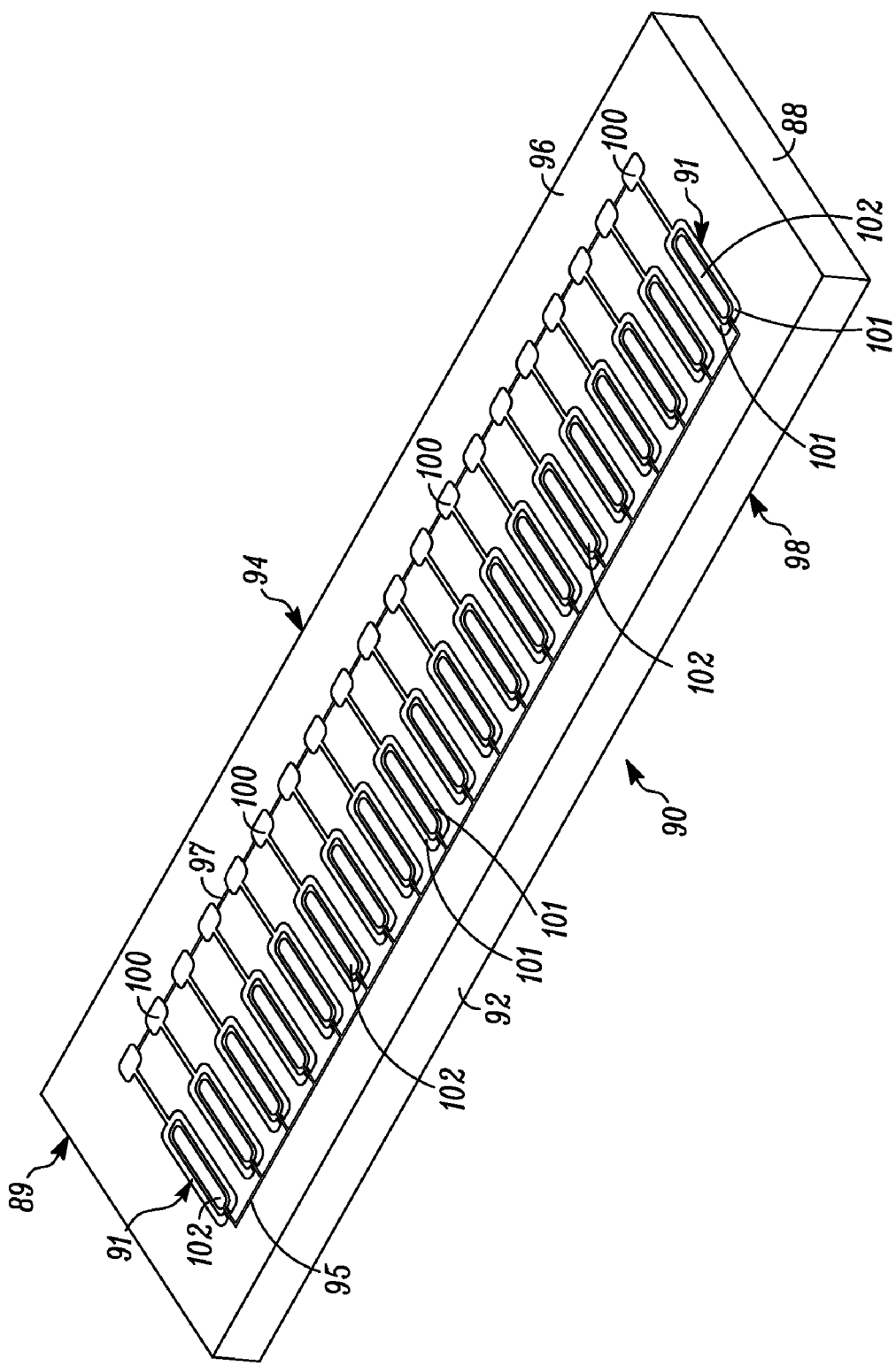
FIG. 7 is an isometric view of a semiconductor die in accordance with an embodiment of the present invention.

FIG. 7 is an isometric view of a semiconductor chip or die 90 having sides or edges 92 and 94 that are substantially parallel to each other, edges 88 and 89 that are substantially parallel to each other, and a top surface 96 and a bottom surface 98 that are substantially parallel to each other. Semiconductor die 90 may comprise a semiconductor material such as, for example, silicon (Si) or gallium arsenide (GaAs).

Although the scope of the present invention is not limited in this respect, in some embodiments, the length of semiconductor die 90, that is, the distance between edges 88 and 89 is about 5,080 micrometers (μm). The width of semiconductor die 90, that is, the distance between edges 92 and 94 is about 1,270 μm. The thickness of semiconductor die 90, that is, the distance between surfaces 96 and 98 ranges from about 125 μm to about 625 μm.

Semiconductor die 90 includes an electrical interconnect layer 95 and an electrical interconnect layer 97. Electrical interconnect layer 95 includes electrical pads 102 and may be a metal layer comprising, for example, aluminum, copper, or gold. Similarly, electrical interconnect layer 97 includes electrical pads 100 and may be a metal layer comprising, for example, aluminum, copper, or gold.

In some embodiments, semiconductor die 90 is comprised of twenty transistor cell regions 91, wherein each transistor cell region 91 comprises a plurality of active devices such as, for example, transistors, although the methods and apparatuses described herein are not limited in this regard.

Figure 18:
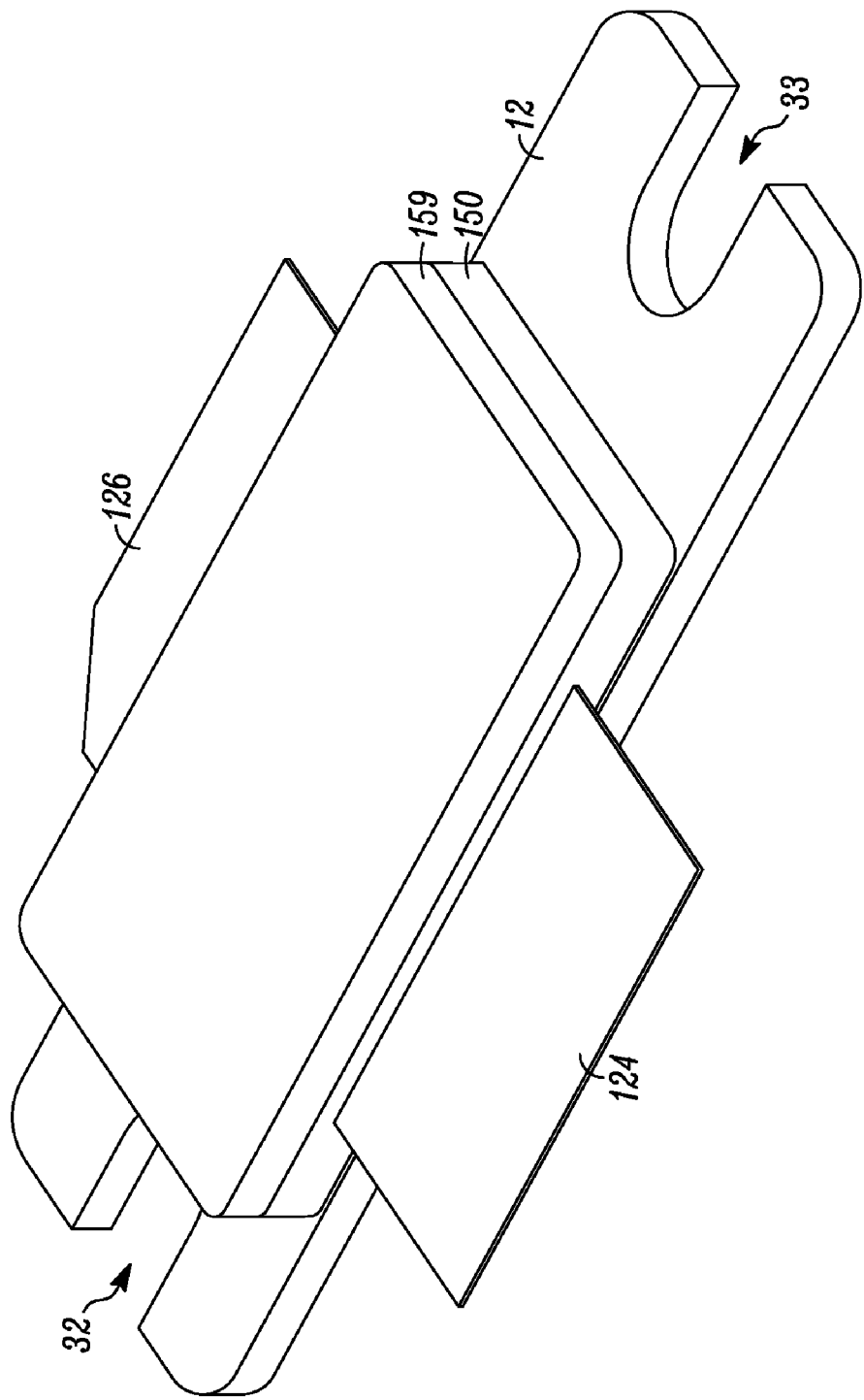
FIG. 18 is an isometric view of a semiconductor component singulated from the leadframe of FIG. 17.

In some embodiments, semiconductor die 90 is a discrete transistor such as a discrete power transistor, wherein each transistor cell region 91 comprises, for example, a plurality of vertical metal oxide semiconductor field effect transistors (MOSFETs) or vertical bipolar transistors (not shown). The transistors of the multiple transistor cell regions 91 are coupled to each other to function as a single transistor. In these embodiments, semiconductor component 10 (FIG. 18) may be referred to as discrete semiconductor device, having an input lead 124 (FIG. 18), an output lead 126 (FIG. 18), and a common lead 12 (FIG. 18). Leads 124, 126, and 12 may also be referred to as terminals, interconnects, or interconnections.

A power transistor is a device that may be capable of handling a relatively large amount of electrical current such as, for example, at least about 100 milliamps (mA) of electrical current in some embodiments. In addition a power transistor is a device that can be coupled to relatively large operating voltage potentials of, for example, at least about 20 volts to over 100 volts, and may be used in power amplifiers to generate at least about one watt of output power.

Although the scope of the present invention is not limited in this respect, in some embodiments, semiconductor die 90 is a radio frequency (RF) power transistor constructed to operate at frequencies of greater than about one megahertz (MHz) and to have a power output greater than about one watt. RF power transistors can be used in RF power amplifiers that may be used in wireless communications applications such as, for example, cellular base stations, high frequency (HF), very high frequency (VHF) and ultra high frequency (UHF) broadcast transmitters, microwave radar systems, and avionics systems. Some RF power amplifiers (RFPAs) provide from about five watts (W) to more than about 200 W of output power. In some embodiments, semiconductor die 90 is a RF power transistor adapted to operate at frequencies of greater than about 500 megahertz (MHz) and has an output power greater than about five watts.

In the embodiments wherein semiconductor die 90 includes vertical MOSFETs (not shown), these vertical MOSFETs each have a source region (not shown), a drain region (not shown), and a gate (not shown). Electrical pads 102 may be coupled to the source regions of the vertical MOSFETs and may be referred to as source pads, contacts, terminals, interconnects, or interconnections. Further, source pads 102 are coupled together to function as a single source interconnect. Electrical pads 100 may be coupled to the gates of the vertical MOSFETs and may be referred to as gates pads, contacts, terminals, interconnects, or interconnections. Further, gate pads 100 are coupled together to function as a single gate interconnect. In addition, semiconductor die 90 includes a drain interconnect or terminal 99 (FIG. 12) over surface 98 of die 90, wherein the drain interconnect 99 is coupled to the drain regions of the vertical MOSFETs.

The vertical MOSFET is vertical in that the source pads 102 and drain terminal 99 are at or adjacent opposite surfaces of semiconductor die 90. The gate pads 100 are formed at the same surface 96 of die 90 as the source pads 102. During operation, the electrical current flow from the source pads 102 to the drain terminal 99 in the discrete vertical power transistor may be substantially perpendicular to the surfaces 96 and 98 of semiconductor die 90. In other words, current flows essentially vertically through the vertical MOSFET from the source pads 102 located adjacent one surface 96 of semiconductor die 90 to a drain interconnect 99 located adjacent to the opposite surface 98 of semiconductor die 90. An example of a vertical power transistor is described in U.S. patent application Ser. No. 10/557,135, entitled "POWER SEMICONDUCTOR DEVICE AND METHOD THEREFOR," filed Nov. 17, 2005, which claims priority to Patent Cooperation Treaty (PCT) International Application Number PCT/US2005/000205 entitled "POWER SEMICONDUCTOR DEVICE AND METHOD THEREFOR," having an International Filing Date of Jan. 6, 2005 and an International Publication Date of Jul. 28, 2005, the contents of both of these patent applications are incorporated herein by reference in their entirety.

In other embodiments, the transistors in semiconductor die 90 may be vertical bipolar transistors such as insulated gate bipolar transistors (IGBTs). In such embodiments, one side of semiconductor die 90 may have an emitter region and a base region. The other side of the die may have a collector region.

Although semiconductor die 90 is described as including vertical transistors in some embodiments, this is not a limitation of the present invention. In alternate embodiments, semiconductor die 90 may include lateral transistor structures such as, for example, a laterally diffused metal-oxide-semiconductor (LDMOS) transistor structure. In an LDMOS power transistor, the gate, source region, and the drain region are located adjacent the same surface of a semiconductor die and electrical current flows laterally through the transistor between the source and drain regions of the LDMOS power transistor.

Generally, transistors such as bipolar transistors and field effect transistors (FETs) discussed herein are understood to provide a conduction path between first and second conduction electrodes when a control signal is applied to a control electrode. For example, in a FET a channel region formed between the drain and source provides the conduction path which is controlled in accordance with the magnitude of the control signal. The gate electrode of a FET may be referred to as a control electrode and the drain and source electrodes of a FET may be referred to as current carrying electrodes or conduction electrodes. Likewise, the base of a bipolar transistor may be referred to as the control electrode and the collector and emitter electrodes of the bipolar transistor may be referred to as conduction electrodes or current carrying electrodes. In addition, the drain and source electrodes of a FET may be referred to as power electrodes and the collector and emitter electrodes of a bipolar transistor may also be referred to as power electrodes.

Figure 8:
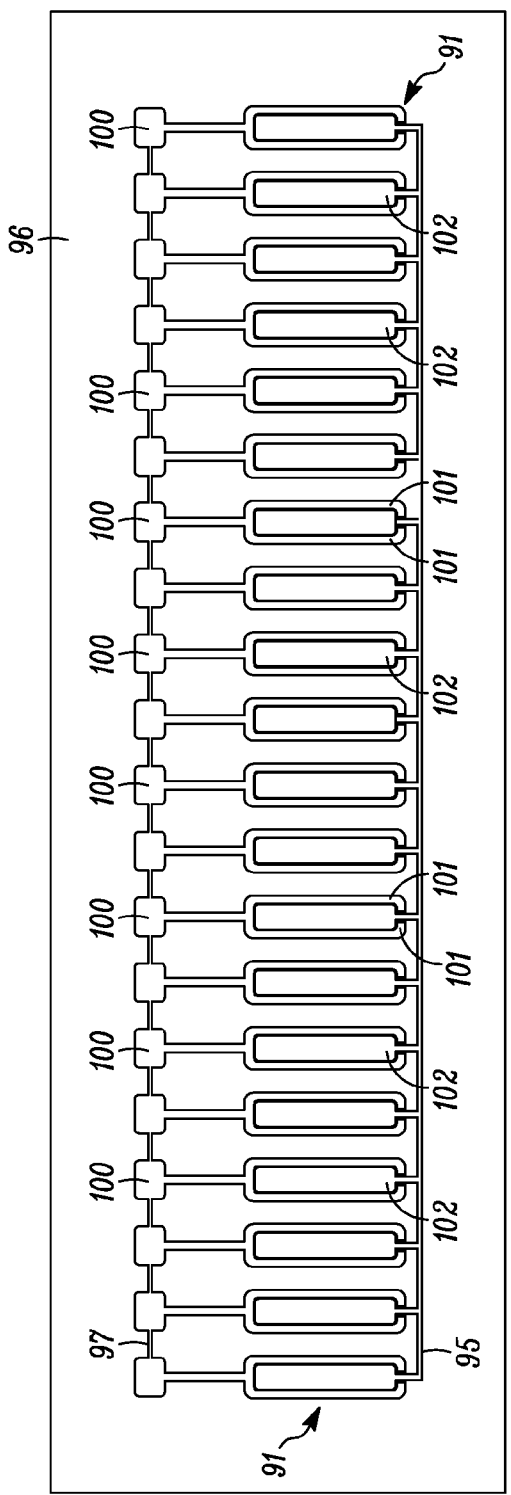
FIG. 8 is a top view of the semiconductor die of FIG. 7.

FIG. 8 is a top view of semiconductor die 90. Electrical interconnect layer 97 includes extensions 101 that are spaced apart from source bond pads 102. Extensions 101 surround three sides of source bond pads 102 and are laterally adjacent a fourth side of source bond pads 102.

Figure 9:
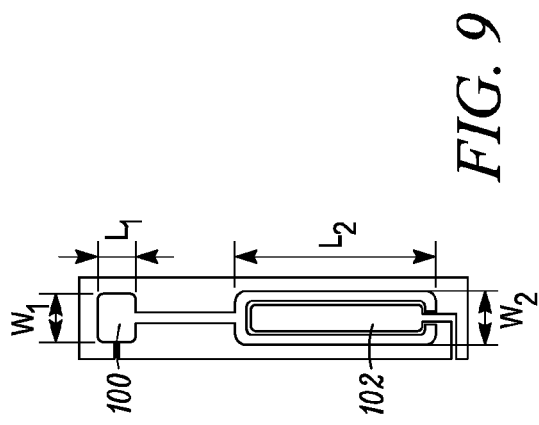
FIG. 9 is a top view of a single gate pad and source pad of the semiconductor die of FIG. 7.

FIG. 9 is a top view of a single gate pad 100 and source pad 102 of semiconductor die 90. FIG. 9 shows a width, labeled $W_2$, and a length, labeled $L_2$ and shows electrical pad 100 having a width, labeled $W_1$, and a length, labeled $L_1$. In some embodiments, the width $W_1$ is approximately 94 um, the length $L_1$ is approximately 83 um, the width $W_2$ is approximately 120 um, and the length $L_2$ is approximately 493 um.

Figure 10:
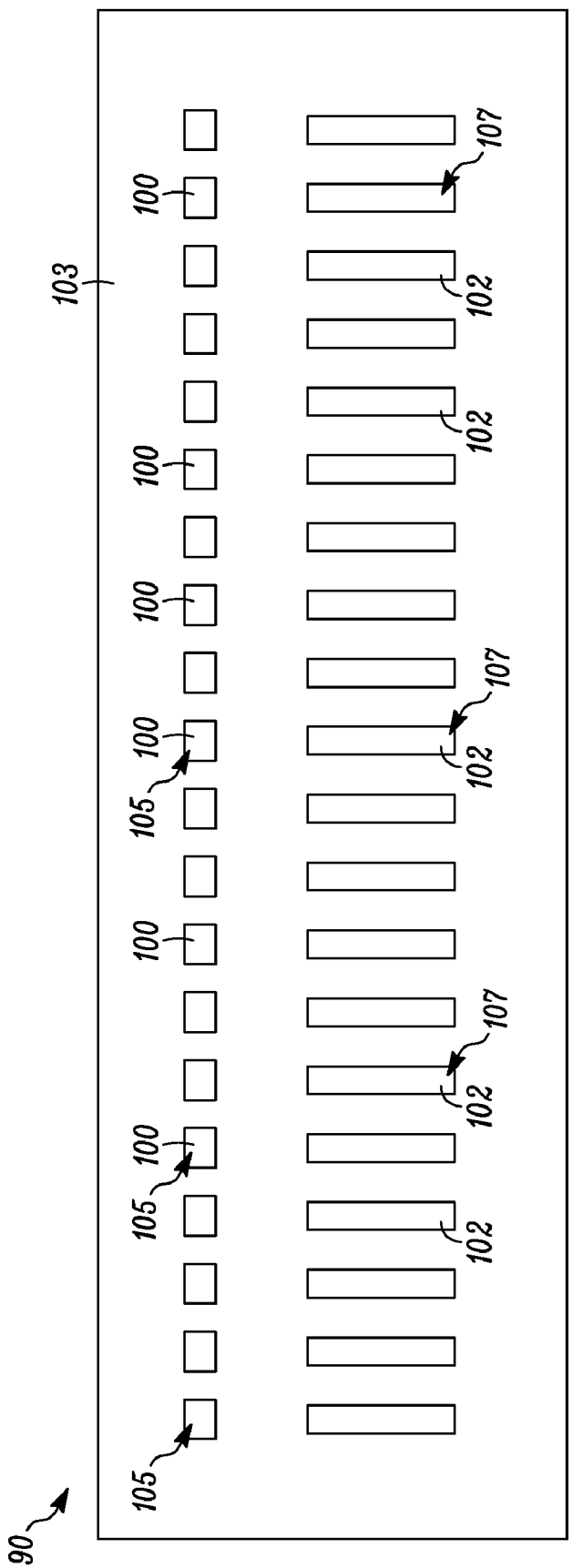
FIG. 10 is a top view of the semiconductor die of FIG. 7 at a later stage of manufacturing.

FIG. 10 is a top view of semiconductor die 90 at a later stage of manufacturing. A passivation layer 103 is formed over die 90. Passivation layer 103 is patterned to form openings 105 and 107 to expose portions of bond pads 100 and 102 for subsequent assembly processing to connect wafer bumps 104 (FIG. 11) and 106 (FIG. 11) to bond pads 100 and 102, respectively. In some embodiments, passivation layer 103 may be an oxide layer.

Openings 105 that expose gate bond pads 100 are within the lateral boundaries of gate bond pads 100 and openings 107 that expose source bond pads 102 are within the lateral boundaries of source bond pads 102.

FIG. 11 is an isometric view of semiconductor die 90 at a later stage of manufacturing. For purposes of clarity, passivation layer 103 is not shown in FIG. 11 to illustrate the formation of wafer bumps 104 and 106. Gate bumps 104 are formed contacting gate bond pads 100 and source bumps 106 are formed contacting source bond pads 102.

Bumps 104 and 106 may be referred to as wafer bumps that may be formed on die 90 while die 90 is still part of a wafer. Bumps 104 and 106 may comprise gold and may be formed using an electroplating process. Although not shown, an electroplating process may be used to form a cap layer over gold bumps 104 and 106. The cap layer may have a thickness of about three microns and may comprise tin, and in these embodiments bumps 104 and 106 may be referred to as gold-tin (AuSn) wafer bumps or gold bumps having a tin cap. Eutectic bonding may be used to couple or attach flange 12 to wafer bumps 104 and 106.

In some embodiments, wafer bumps 106 may each have a length of about 500 µm and a width of about 120 µm and wafer bumps 104 may each have a length of about 80 µm and a width of about 80 µm. In addition, bumps may have a height or thickness ranging from about 25 µm (about 1 mil) to about 100 µm (about 4 mils). As may be appreciated, a mil is one-thousandth of an inch. Further, bumps 106 may be spaced apart from each other by about 60 microns, although the methods and apparatuses described herein are not limited in this regard.

Bumps 104 and 106 may be useful for coupling elements of the active area of die 90 to other electrical elements or components within or external to a package employed to encapsulate and protect die 90 and attendant circuitry from environmental insults, such as chemical attack, physical abrasion and the like.

As discussed in more detail below, the height of wafer bumps 104 and 106 may be set to provide a predetermined amount of space or air between die 90 and flange 12. In embodiments wherein die 90 comprises a plurality of transistors coupled together to function as a discrete power transistor, spacing die 90 further from flange 12 can increase the standoff voltage of die 90. As a general guideline, for every 25 µm (1 mil) of air or space, this may result in about 50 volts of standoff voltage. Thus, forming bumps 104 and 106 to have a height of at least about 50 µm may result in die 90 being capable of having a standoff voltage of at least about 100 volts. As is generally understood, the standoff voltage is typically designed to be greater than the desired breakdown voltage of the device. For example, if the desired breakdown voltage of die 90 is about 100 volts, then the standoff voltage of die 90 should be at least about 100 volts or greater.

Figure 12:
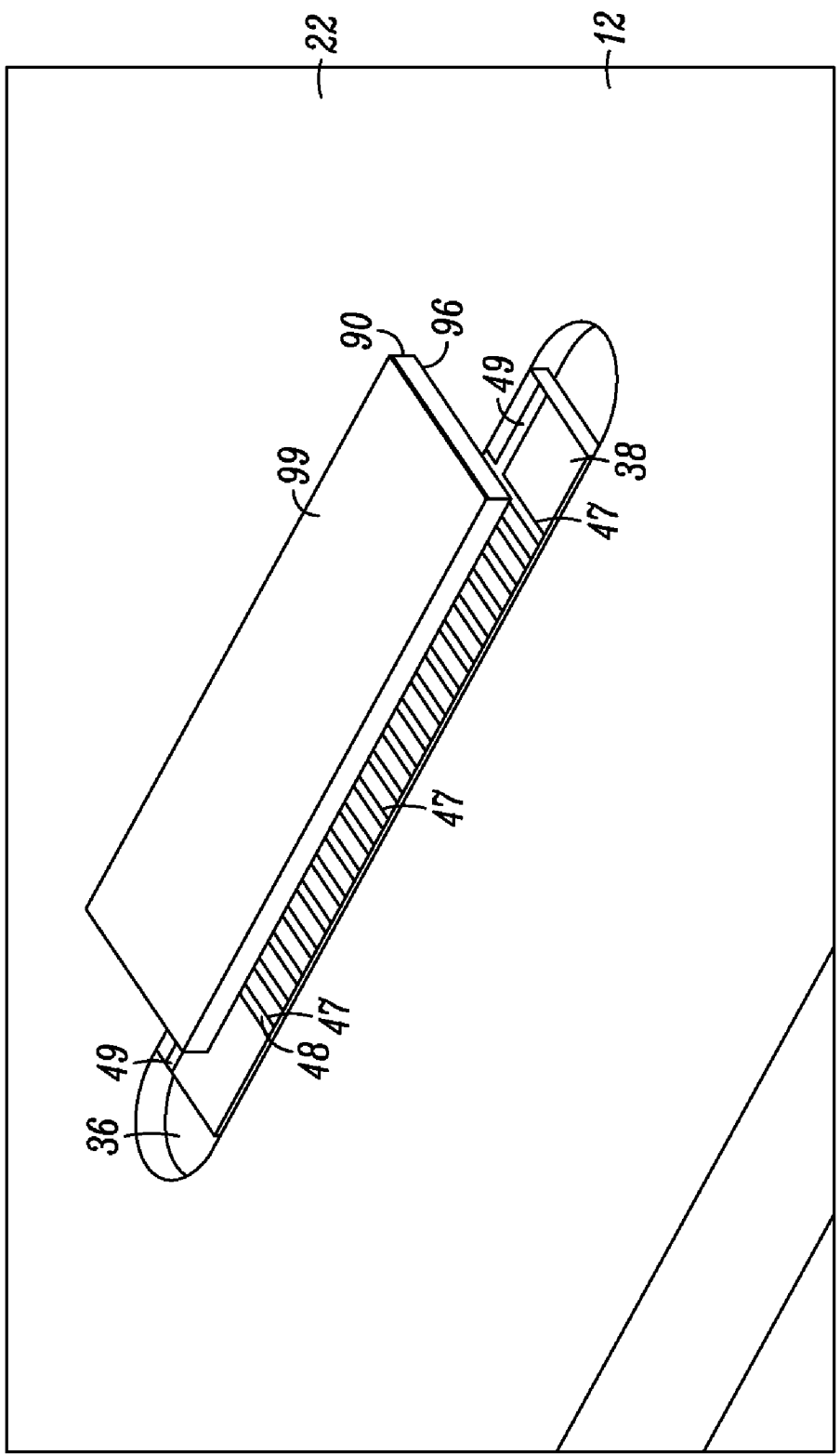
FIG. 12 is an isometric view of the semiconductor die of FIG. 11 bonded to an interposer and to the flange of FIG. 1 in accordance with an embodiment of the present invention.

Accordingly, wafer bumps 106 may be relatively high current-carrying contacts for a power electrode of a gain element such as a transistor, for example, wafer bumps 106 may be current carrying contacts for a source of a discrete power field effect transistor (FET). In addition, bumps 106 may also function as a thermal path to transfer heat from the die 90 to a heat sink or heat spreader such as, for example, flange 12 (FIG. 12). As may be appreciated, contact between all of bumps 106 and flange 12 may enhance the thermal conductivity to remove heat generated by die 90. If contact to only some, but not all, of bumps 106 is made by flange 12, then optimal removal of heat from die 90 may not be achieved.

Wafer bumps 104 and 106 may be referred to as interconnects, interconnections, or semiconductor die attach elements. Advantages of forming wafer bumps 104 and 106 having a thickness of at least about 25 microns or greater include increasing the standoff voltage of die 90 to support relatively higher drain-to-source breakdown voltages (BVds) and reducing the drain-to-source capacitance ("Cds"). Increasing the standoff and breakdown voltages of die 90 results in devices that may be operated with relatively higher voltages and reducing the parasitic capacitances of component 10 (FIG. 18) may increase the operating frequency of component 10. Further, forming relatively large wafer bumps such as described herein, provide bumps that have a relatively high electrical current conduction and thermal conduction capability. In addition, if bumps 104 and 106 comprise a relatively malleable material such as, for example, gold or a gold alloy, this may aid in the manufacturing and operation of semiconductor component 10 (FIG. 18), as bumps 104 and 106 may deform or absorb mechanical stress that may be caused by a CTE mismatch of the material of die 90 and the material of flange 12.

Although not shown in FIG. 11, drain interconnect 99 (FIG. 12) of die 90 may be a layer of an electrically conductive material such as, for example, gold or copper, that may be formed overlying surface 98 of die 90 prior to coupling die 90 to interposer 38 and flange 12. Source terminals 106, gate terminals 104, and drain terminal 99 are electrically isolated from each other.

FIG. 12 is an isometric view of semiconductor die 90 bonded to interposer 38 and to flange 12. More particularly, semiconductor die 90 is flipped so that gate bumps 104 (FIG. 11) contact corresponding gate interconnect pads 47 of interposer 38 and so that source bumps 106 (FIG. 11) contact surface 22 of flange 12.

Gate bumps 104 (FIG. 11) and source bumps 106 (FIG. 11) may be respectively attached to gate interconnect pads 47 of interposer 38 and to surface 22 of flange 12 using eutectic bonding. For example, a die bonder (not shown) may be used to pick up die 90 and place die 90 on interposer 38 and flange 12 so that gate bumps 104 (FIG. 11) contact corresponding gate interconnect pads 47 of interposer 38 and so that source bumps 106 (FIG. 11) contact surface 22 of flange 12. Then, heat and pressure, and optionally ultrasonic energy, may be applied to form the eutectic bond at the points where gate bumps 104 (FIG. 11) contact corresponding gate interconnect pads 47 of interposer 38 and at the points where source bumps 106 (FIG. 11) contact surface 22 of flange 12.

In embodiments wherein bumps 104 and 106 comprise a gold bump having a tin cap layer (not shown), the heat and pressure used to bond die 90 to flange 12 and interposer 38 may cause the gold and tin to diffuse together to form an alloy composition of, for example, 80% gold (Au) and 20% tin (Sn) at an upper portion of bumps 104 and 106 that may be used to bond bumps 104 and 106 to interposer 38 and flange 12, respectively. As an example, a temperature of about 280° C. to about 320° C. is applied to flange 12 and die 90 for a time period ranging from about 20 seconds to about 40 seconds.

Although the scope of the present invention is not limited in this respect, in some embodiments, flange 12 may comprise copper and may be gold-plated with about 30 microinches (about 0.762 microns) of gold. During the eutectic bonding process, some of the gold from the gold plating of flange 12 may be consumed during the bonding process to form the eutectic bond.

Although flange 12 is described as being a copper flange that is gold-plated, the scope the present invention is not limited in this regard. In other embodiments, flange 12 may be a tin-plated copper flange. A barrier material such as, for example, nickel, may be formed on flange 12 prior to plating flange 12 with tin.

Figure 13:
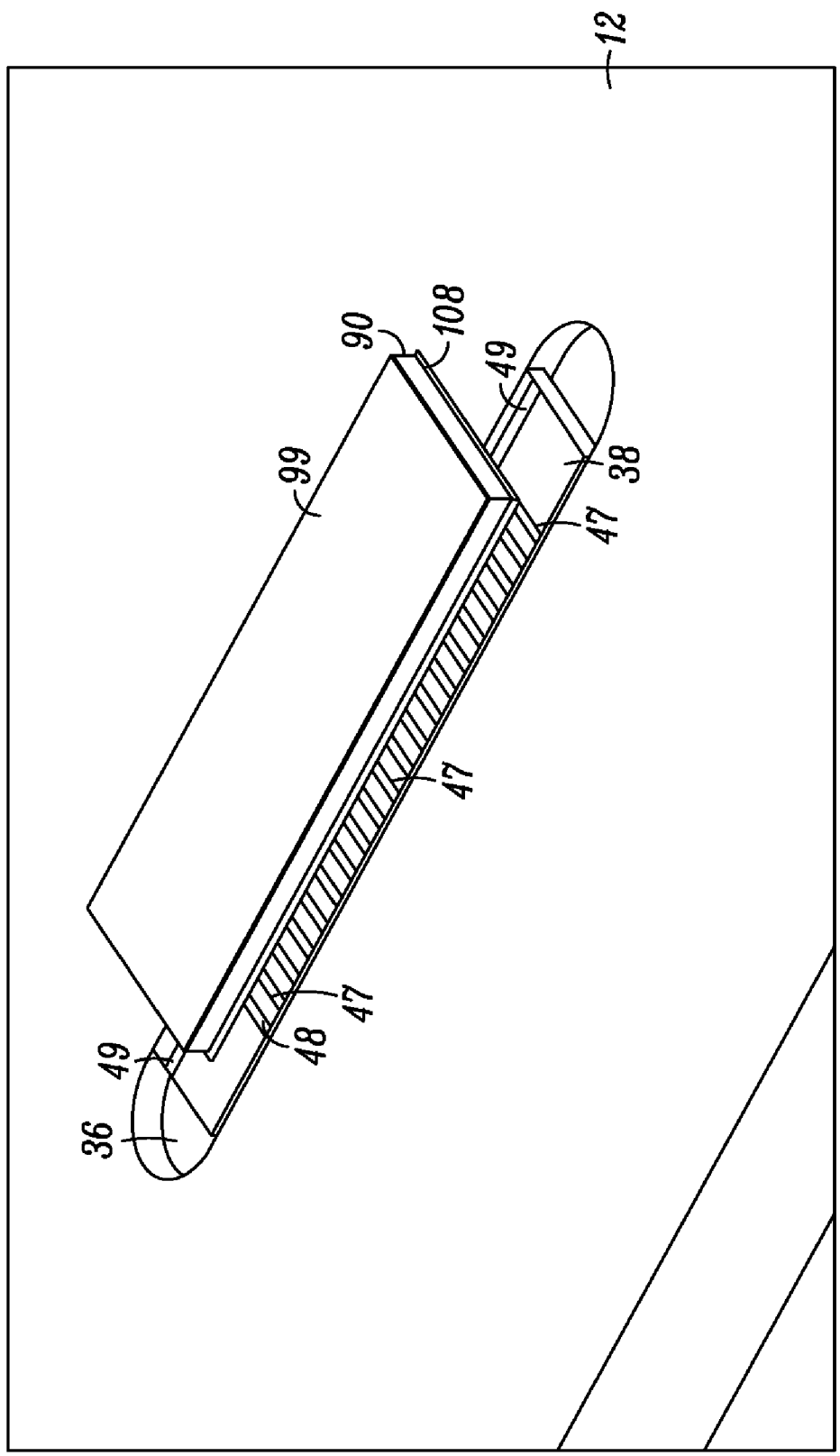
FIG. 13 is an isometric view of the structure of FIG. 12 at a later stage of manufacturing.

Referring now to FIG. 13, an underfill material 108 may be dispensed between semiconductor die 90 and interposer 38 and between semiconductor die 90 and flange 12. After dispensing underfill material 108, it is cured. By way of example, underfill material 108 is polyimide. As is discussed below, an advantage of including underfill material 108 in the spaces between flange 12 and die 90 is that it increases the breakdown voltage of the transistors formed in semiconductor die 90. Underfill material 108 may also be used for mechanical integrity to distribute mechanical stresses more uniformity in wafer bumps 104 and 106. As may be appreciated, the type of underfill dielectric material selected may alter drain-to-gate and drain-to-source capacitance depending on the dielectric constant of the underfill dielectric material.

Figure 14:
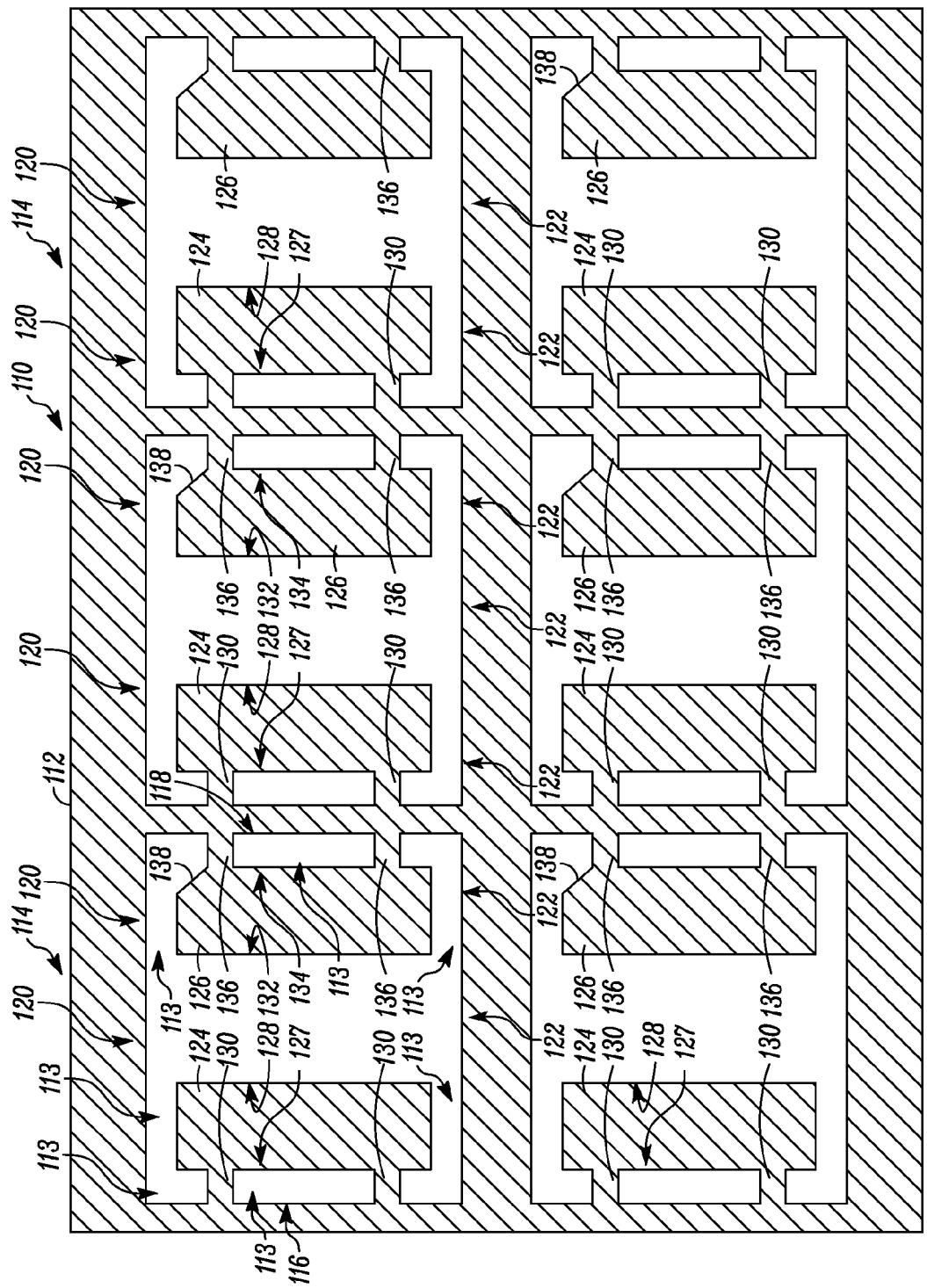
FIG. 14 is a top view of a leadframe in accordance with an embodiment of the present invention.

FIG. 14 is a top view of a leadframe 110 having a leadframe body 112, a plurality of openings 113, and a plurality flange attach regions 114. Each flange attach region 114 has opposing sides 116 and 118, opposing sides 120 and 122, a gate lead 124 and a drain lead 126. Gate lead 124 has opposing sides 127 and 128. Tabs 130 extend from side 127 to side 116. Drain lead 126 has opposing sides 132 and 134. Tabs 136 extend from side 134 to side 118. Source lead 126 has a notch 138 which is used to indicate that it is the drain lead, although the methods and apparatuses described herein are not limited in this regard.

Figure 15:
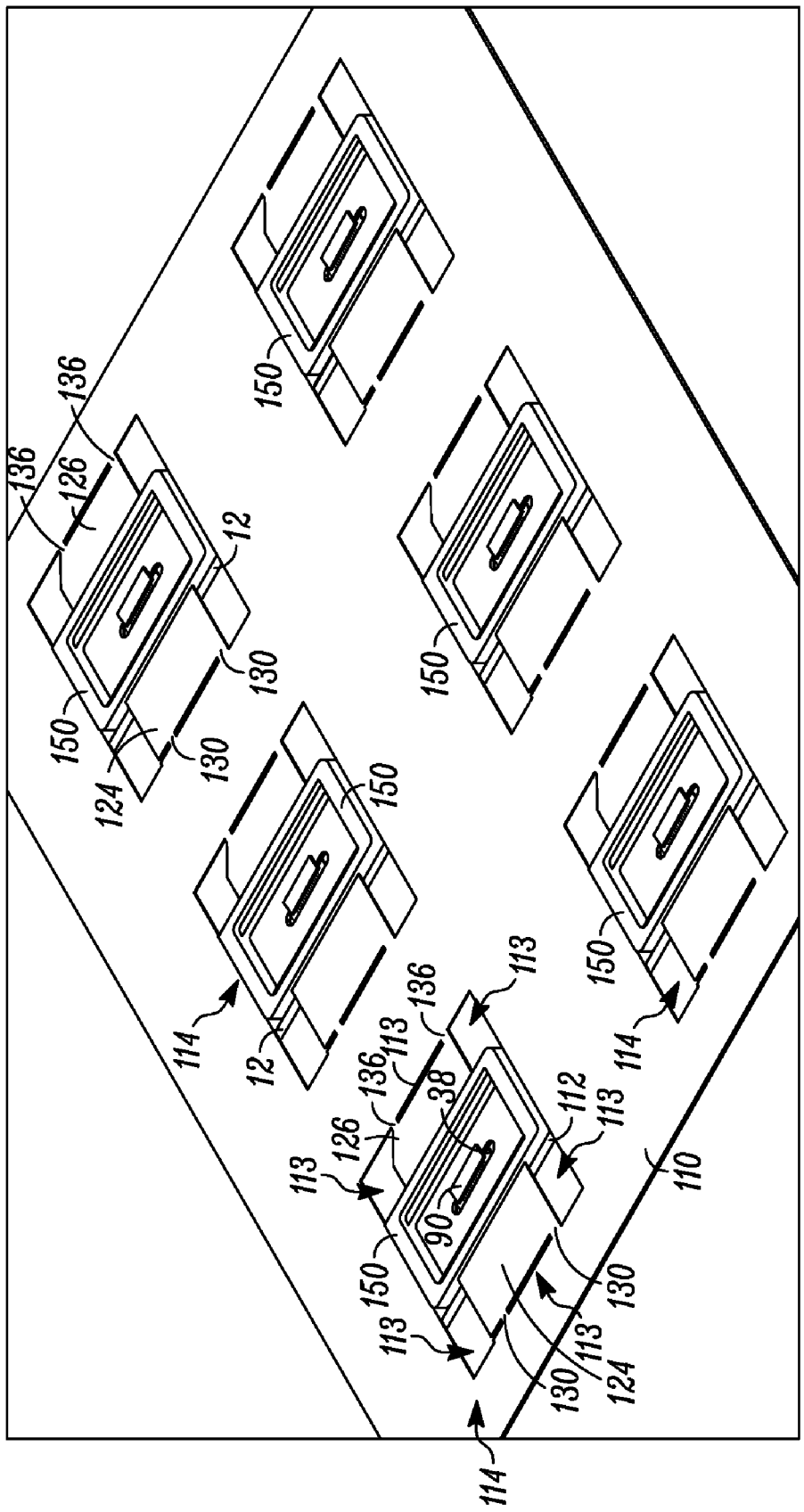
FIG. 15 is an isometric view of a plurality of the subassembly shown in FIG. 13 bonded to the leadframe of FIG. 14 to manufacture a semiconductor component in accordance with an embodiment of the present invention.

FIG. 15 is an isometric view of a plurality of the subassembly shown in FIG. 13 bonded to leadframe 110. Prior to attaching the subassembly shown in FIG. 13, rings of dielectric material 150 are formed on leadframe 110. For example, an injection molding process may be used to form dielectric rings 150. Suitable materials for the dielectric rings 150 include ceramic, polyimide, or glass.

After forming dielectric rings 150, the subassembly shown in FIG. 13 that includes flange 12, interposer 38, and semiconductor die 90, may be coupled to leadframe 110 by, for example, attaching the subassembly shown in FIG. 13 to dielectric rings 150 using an epoxy. By way of example, top surface 22 of flange 12 may be attached to the ring of dielectric material 150 using an epoxy. Heat may be applied to the subassembly shown in FIG. 15 to cure the epoxy. In other embodiments, brazing may be used to attach the subassembly of FIG. 13 to dielectric rings 150. After individual packaged semiconductor components 10 (FIG. 18) are singulated from leadframe 110, dielectric rings 150 electrically isolate gate leads 124, drain leads 126, and flanges 12 from each other.

Figure 16:
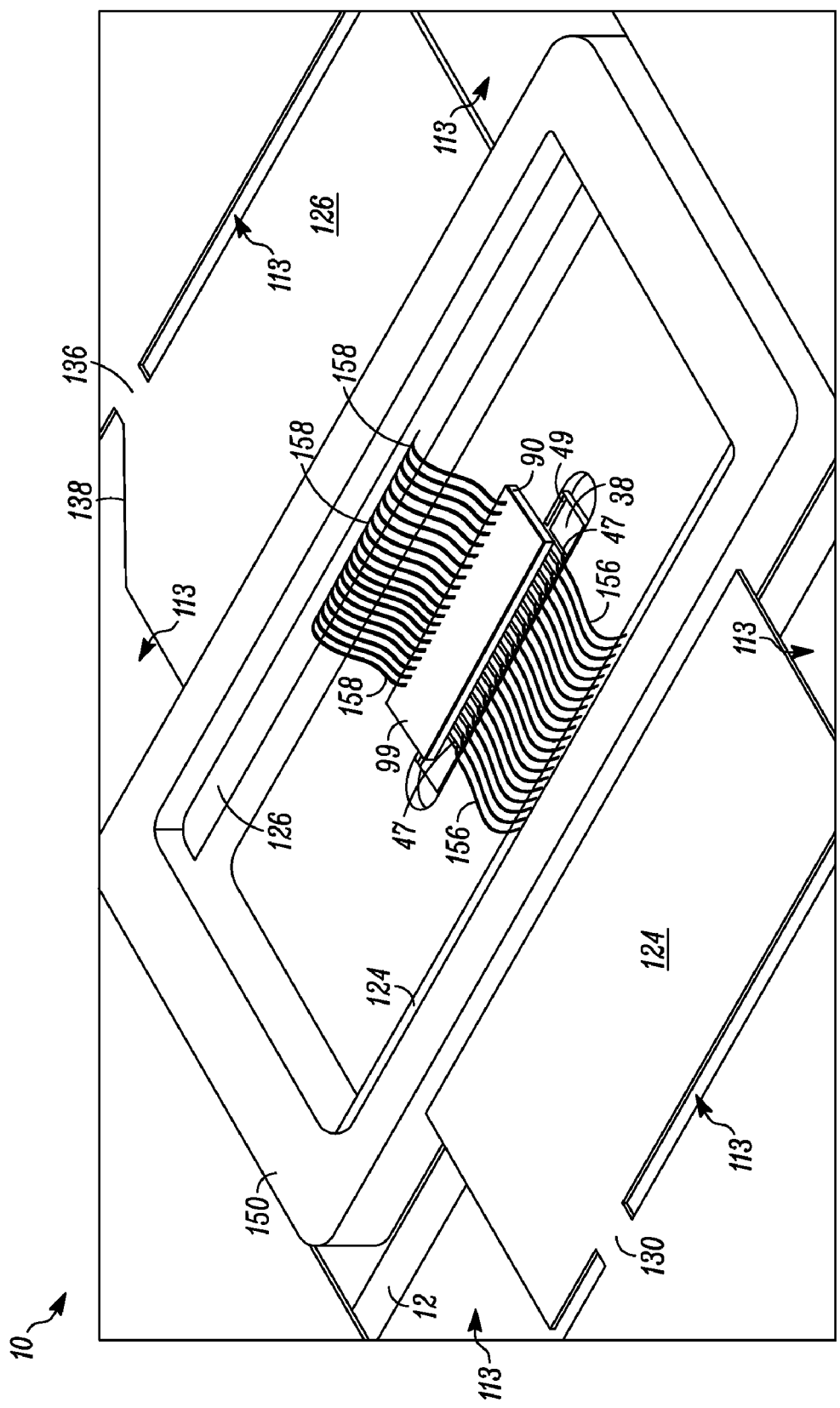
FIG. 16 is an isometric view of the leadframe of FIG. 15 further along in the manufacture of the semiconductor component.

Referring now to FIG. 16, wirebonds 156 are formed from gate interconnect pads 47 to gate leads 124 and wirebonds 158 are formed from drain terminal 99 of semiconductor die 90 to drain leads 126. Wirebonds 156 and 158 may have a diameter ranging from about 25 microns to about 50 microns and are also referred to as bonding wires or bond wires. Suitable materials for wirebonds 156 and 158 include gold, copper, or aluminum. In alternate embodiments, rather than using wirebonds 156 and 158, a metal clip (not shown) may be used to couple gate lead 124 to gate interconnect pads 47 and another metal clip (not shown) may be used to couple drain interconnect 99 to drain lead 126. Not using wire bonds may reduce parasitic inductance in semiconductor component 10.

Figure 17:
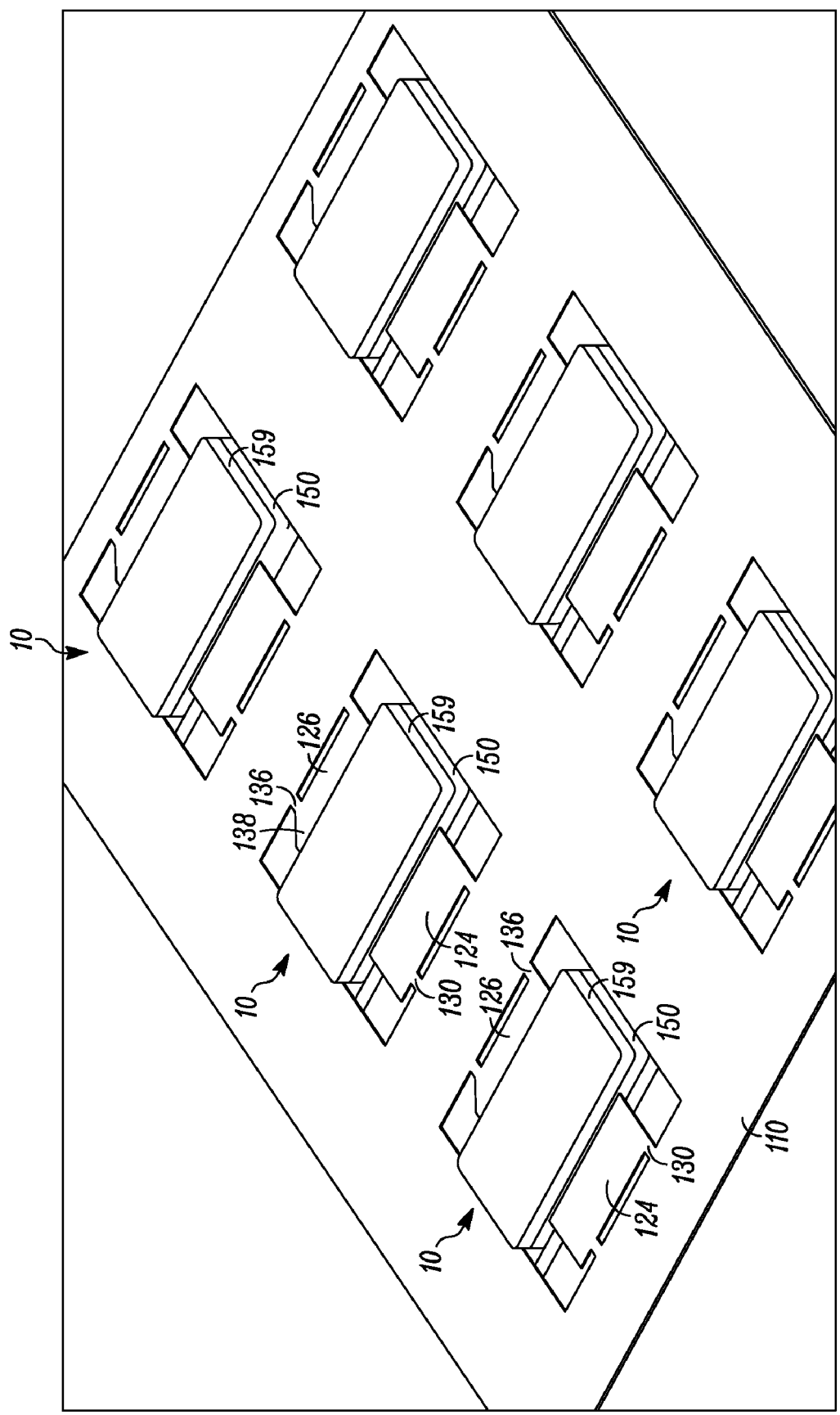
FIG. 17 is an isometric view of the leadframe of FIG. 16 further along in the manufacture of the semiconductor component.

Referring now to FIG. 17, lids 159 comprising a dielectric material such as, for example, ceramic or plastic, are attached to dielectric rings 150 using for example, an epoxy, thereby forming a plurality of non-singulated semiconductor components 10.

Referring now to FIG. 18, individual packaged semiconductor components 10 are singulated from the leadframe assembly shown in FIG. 17 that included a plurality of non-singulated semiconductor components. As may be appreciated, tabs 136 (FIG. 15) and 130 (FIG. 15) are cut to singulate the plurality of semiconductor components 10. Techniques for singulating semiconductor components from leadframes are known to those skilled in the art.

A portion of gate lead 124 is partially exposed external to semiconductor component 10 to provide electrical coupling of an external bias signal such as, for example, a voltage ranging from about one volt to about four volts, from an external source (not shown) to gate bond pads 100 (FIG. 7) of semiconductor die 90 via gate lead 124, wirebonds 156 (FIG. 16), gate interconnect pads 47 (FIG. 12), and gate bumps 104 (FIG. 11). A portion of drain lead 126 is partially exposed external to semiconductor component 10 to provide electrical coupling of an external bias signal such as, for example, a voltage ranging from about 20 volts to about 100 volts, from an external source (not shown) to drain interconnect 99 of semiconductor die 90 via drain lead 126 and wirebonds 158 (FIG. 16). Flange 12 is partially exposed external to semiconductor component 10 to provide electrical coupling of an external bias signal such as, for example, ground, to source bond pads 102 (FIG. 7) of semiconductor die 90 via flange 12 and source bumps 106 (FIG. 11). Flange 12 is also partially exposed to allow coupling of flange 12 to a thermally conductive material having a relatively low thermal resistance such as, for example, a metal heat sink (not shown) to provide a thermal path for removing heat generated by semiconductor die 90.

Figure 19:
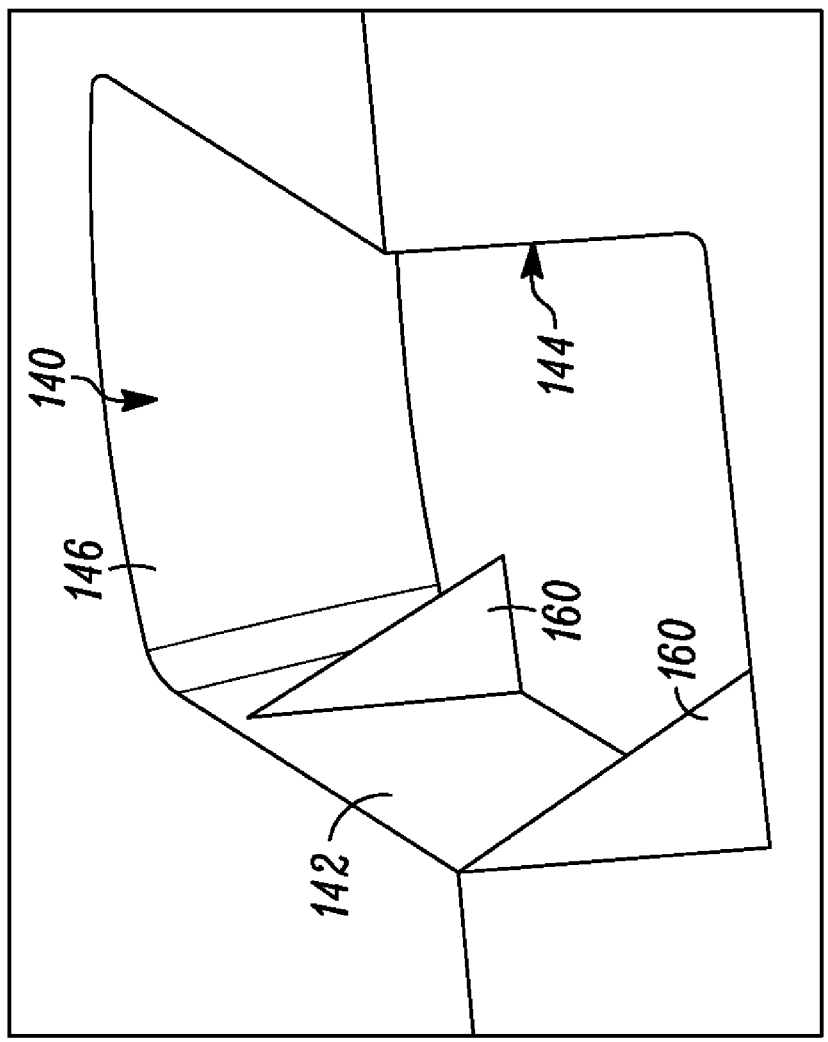
FIG. 19 is a partially cut-away isometric view of a slot of a flange in accordance with another embodiment of the present invention.

Although embodiments of the present invention have been described with reference to FIG. 1 in which slot 26 may have various shapes, these are not limitations of the present invention. For example, FIG. 19 illustrates a partially cut-away isometric view of a slot 140 of a flange having sidewalls 142 and 144 similar to slot 26 with its sidewalls 28 and 29. Slot 140 also has ends similar to ends 30 and 31. Only end 146 is shown in FIG. 19. Unlike slot 26, slot 140 includes protrusions or swage features 160 which may be formed adjacent sidewall 142 or sidewall 144, or both. Swage features 160 extend from sidewall 142 into slot 140. Like slot 26, slot 140 and swage features 160 may be formed by milling, etching, grinding, or stamping.

An advantage of forming swage features 160 adjacent sidewall 142 is that as interposer 38 (discussed with reference to FIG. 1) is pressed into melted solder preform 36A, swage features 160 apply a lateral force on interposer 38 to push it in the direction of sidewall 144. The lateral force causes one edge of interposer 38 to be flush with sidewall 144. The leading edges of swage features 160 deform until interposer 38 achieves its final depth, that is, when surfaces 48 of gate interconnect pads 47 and surface 22 of flange 12 are planar, or substantially planar, with each other.

In the embodiment wherein semiconductor die 90 is a discrete power transistor, spacing flange 12 further away from the edges of semiconductor die 90 may be advantageous to increase the breakdown voltage of semiconductor component 10.

In some embodiments, flange 12 may be coupled to ground and the drain terminal 99 of die 90 may be coupled to a relatively high voltage of, for example, a voltage potential ranging between at least about 20 volts (V) to over 100 V. During operation, electric field potentials may be concentrated at the edges of semiconductor die 90, and therefore, it may be advantageous to position flange 12 spaced apart at a predetermined distance from the edges of semiconductor die 90 to prevent arcing between die 90 and flange 12 which may adversely affect the breakdown voltage of the power transistor of die 90. As was discussed above, wafer bumps 104 and 106 are formed to have a predetermined height ranging from approximately 25 μm to approximately 100 μm to provide this amount of spacing between die 90 and flange 12 to support drain-to-source breakdown voltages (BVds) ranging from about 50 volts to about 200 volts.

Further, forming dielectric underfill material such as, for example, underfill material 108 discussed with reference to FIG. 13, in the spaces between flange 12 and die 90 may further increase the standoff and breakdown voltages of die 90. Embodiments to further increase the standoff and breakdown voltages are discussed below with reference to FIGS. 20 and 21.

Figure 20:
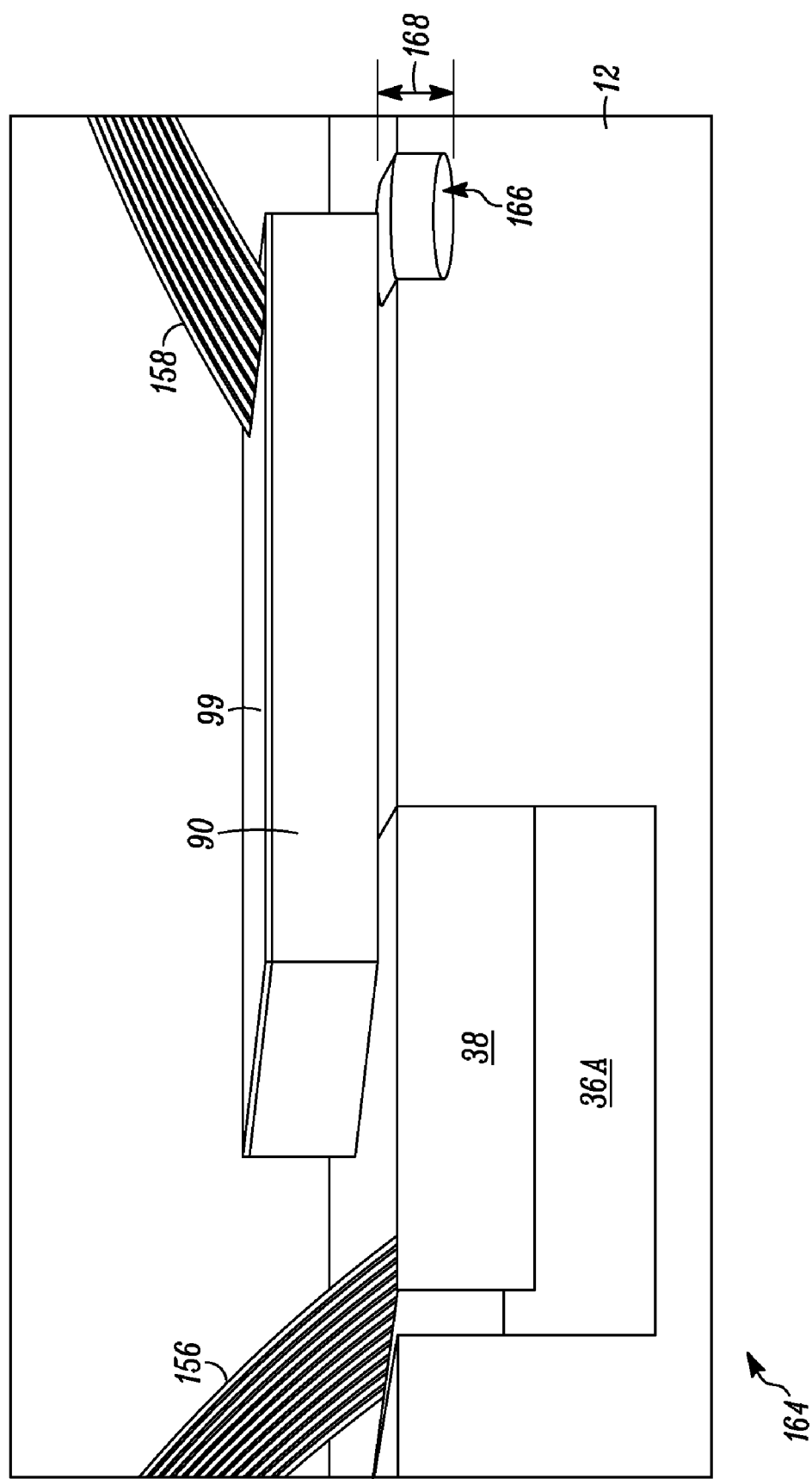
FIG. 20 is an isometric view of a portion of a semiconductor component in accordance with another embodiment of the present invention.

FIG. 20 is an isometric view of a portion of a semiconductor component 164 in accordance with another embodiment of the present invention. Semiconductor component 164 comprises flange 12, solder preform 36A, interposer 38, semiconductor die 90, and wirebonds 156 and 158. A moat or channel 166 is formed around semiconductor die 90. Moat 166 increases the distance between the drain of die 90 and flange 12 which is some embodiments is coupled to the source regions of the MOSFETs of die 90. The distance is indicated by arrows 168, and in some embodiments distance 168 may range from about 125 μm (about 5 mils) to about 250 μm (about 10 mils). In embodiments wherein die 90 is a discrete transistor device, using moat 166 to increase the distance between flange 12 and die 90 may increase the drain-to-source breakdown voltage ("BVds") of die 90.

Figure 21:
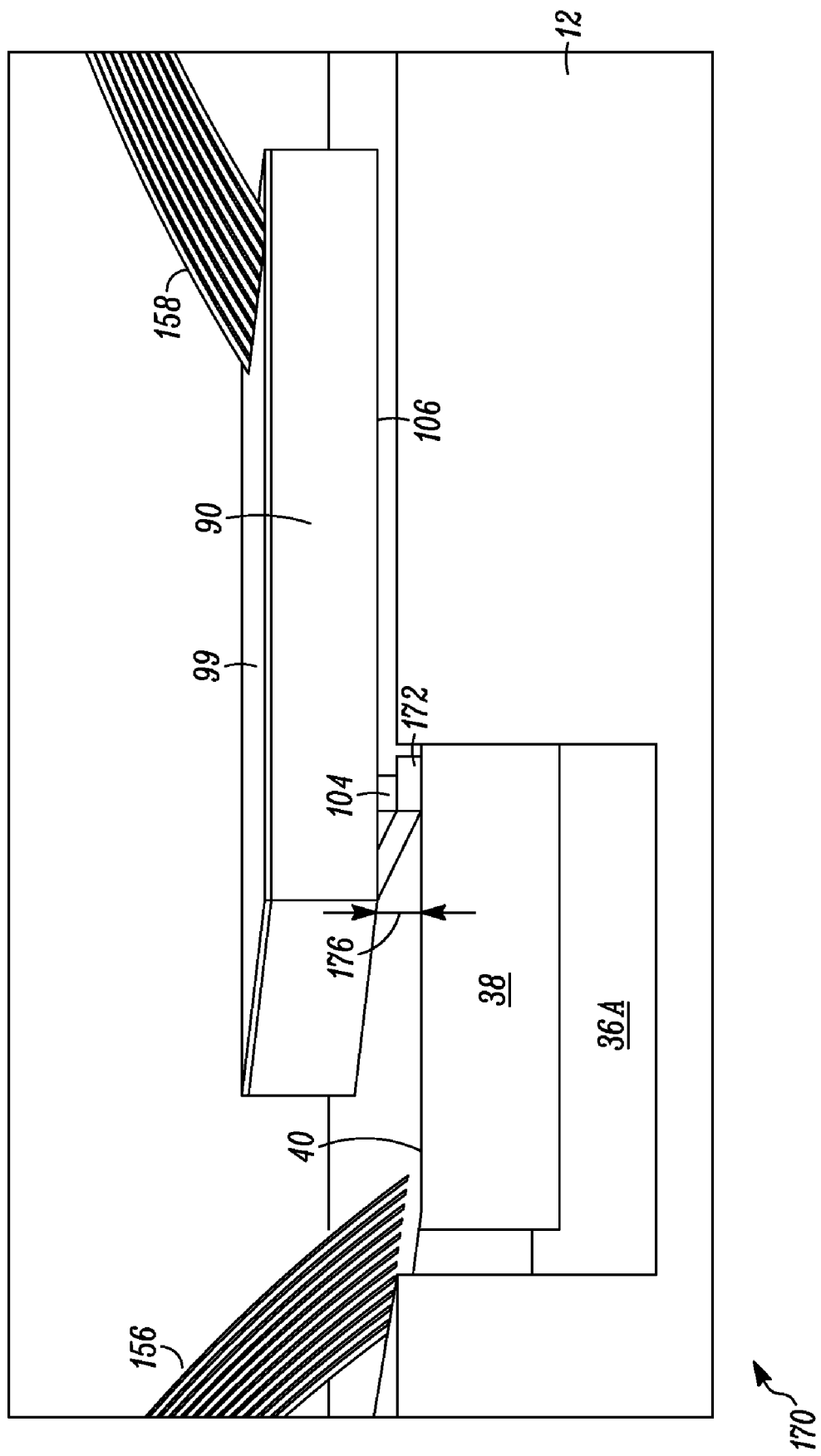
FIG. 21 is an isometric view of a portion of a semiconductor component in accordance with another embodiment of the present invention.

FIG. 21 is a isometric view of a semiconductor component 170 in accordance with another embodiment of the present invention. Semiconductor component 170 comprises flange 12, solder preform 36A, interposer 38, semiconductor die 90, and wirebonds 156 and 158. A bump 172 may be formed extending from surface 40 of interposer 38 towards semiconductor die 90. Bump 172 is contacting bump 104, and bump 172 increases the distance between the gate metal on interposer 38 to the edge of the drain. The distance is indicated by arrows 176, and in some embodiments distance 176 may range from about 50 μm to about 150 μm. Using bump 172 to increase the distance between the gate metal 47 of interposer 38 and the edges of die 90 may increases the gate-to-drain breakdown voltage ("BVgd") and may reduce the gate-to-drain capacitance ("Cgd"). In some embodiments, the height of bump 172 may be about 50 μm and the height of wafer bump 104 may be about 50 μm, and accordingly, distance 176 may be about 100 μm.

Although moat 166 has been shown in the embodiment of FIG. 20 and bump 172 has been shown in the embodiment of FIG. 21, it should be understood that moat 166 and bump 172 may be included together in a single embodiment.

Figure 22:
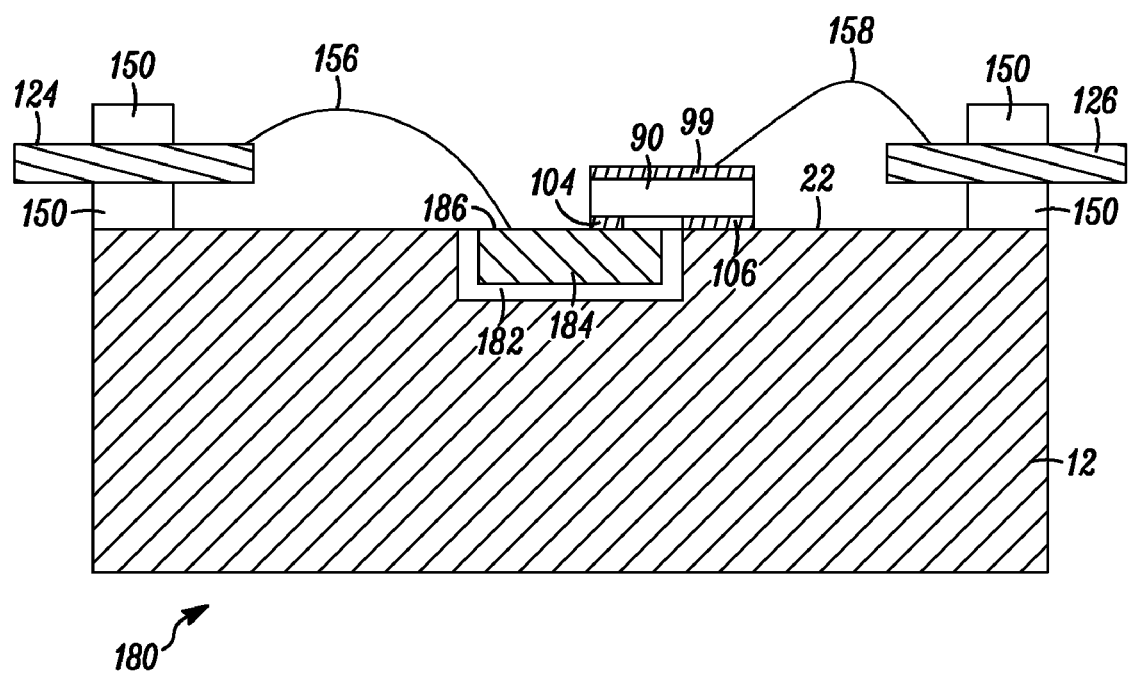
FIG. 22 is a cross-sectional view of a semiconductor component in accordance with another embodiment of the present invention.

FIG. 22 is a cross-sectional view of a semiconductor component 180 in accordance with another embodiment of the present invention. Semiconductor component 180 is similar to semiconductor component 10 (FIG. 18) described above and comprises flange 12, semiconductor die 90, and wirebonds 156 and 158. However, the combination of solder preform 36A and interposer 38 of semiconductor component 10 is replaced by a dielectric material 182 and an electrically conductive material 184, respectively. Thus, electrically conductive material 184 is electrically isolated from flange 12 by dielectric material 182 and serves as the interposer. Electrically conductive material 184 has a surface 186. Suitable materials for dielectric material 182 include a plastic material, a polymer material such as, for example, liquid crystal polymer (LCP), a polyimide, or an epoxy. Suitable materials for electrically conductive material 184 include copper, gold, silver, titanium, or tantalum. Surface 186 of conductive material 184 and surface 22 of flange 12 are planar, or substantially planar, with each other.

Figure 23:
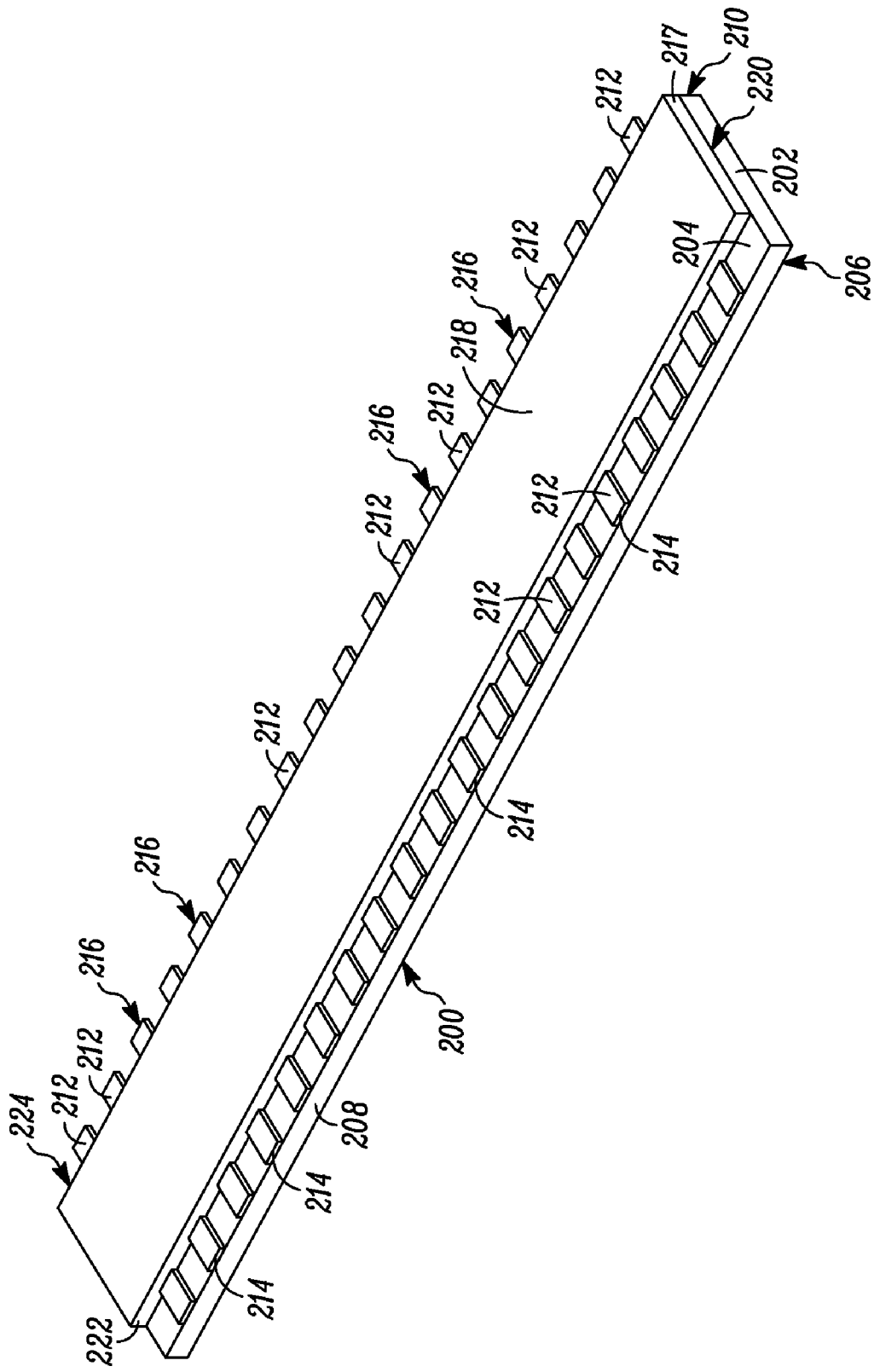
FIG. 23 is an isometric view of a flex connector in accordance with an embodiment of the present invention.

FIG. 23 is an isometric view of a flex connector 200 used in the manufacture of a semiconductor component 198 (FIG. 26) in accordance with another embodiment of the present invention. Flex connector 200 comprises a layer of a flexible substrate material 202 having opposing surfaces 204 and 206 that are substantially parallel to each other and opposing sides 208 and 210 that are substantially parallel to each other. Strips 212 of an electrically conductive material are formed on surface 204 such that they are spaced apart from each other. Each electrically conductive strip 212 has opposing ends 214 and 216. Ends 214 are substantially flush with side 208 and ends 216 extend past side 210. It should be noted that ends 214 are not limited to being substantially flush with side 208. They can extend over side 208 or they can stop before side 208. The ends 214 adjacent side 208 are referred to as interconnect ends and the ends 216 adjacent side 210 are referred to as gate ends.

Flex connector 200 may comprise another layer of flexible substrate material 217 that is disposed on portions of surface 204 and portions of electrically conductive strips 212. Flexible substrate layer 217 has opposing surfaces 218 and 220 that are substantially parallel to each other and opposing edges 222 and 224 that are substantially parallel to each other. Edge 222 is laterally spaced apart from edge 208. Edge 224 is coplanar, or substantially coplanar, with edge 210 to form a composite or single edge. The combination of flexible substrate layers 202 and 217 have a thickness ranging from approximately 12.5 μm (approximately 0.5 mils) to approximately 125 μm (approximately 5 mils). By way of example, the material for flexible substrate layers 202 and 217 is polyimide. In some embodiments, a suitable material for the flexible dielectric layers 202 and 217 is a polyimide film such as that sold by DuPont under the tradename KAPTON®. Although flex connector 200 is shown and described as having two layers of a flexible substrate material, this is not a limitation of the present invention. For example, in some embodiments, flexible substrate layer 217 is an optional layer that may be omitted, and, in other embodiments, flexible substrate layer 202 is an optional layer that may be omitted. Flex connector 200 may also be referred to as a flex connector interposer or a flex interposer.

Figure 24:
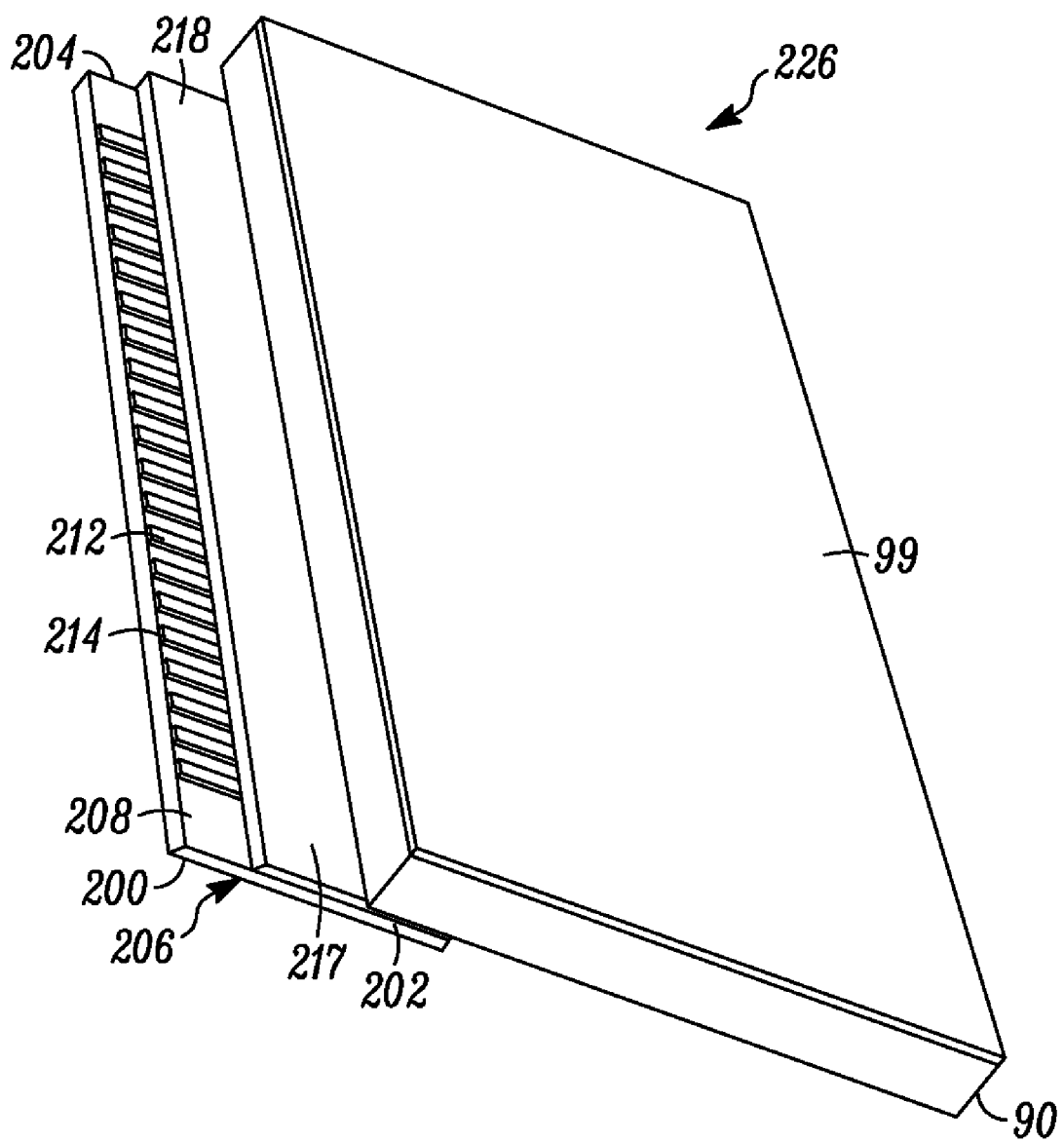
FIG. 24 is an isometric view of a flex connector bonded to a semiconductor die in accordance with an embodiment of the present invention.

Referring now to FIG. 24, flex connector 200 is bonded to a semiconductor die such as, for example, semiconductor die 90 described with reference to FIGS. 7 to 11, to form a flex-connected semiconductor structure or subassembly 226. More particularly, portions of strips 212 nearest gate ends 216 are bonded to corresponding gate bumps 104 (FIG. 11) using, for example, a thermo-compression bonder (not shown). As is discussed above, gate bumps 104 may comprise a gold bump having a tin cap formed on the gate bump. As may be appreciated, increasing the length of strips 212 increases the series inductance to the input terminals (for example, gate bumps 104) of die 90, which may be undesirable in relatively high frequency applications.

Figure 25:
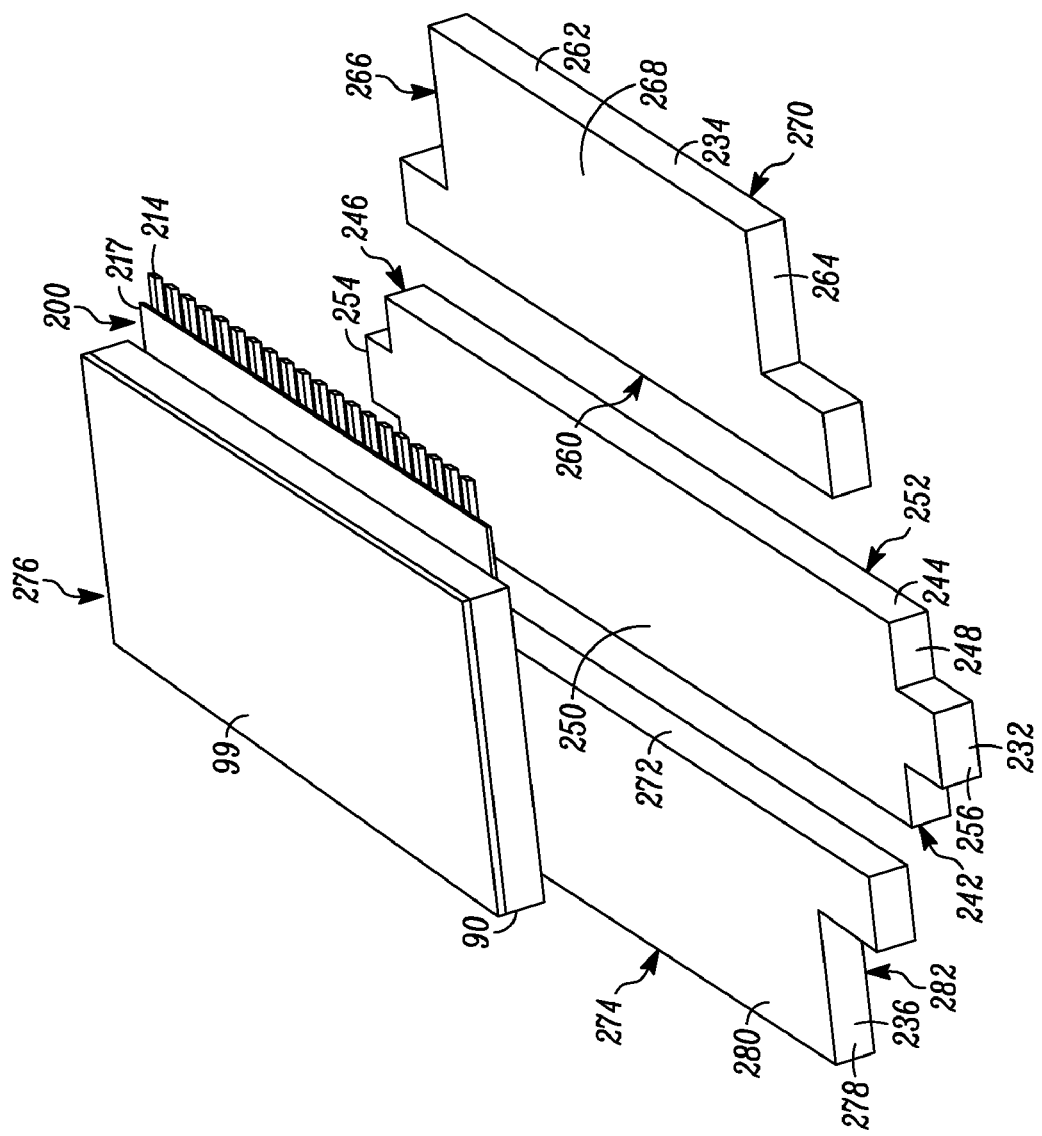
FIG. 25 is an exploded isometric view of a portion of a semiconductor component in accordance with another embodiment of the present invention.

FIG. 25 is an exploded isometric view of flex connector 200, a source lead 232, a gate lead 234, and a drain lead 236 used in the manufacture of semiconductor component 198 in accordance with an embodiment of the present invention. Source lead 232 has opposing sides 242 and 244 that are substantially parallel to each other, opposing sides 246 and 248 that are substantially parallel to each other, and opposing surfaces 250 and 252 that are substantially parallel to each other. Arms 254 and 256 extend from sides 246 and 248, respectively. Surface 250 may be referred to as a top surface and surface 252 may be referred to as a bottom surface.

Gate lead 234 is a T-shaped structure having opposing sides 260 and 262 that are substantially parallel to each other, opposing sides 264 and 266 that are substantially parallel to each other, and opposing surfaces 268 and 270 that are substantially parallel to each other. Surface 268 may be referred to as a top surface and surface 270 may be referred to as a bottom surface.

Drain lead 236 is a T-shaped structure having opposing sides 272 and 274 that are substantially parallel to each other, opposing sides 276 and 278 that are substantially parallel to each other, and opposing surfaces 280 and 282 that are substantially parallel to each other. Surface 280 may be referred to as a top surface and surface 282 may be referred to as a bottom surface.

Preferably, leads 232, 234, and 236 are made from a material having a CTE matching, or substantially matching, that of silicon. Suitable materials for leads 232, 234, and 236 include copper, an alloy such as a copper alloy, or a copper-tungsten alloy. The material for leads 232, 234, and 236 is not a limitation of the present invention. Further, in alternate embodiments, leads 232, 234, and 236 can be made from materials having CTEs that do not match those of silicon. It should be noted that typically leads 232, 234, and 236 are part of a leadframe structure (not shown), and in some embodiments, these leads may be formed by etching an electrically and thermally conductive material such as, for example, a copper substrate.

Figure 26:
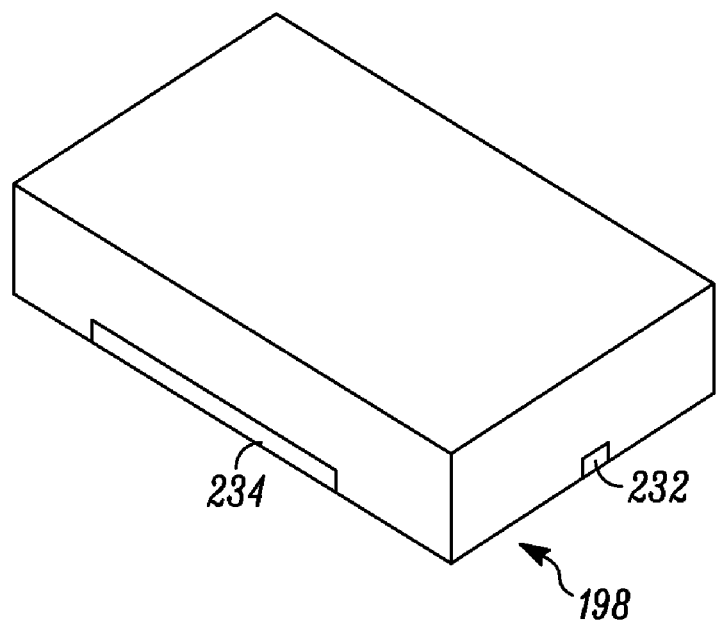
FIG. 26 is an isometric view of a semiconductor component in accordance with an embodiment of the present invention.

Referring now to FIGS. 24, 25, and 26, source bumps 106 (shown in FIG. 11) of die 90, which may comprise a gold bump having a tin cap formed thereon as described above, are bonded to source lead 232 and the portions of conductive strips 212 nearest ends 214 are bonded to gate lead 234. In some embodiments, drain interconnect 99 may be electrically coupled to drain lead 236 using either wirebonds or a metal clip.

The embodiment of semiconductor component 198 allows for greater spacing between gate lead 232 and source lead 234 compared to other implementations. The leadframe comprising source leads 232, gate leads 234, and drain leads 236 and to which the flex connector 200 is bonded may be placed in a mold cavity and an encapsulating material or mold compound is injection molded into the mold cavity to encapsulate the subassembly that includes die 90, flex connector 200 and portions of source lead 232, gate lead 234, and drain lead 236. The encapsulated subassembly is singulated from the leadframe to form singulated semicoductor components 198.

Figure 27:
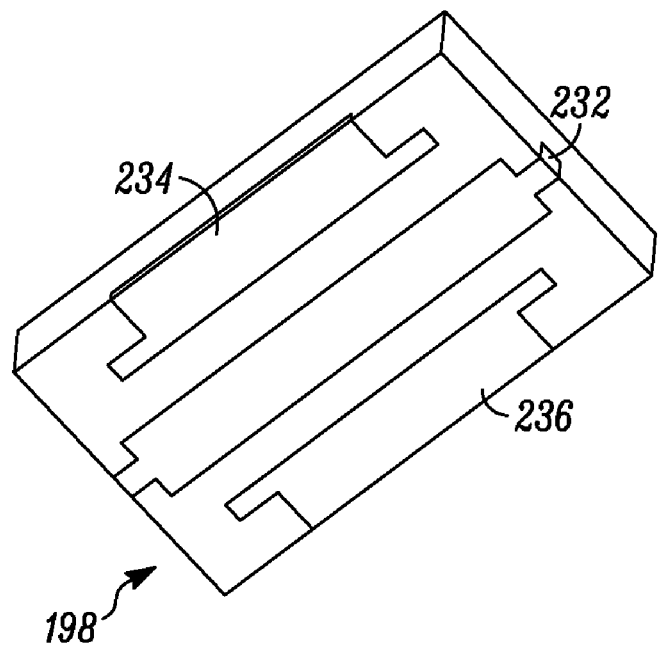
FIG. 27 is another isometric view of the semiconductor component of FIG. 26.

FIG. 27 is another isometric view of semiconductor component 198 showing source lead 232, gate lead 234, and drain lead 236. The package illustrated in FIGS. 26 and 27 may be a surface mount over-molded package, and semiconductor component 198 may be referred to as a surface mount device (SMD) in this embodiment. In other words, the package configuration of semiconductor component 198 illustrated in FIG. 27 may allow for surface mounting semiconductor component 198 on a printed circuit board (PCB) since surfaces of leads 232, 234, and 236 are coplanar to, or substantially coplanar to, each other. A plurality of these surface mount devices may be placed in a tape and reel system to allow these packages to be used in a tape and reel assembly process. Tape and reel systems may provide a convenient means of conveyance to allow the automated placement of component 198 on a printed circuit board (PCB).

Figure 28:
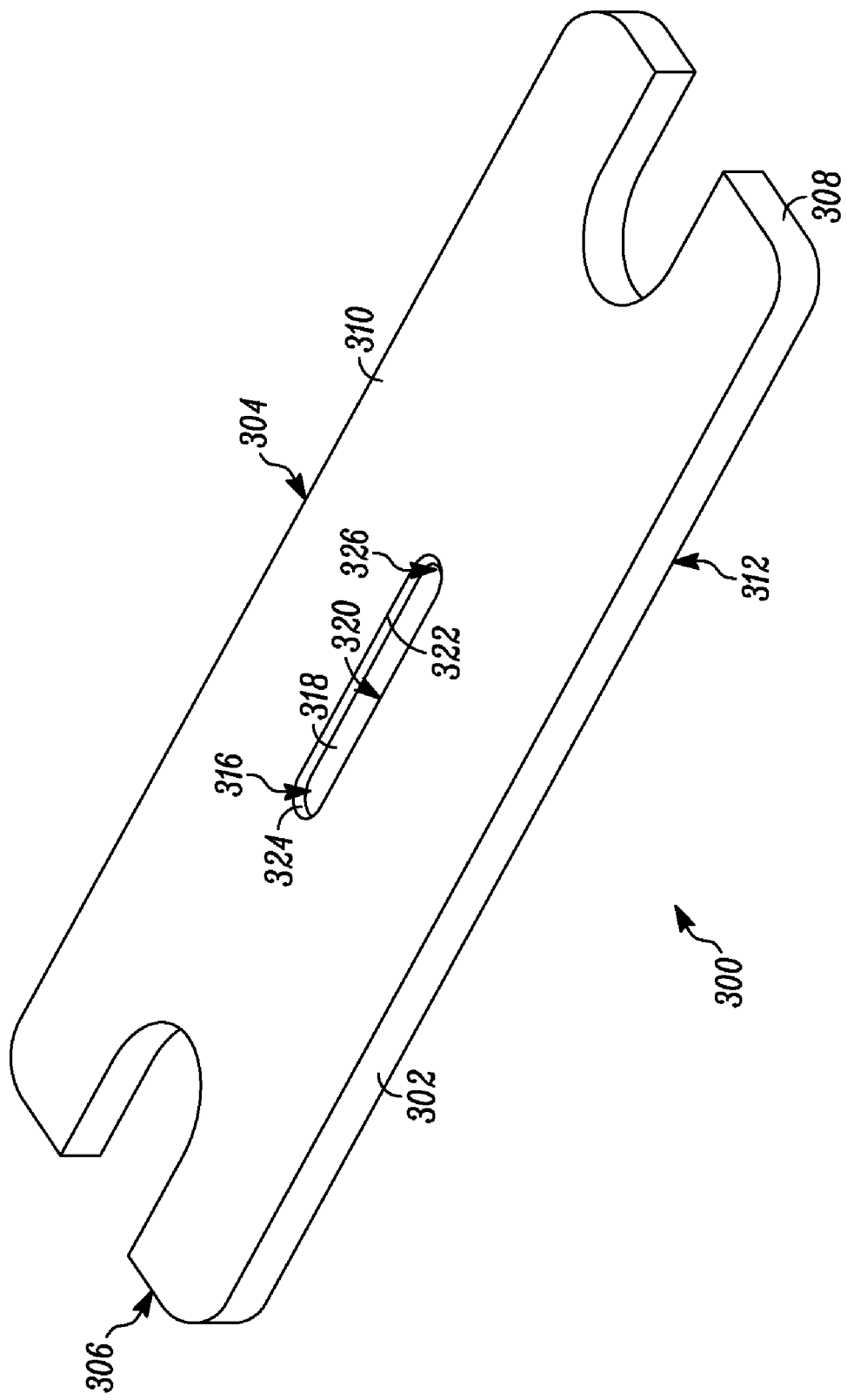
FIG. 28 is an isometric view of a flange in accordance with another embodiment of the present invention.

FIG. 28 illustrates a heatsink or flange 300 used in the manufacture of semiconductor component 298 (FIG. 33) in accordance with another embodiment of the present invention. Flange 300 has opposing sides 302 and 304 that are substantially parallel to each other, opposing sides 306 and 308 that are substantially parallel to each other, and opposing surfaces 310 and 312 that are substantially parallel to each other. Surface 310 may be referred to as a top surface and surface 312 may be referred to as a bottom surface. In some embodiments, flange 300 is made from a material having a CTE matching, or substantially matching, that of silicon or ceramic. Examples of materials for flange 300 include copper, an alloy such as a copper alloy, or a copper-tungsten alloy. In addition, the material for flange 12 may include metal laminates such as, for example, a copper-molybdenum-copper laminate. The material for flange 300 is not a limitation of the present invention.

A slot or groove 316 having a floor 318 and a sidewalls 320 and 322 and ends 324 and 326 is formed in flange 300. Slot 316 may be formed by milling, etching, grinding, or stamping. Slot 316 may have a rectangular shape, a quadrilateral shape, or other polygonal shape. In addition, slot 316 may have an oval shape. Like slot 26, the shape of slot 316 is not a limitation of the present invention, however, it is desirable in some embodiments that slot 316 have at least one sidewall that is substantially straight.

Figure 29:
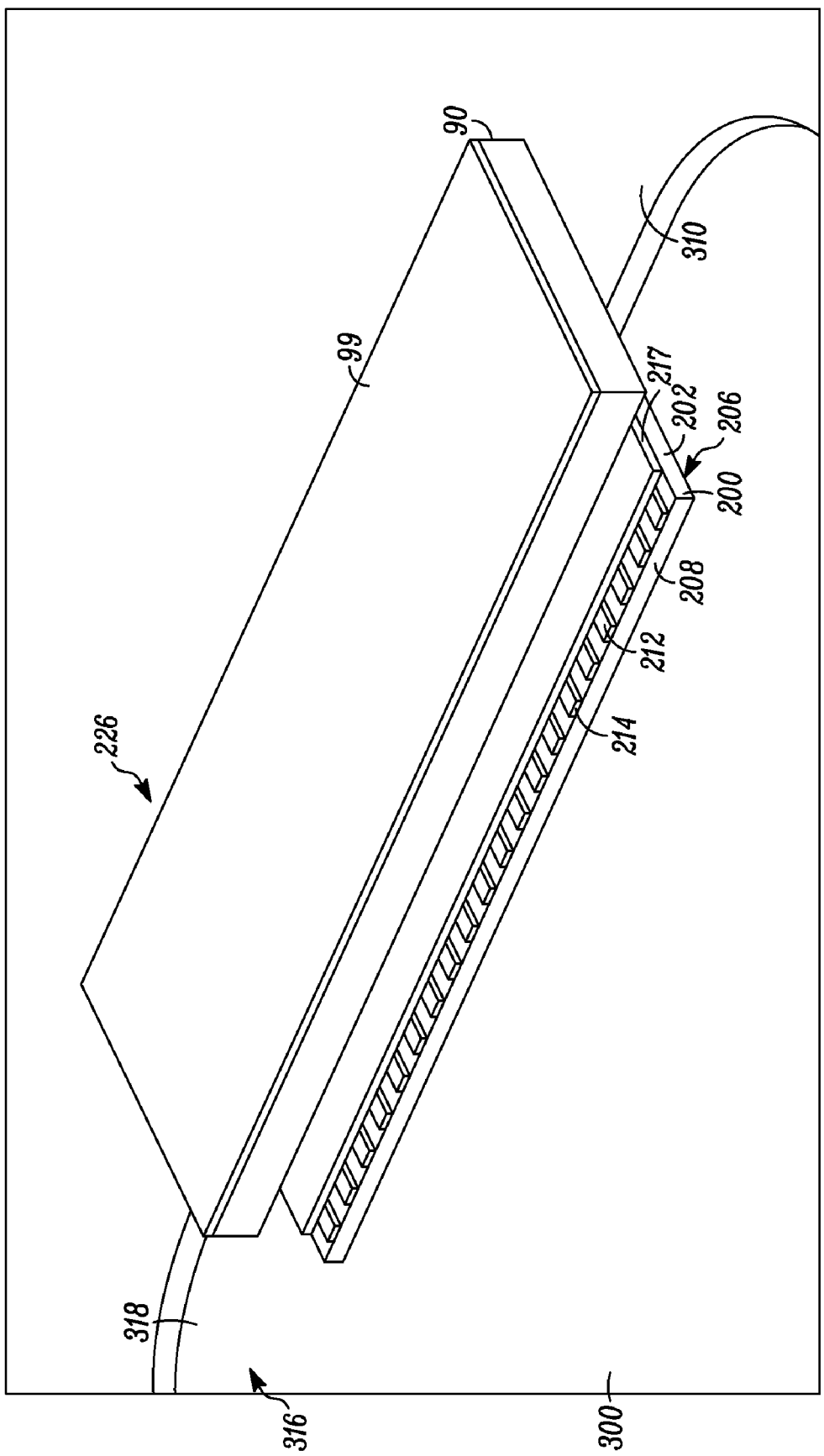
FIG. 29 is an isometric view of a semiconductor component during manufacture in accordance with an embodiment of the present invention.

Referring now to FIG. 29, flex-connected semiconductor structure 226 (FIG. 24) is placed on flange 300 such that surface 206 of flex connector 200 is positioned on floor 318 of slot 316 and source bumps 106 (FIG. 11) contact surface 310 of flange 300. At least a portion of flex interposer 200 is in slot 316 below a plane (not shown) that is coplanar to, or substantially coplanar to, top surface 310 of flange 300. In some embodiments, all of, or substantially all of, interposer 200 is in slot 316 below a plane (not shown) that is coplanar to, or substantially coplanar to, top surface 310 of flange 300.

Figure 30:
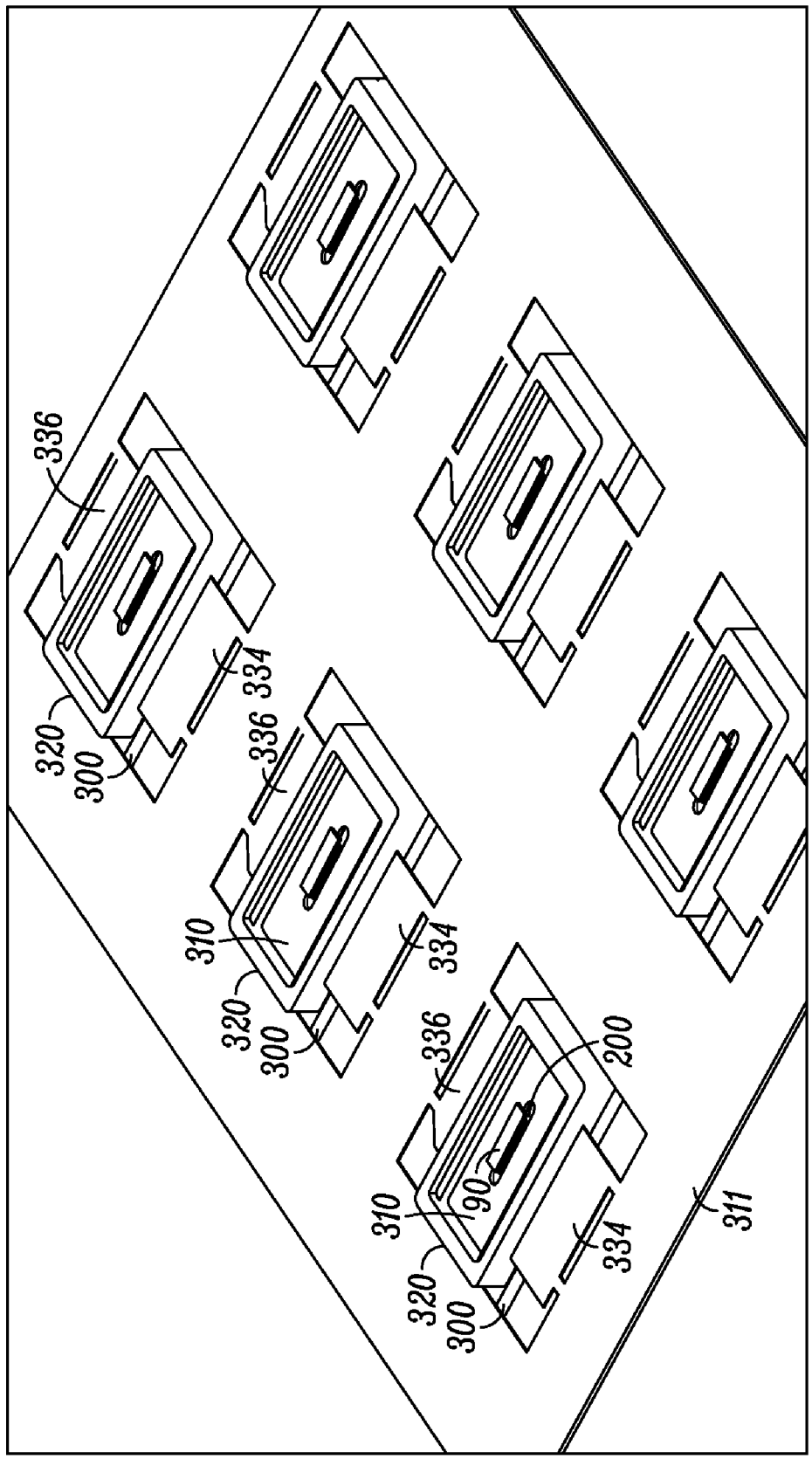
FIG. 30 is an isometric view of a plurality of the subassembly shown in FIG. 29 bonded to a leadframe to manufacture a semiconductor component in accordance with an embodiment of the present invention

FIG. 30 is an isometric view of a plurality the subassembly shown in FIG. 29 bonded to a leadframe 311. Prior to attaching the subassembly shown in FIG. 29 to leadframe 311, rings of dielectric material 320 are formed on leadframe 311. For example, an injection molding process may be used to form dielectric rings 320. Examples of suitable materials for the dielectric rings 320 include ceramic, polyimide, or glass.

After forming dielectric rings 320, the subassembly shown in FIG. 29 that includes flange 300, flex connector 200, and semiconductor die 90, may be coupled to leadframe 311 by, for example, attaching the subassembly shown in FIG. 29 to dielectric rings 320 using an epoxy. By way of example, top surface 310 of flange 300 may be attached to the ring of dielectric material 320 using an epoxy. Heat may be applied to the subassembly shown in FIG. 30 to cure the epoxy. After individual packaged semiconductor components 298 (FIG. 33) are singulated from leadframe 311, dielectric rings 320 electrically isolate gate leads 334, drain leads 336, and flanges 300 from each other.

Figure 31:
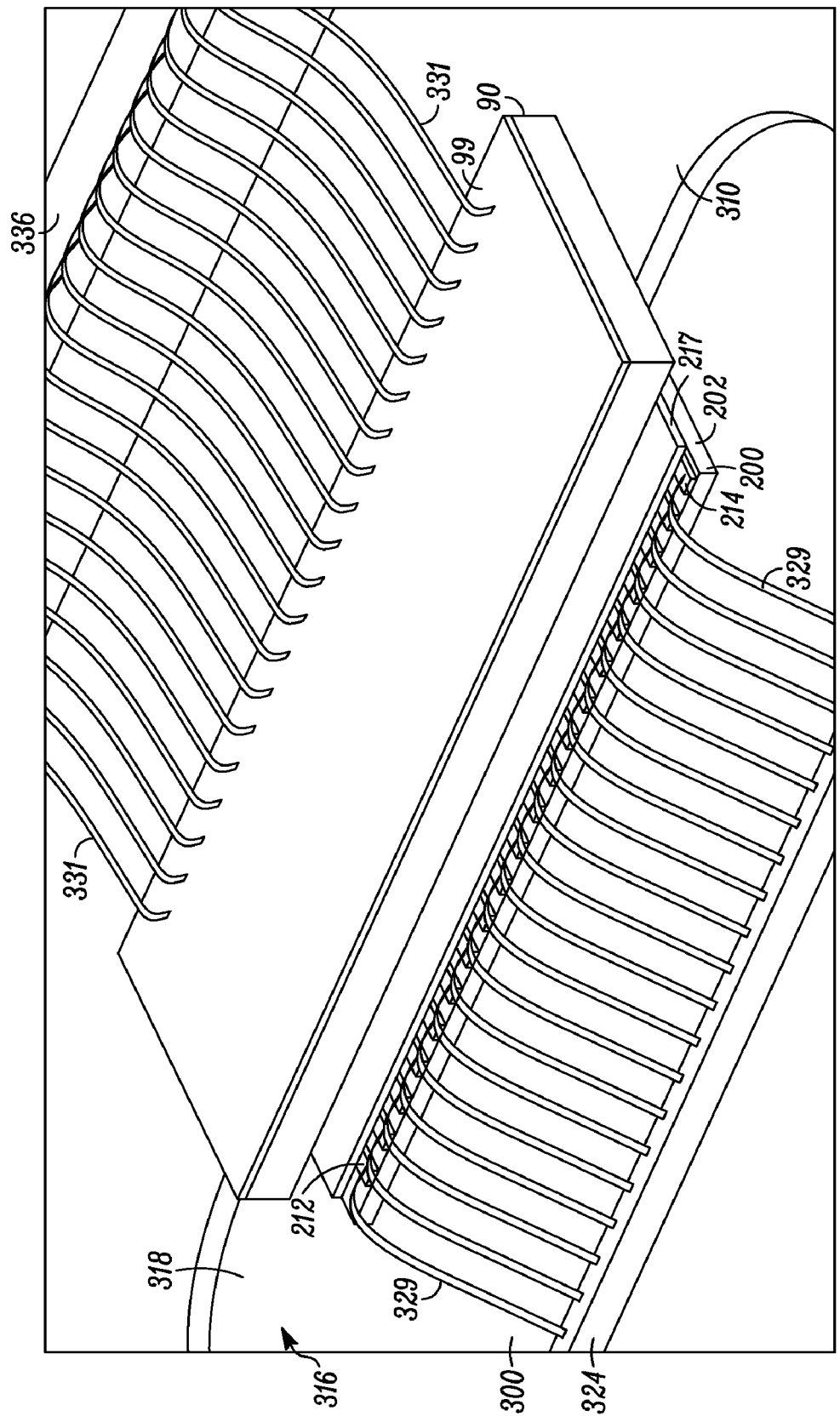
FIG. 31 is an isometric view of a portion of the leadframe of FIG. 30 further along in manufacture.

Referring now to FIG. 31, wirebonds 329 are formed from the portions of conductive strips 212 proximate to interconnect ends 214 to gate leads 334 and wirebonds 331 are formed from drain interconnect 99 of semiconductor die 90 to drain leads 336. Wirebonds 329 and 331 are also referred to as bonding wires or bond wires. Suitable materials for wirebonds 329 and 331 include gold, copper, or aluminum. In alternate embodiments, rather than using wirebonds 329 and 331, a metal clip (not shown) may be used to couple gate lead 334 to conductive strips 212 and another metal clip (not shown) may be used to couple drain interconnect 99 to drain lead 336. Not using wire bonds may reduce parasitic inductance in semiconductor component 298.

Figure 32:
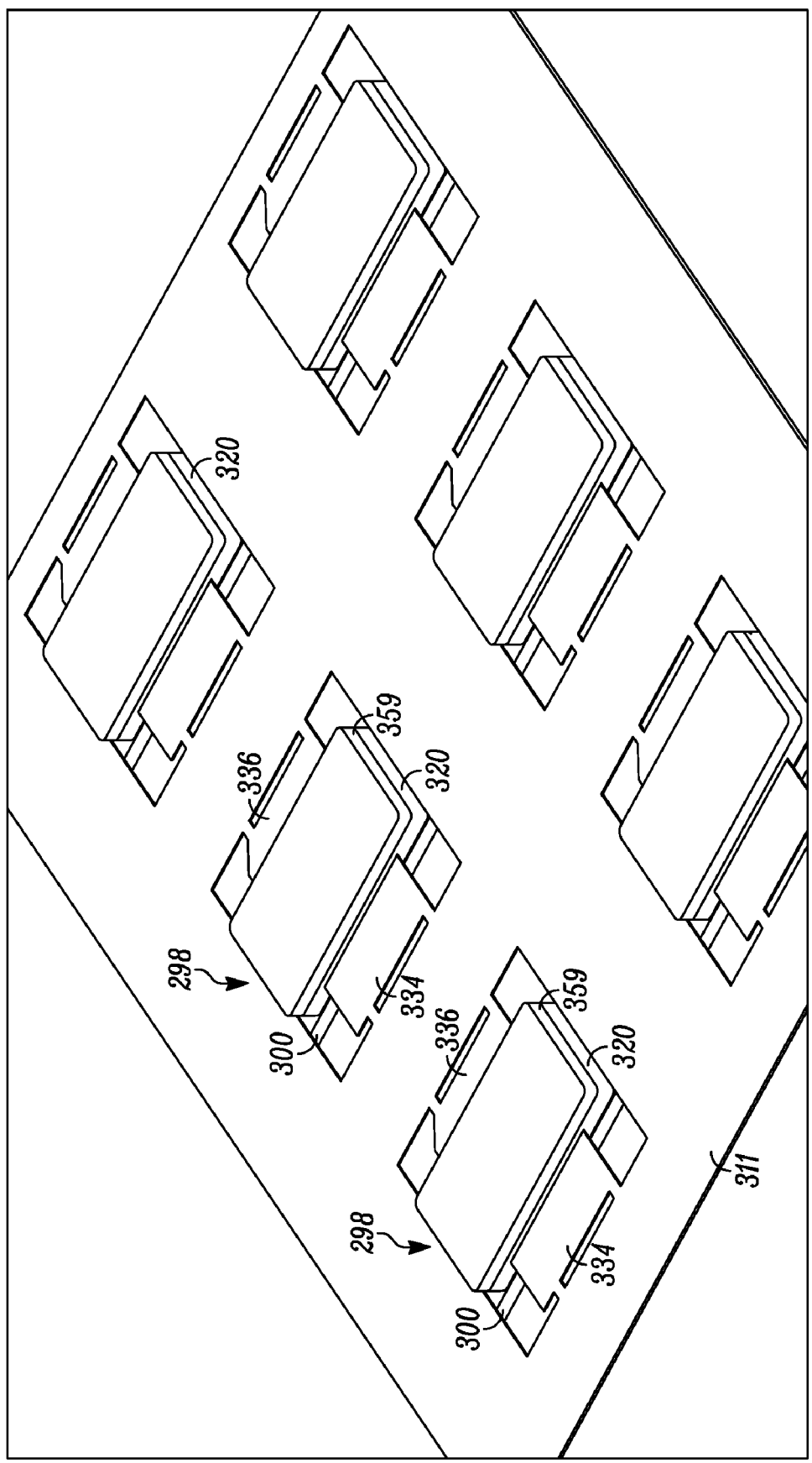
FIG. 32 is an isometric view of the leadframe of FIG. 31 further along in manufacture.

Referring now to FIG. 32, lids 359 comprising a dielectric material such as, for example, ceramic or plastic, are attached to dielectric rings 320 using for example, an epoxy, thereby forming a plurality of non-singulated semiconductor components 298.

Figure 33:
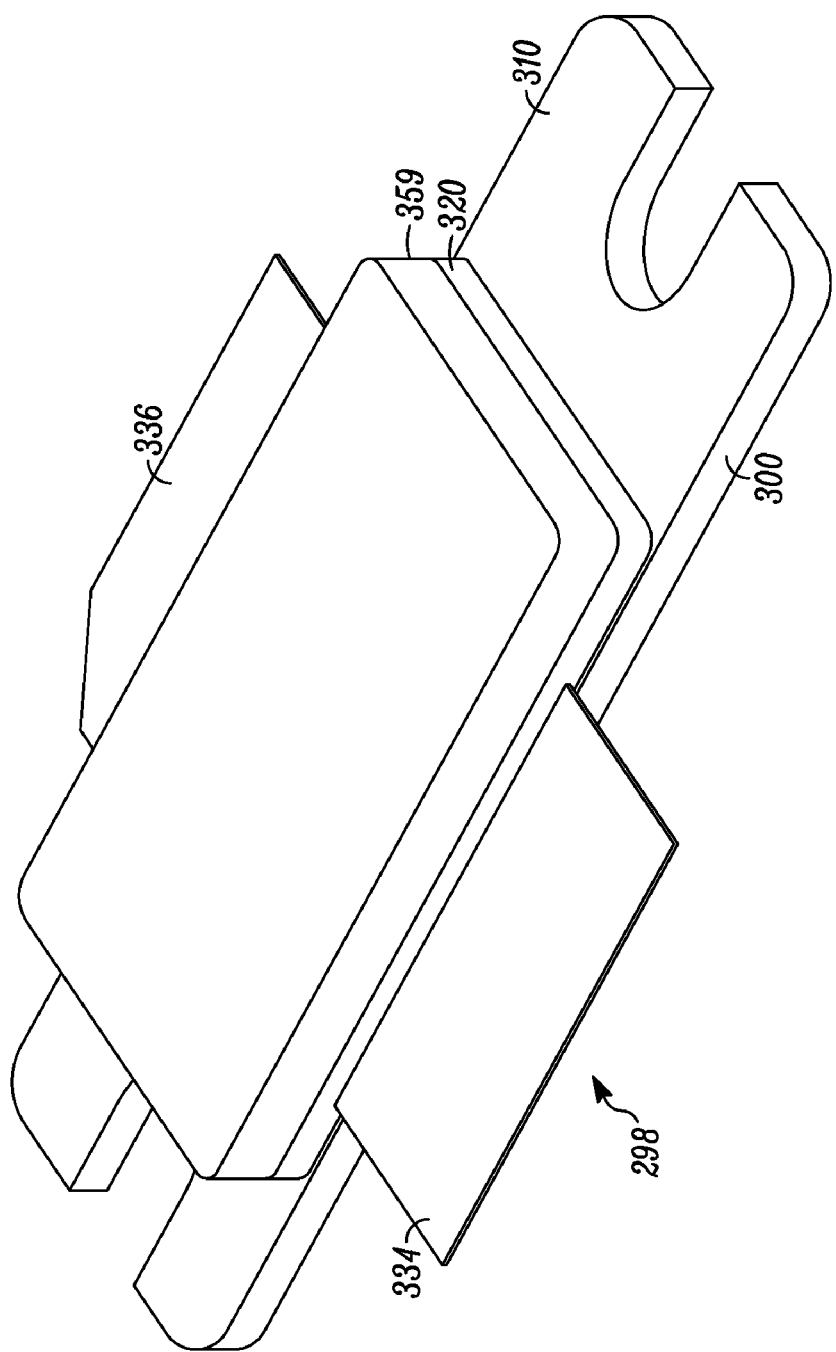
FIG. 33 is an isometric view of a semiconductor component singulated from the leadframe of FIG. 32.

Referring now to FIG. 33, individual packaged semiconductor components 298 are singulated from the leadframe assembly shown in FIG. 32 that included the plurality of non-singulated semiconductor components. Techniques for singulating semiconductor components from leadframes are known to those skilled in the art.

An advantage of using a flex interposer such as flex interposer 200 is that it can be made relatively small, and therefore, a relatively shallow slot 316 (FIG. 28) of for example, about 12.5 microns (about 0.5 mils) to about 125 microns (about 5 mils) may be used to accommodate flex interposer 200 compared to other implementations which may require a slot having a depth of, for example, about 300 microns (about 12 mils). Depending on the materials used for the flange, machining, rather than a stamping process, may be necessary in order to form relatively deep slots, for example, slots having depths of greater than about 250 microns (about 10 mils). For shallower slots, a stamping process may be used to form the shallower slots. Further, since flex interposer 200 may be made relatively small, the series inductance to the input terminals 104 of die 90 from the input leads (for example gate leads 334) may be reduced due to the relatively small lengths of conductive strips 212 of flex interposer 200 compared to other implementations which use a relatively longer conductive material to attach to the input terminals 104.

Further, other advantages of using a flex interposer are that the flexible dielectric materials to form flex interposer 200 may be relatively inexpensive and the use of a solder preform such as a gold-germanium preform 36 (FIG. 2) may be omitted in a component using a flex interposer 200. Solder performs may be relatively expensive and may use relatively high temperature processes to melt the preform during assembly processes.

In addition, as discussed above, flex interposer 200 may be attached to die 90 prior to attaching die 90 to flange 300. In these embodiments, only the source bumps 106 of die 90, and not the gate bumps 104, need to be aligned during the attachment to flange 300. Accordingly, this may be advantageous over embodiments that require the alignment of both the source bumps 106 and the gate bumps 104, wherein gate bumps 104 are aligned with the interposer at the same time the source bumps 106 are aligned on the flange. Such a dual alignment may add assembly complexity.

Figure 34:
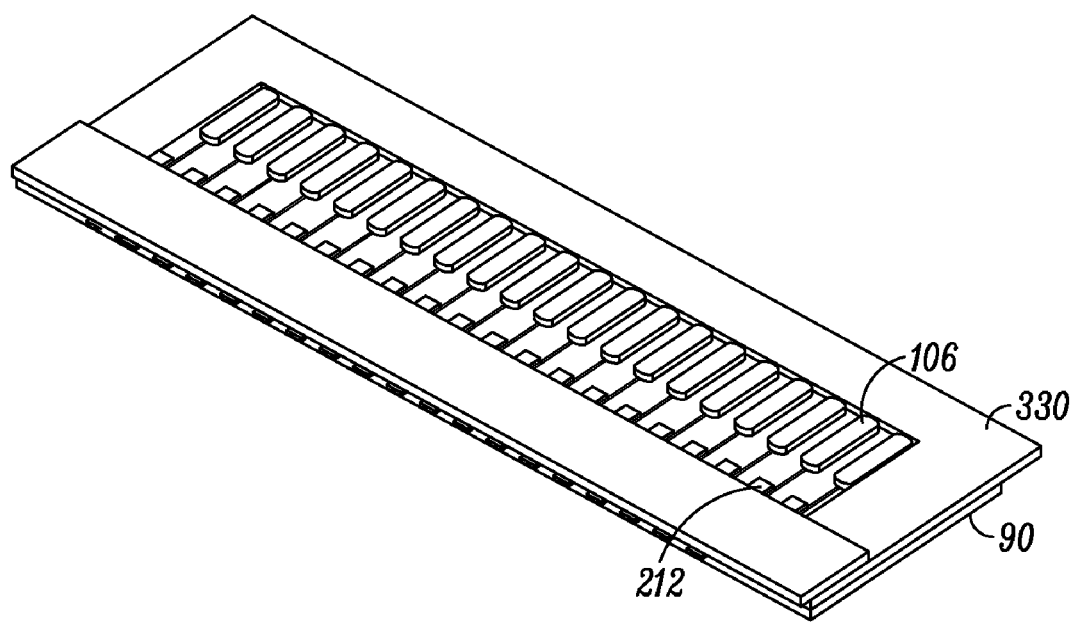
FIG. 34 is an isometric view of a flex interposer in accordance with another embodiment of the present invention.
Figure 35:
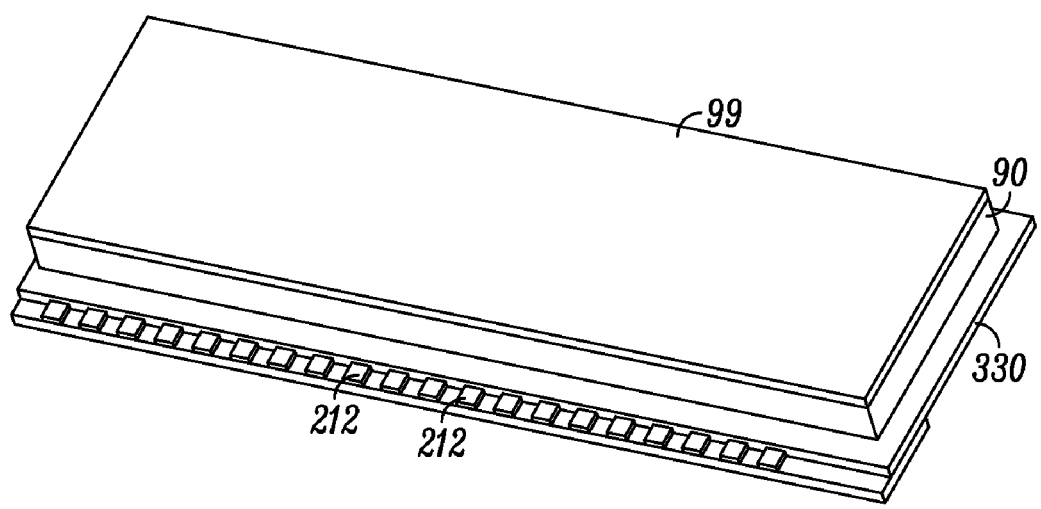
FIG. 35 is another isometric view of the flex interposer of FIG. 40.

FIG. 34 is an isometric view of a window frame flex interposer 330 attached to semiconductor die 90 in accordance with another embodiment of the present invention. Flex interposer 330 may comprise polyimide and have conductive strips 212, wherein portions of strips 212 are coupled to gate bumps 104 of die 90. In addition, flex interposer 330 surrounds bumps 106 of die 90 and may be useful in applications where underfill is not used. FIG. 35 is another isometric view of flex interposer 330 showing drain interconnect 99 of die 90.

Figure 36:
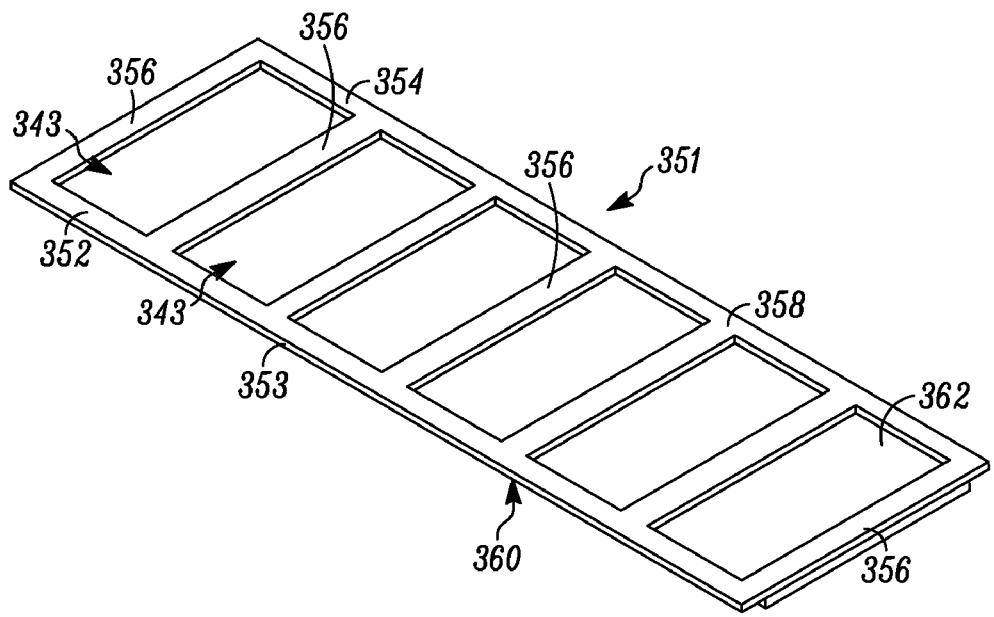
FIG. 36 is an isometric view of a leadframe interposer in accordance with another embodiment of the present invention.

FIG. 36 is an isometric view of a leadframe interposer 351 in accordance with another embodiment of the present invention. Leadframe interposer 351 comprises an electrically conductive structure 353 having openings 343, rail portions 352 and 354 connected by electrically conductive rail portions 356. Leadframe interposer 351 has a top side or surface 358 and a bottom surface or side 360. Suitable materials for leadframe interposer 351 include copper, gold, silver, tantalum, or tungsten. A layer of dielectric material 362 may be formed on bottom surface 360 and over openings 343. It should be noted that dielectric layer 362 is an optional layer. Dielectric layer 362 may comprise polyimide or ceramic. Leadframe interposer 351 may be referred to as a conductive structure, a leadframe structure, or a conductive leadframe structure.

Figure 37:
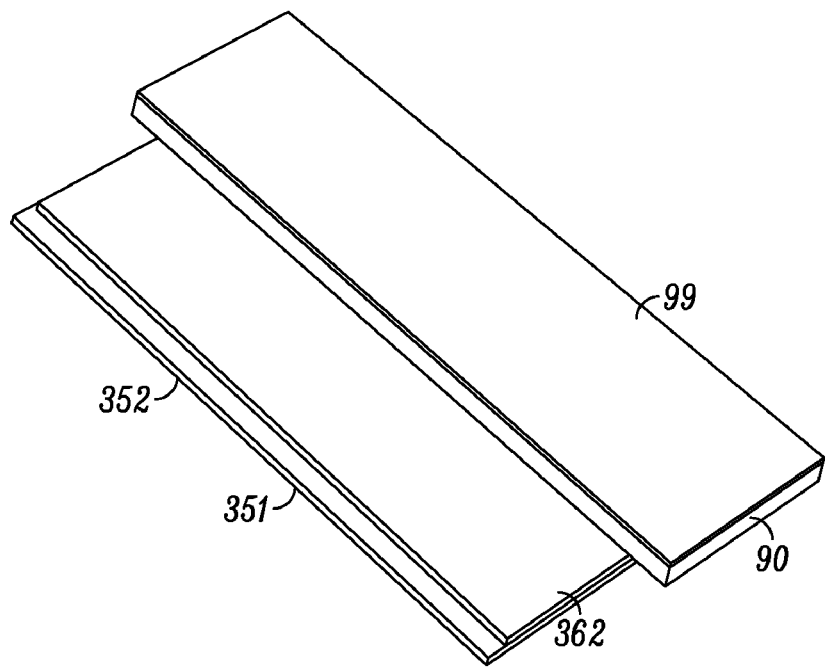
FIG. 37 is an isometric view of the leadframe interposer of FIG. 36 bonded to a semiconductor die in accordance with an embodiment of the present invention.

FIG. 37 is an isometric view of leadframe interposer 351 bonded to semiconductor die 90. More particularly, gate bumps 104 of die 90 are bonded to surface 360 of rail portion 354 (FIG. 36).

Figure 38:
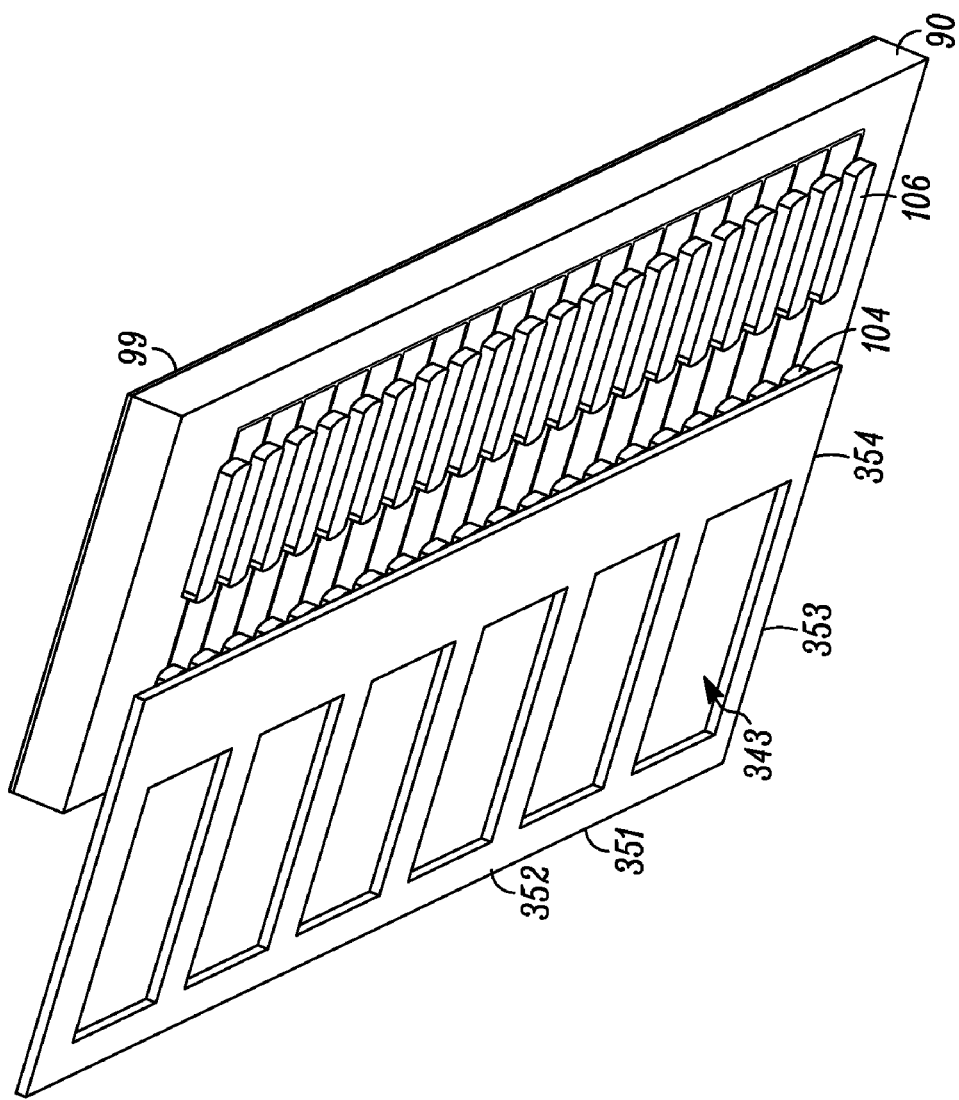
FIG. 38 is an isometric view of another leadframe interposer bonded to a semiconductor die in accordance with another embodiment of the present invention.

FIG. 38 is an isometric view of leadframe interposer 351 without dielectric layer 362. In this embodiment, gate bumps 104 of die 90 are bonded to rail portion 354 of leadframe interposer 351. As may be appreciated, it may be advantageous in some embodiments to attach the plurality of gate bumps 104 to a continuous conductive strip or rail portion such as rail portion 354, rather than to a plurality of conductive strips.

Figure 39:
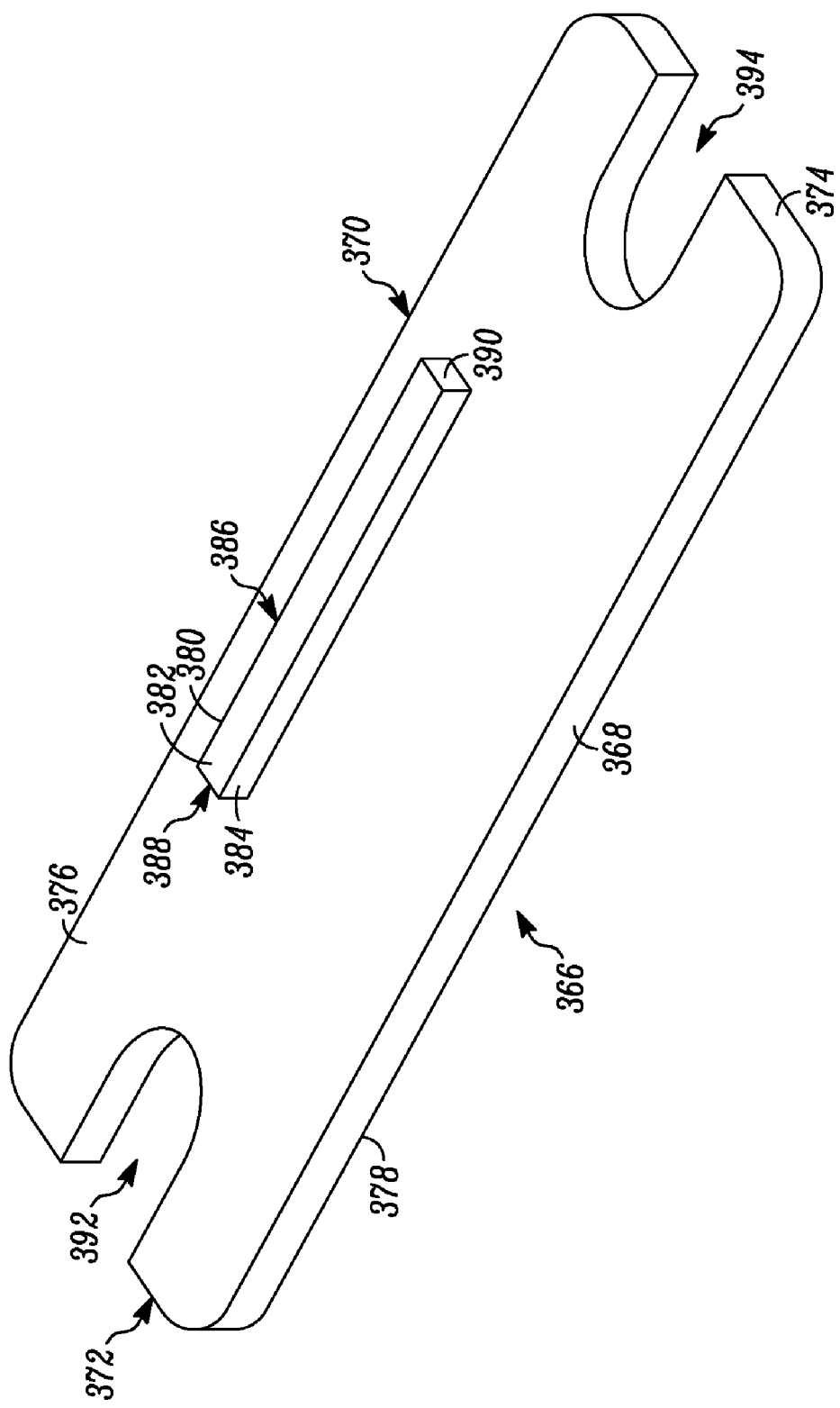
FIG. 39 is an isometric view of a flange in accordance with another embodiment of the present invention.

FIG. 39 is an isometric view of a flange 366 used in the manufacture of a semiconductor component 350 (FIG. 42) in accordance with another embodiment of the present invention. Flange 366 has opposing surfaces or sides 368 and 370 that are substantially parallel to each other, opposing sides 372 and 374 that are substantially parallel to each other, and opposing surfaces 376 and 378 that are substantially parallel to each other. Surface 376 may be referred to as a top surface and surface 378 may be referred to as a bottom surface. In some embodiments, flange 366 is made from a material having a CTE matching, or substantially matching, that of silicon or ceramic. Examples of suitable materials for flange 366 include copper, an alloy such as a copper alloy, or a copper-tungsten alloy. In addition, the material for flange 366 may include metal laminates such as, for example, a copper-molybdenum-copper laminate. The material for flange 366 is not a limitation of the present invention. Thus, flange 366 can be made from materials having CTE's that do not match those of silicon or ceramic.

A pedestal or platform 380 is formed from flange 366. Pedestal 380 has a top surface 382, sidewalls 384 and 386 that are substantially parallel to each other, and ends 388 and 390 that are substantially parallel to each other. Pedestal 380 is integral to flange 366 and extends from top surface 376 of flange 366 so that surface 382 of pedestal 380 is at a level above surface 376 of flange 366. Pedestal 380 may be formed by skiving flange 366 followed by stamping flange 366. Pedestal 380 may be referred to as a platform, a pedestal portion, a protrusion, a projection, a projection portion, or an extension portion.

Notches 392 and 394 extend inward from sides 372 and 374, respectively, into flange 366 and are typically used for securing semiconductor component 350 (FIG. 42) to another structure such as, for example, a printed circuit board (PCB) or heat sink, using, for example, a fastener means such as a screw or bolt. Notches 392 and 394 are optional, as other means may be used to secure flange 366 to other structures.

Figure 40:
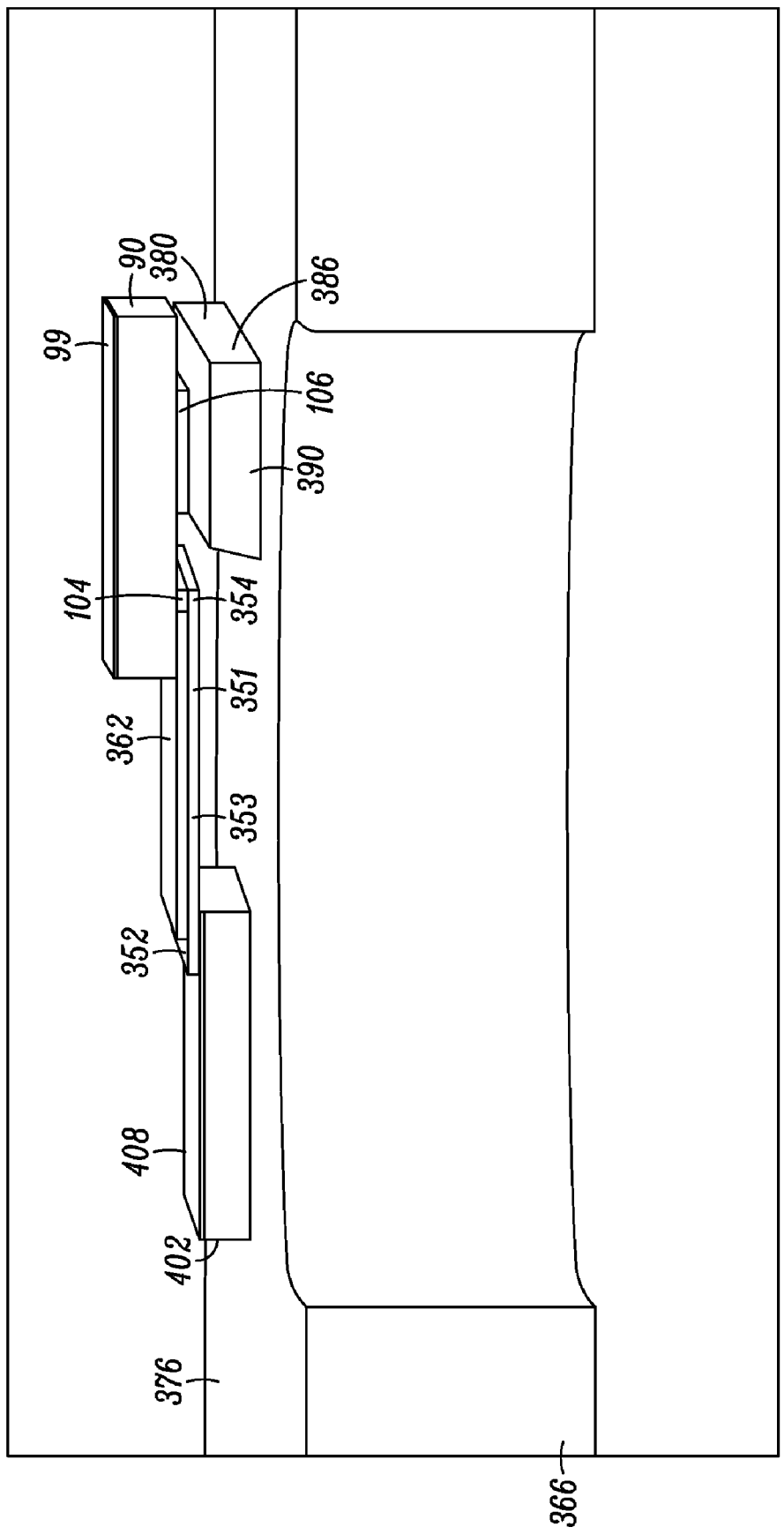
FIG. 40 is an isometric view of a subassembly that includes a leadframe interposer in accordance with an embodiment of the present invention.

FIG. 40 is an isometric view of a portion of a subassembly that includes flange 366, semiconductor die 90, leadframe interposer 351, and a discrete metal oxide semiconductor capacitor (MOSCAP) 402 in accordance with an embodiment of the present invention. MOSCAP 402 has a lead or contact 408 on a top surface of MOSCAP 402.

The subassembly shown in FIG. 37 is attached to flange 366. In particular, source bumps 106 of die 90 are bonded to top surface 382 of pedestal 380, and rail portion 352 of leadframe interposer 351 is attached to contact 408 of MOSCAP 402.

Figure 41:
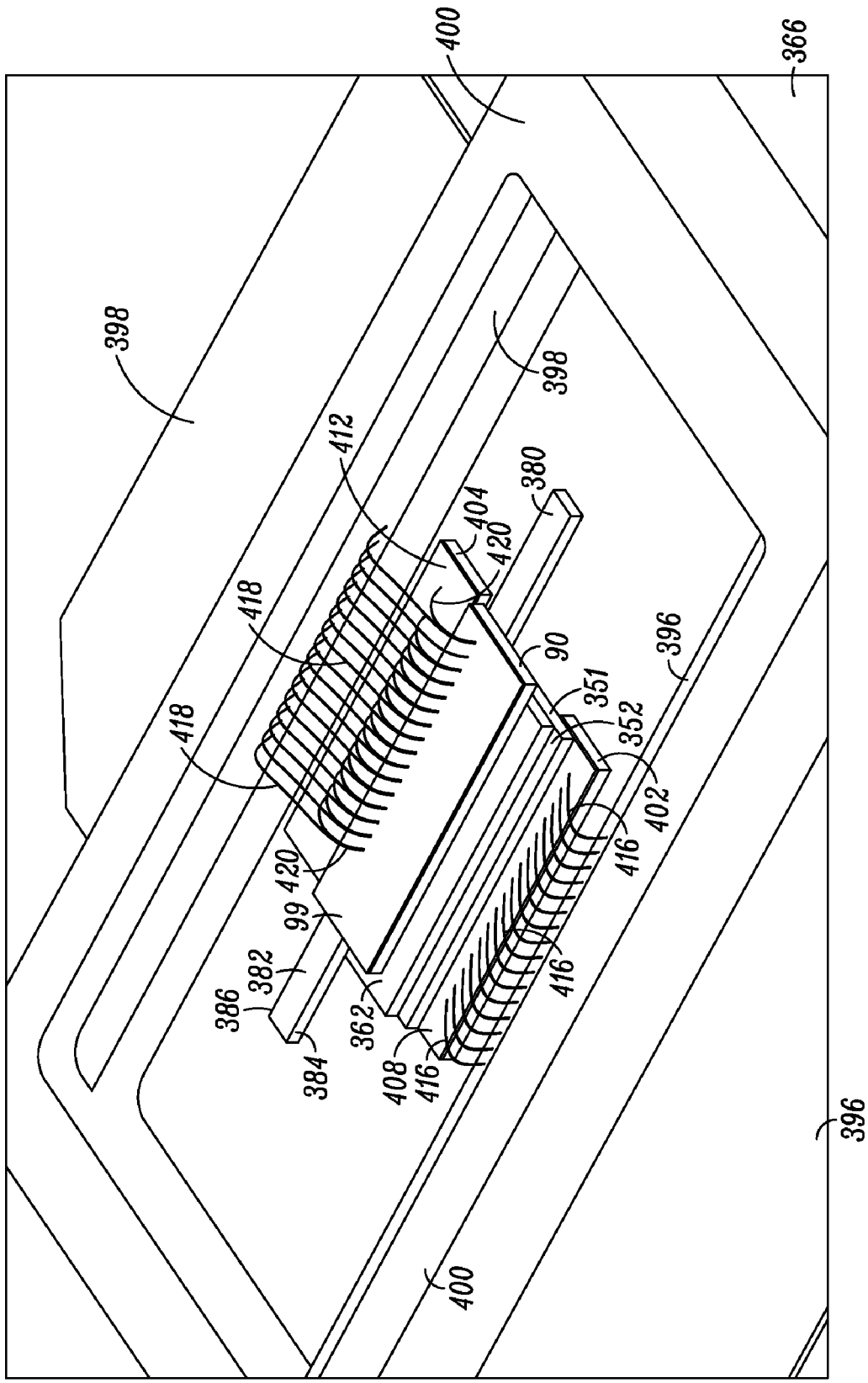
FIG. 41 is an isometric view of a semiconductor component having the flange of FIG. 39 in accordance with another embodiment of the present invention.

FIG. 41 is an isometric view of semiconductor component 350 at a later stage of assembly. Prior to attaching the subassembly shown in FIG. 40 to dielectric ring 400, dielectric ring 400 is formed, for example, by an injection molding process to couple dielectric ring 400 to leads 396 and 398. Examples of suitable materials for the dielectric ring 400 include ceramic, polyimide, or glass. In some embodiments, similar to the formation of leads 334 and 336 and dielectric rings 320 shown in FIG. 30, leads 396 and 398 may be part of a leadframe (not shown), and rings of dielectric material 400 may be formed on the leadframe that includes leads 396 and 398 using an injection molding process.

Although not shown, the subassembly shown in FIG. 40 may also include a MOSCAP 404 attached to the top surface 376 of flange 366. MOSCAP 404 has a contact 412 on the top surface of MOSCAP 404. MOSCAPs 402 and 404 may have electrical contacts (not shown) on the bottom surfaces of MOSCAPs 402 and 404, and these contacts may be electrically bonded to the top surface 376 of flange 366.

After forming dielectric ring 400, the subassembly shown in FIG. 40 that includes flange 366, leadframe interposer 351, semiconductor die 90, and MOSCAP 402 may be attached to dielectric ring 400 using an epoxy. Heat may be applied to the subassembly shown in FIG. 41 to cure the epoxy. Dielectric ring 400 electrically isolates gate lead 396, drain lead 398, and flange 366 from each other.

Contact 408 of MOSCAP 402 is wirebonded to gate lead 396 of semiconductor component 350 using a plurality of wirebonds 416. Contact 412 of MOSCAP 404 is wirebonded to drain terminal 99 of semiconductor die 90 by a plurality of wirebonds 420. Drain terminal 99 is wirebonded to drain lead 398 by a plurality of wirebonds 418. Although drain terminal 99 is shown as being coupled to drain lead 398 using wirebonds 418, the methods and apparatuses described herein are not limited in this regard. In other embodiments, a conductive structure such as, for example, conductive structure 351 (FIG. 36) may be used to couple drain terminal 99 to drain lead 398. Using conductive structure 351 to couple drain terminal 99 to drain lead 398 may increase the current handling capability of semiconductor component 350.

Figure 42:
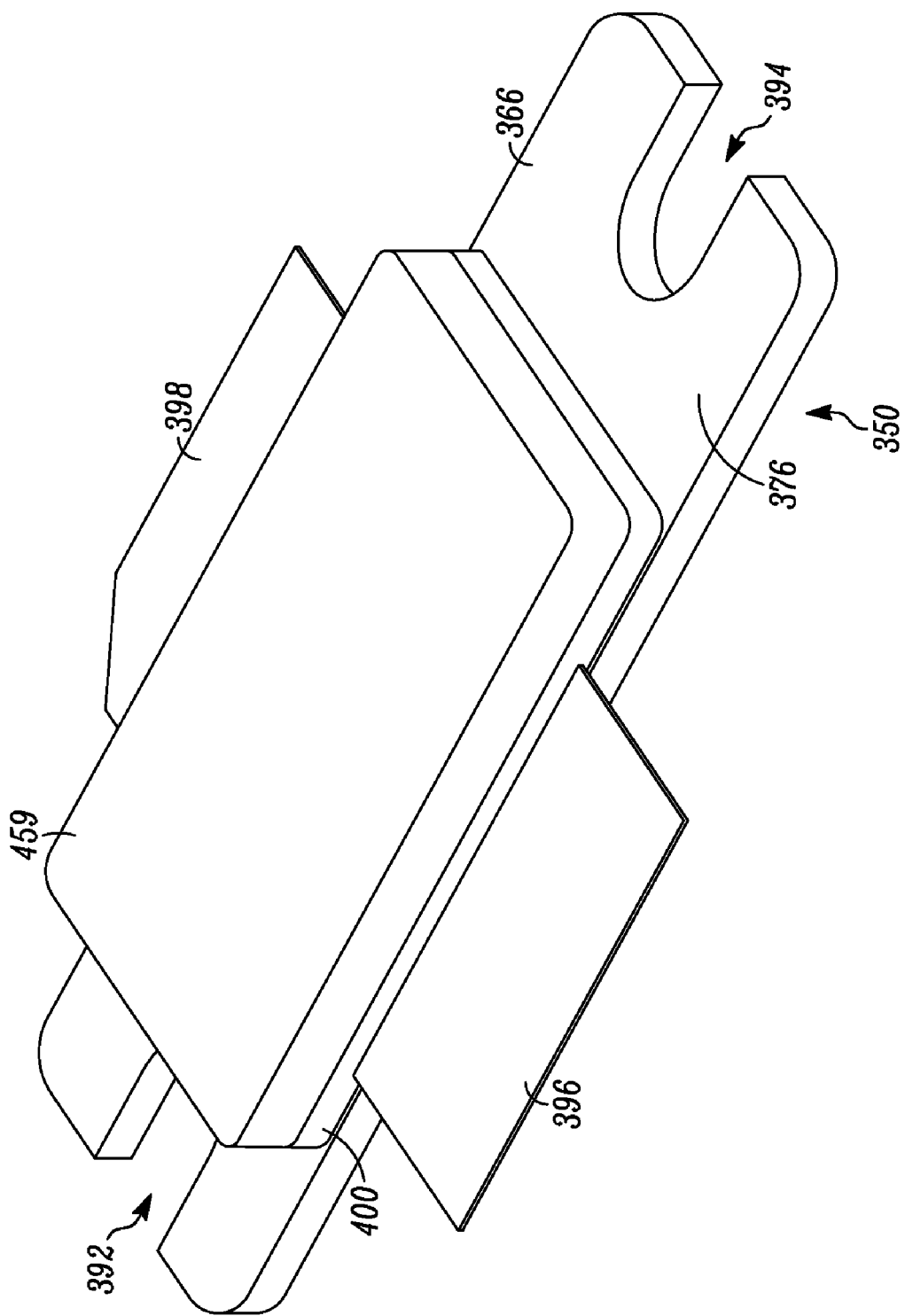
FIG. 42 is an isometric view of the semiconductor component of FIG. 41 further along in manufacture.

MOSCAP 402, wirebonds 416, and interposer 351 may be used to provide an input matching network to the circuitry of die 90, as these elements have passive element characteristics. For example, interposer 351 may be the inductor of the first stage of an input low pass matching network. MOSCAP 404 and wirebonds 418 and 420 may be used to provide an output matching network to the circuitry of die 90, as these elements have passive element characteristics. MOSCAPs 402 and 404 are optional, depending on whether or not input and output impedance matching elements are included in semiconductor component 350 (FIG. 42). As is discussed above, dielectric material 362 of leadframe connector 351 is optional.

FIG. 42 is an isometric view of semiconductor component 350 at a later stage of assembly. A lid 459 comprising a dielectric material such as, for example, ceramic or plastic, is attached to dielectric ring 400 using for example, an epoxy, thereby completing the assembly of semiconductor component 350.

In the embodiments wherein semiconductor die comprises a plurality of transistors coupled to each other to function as a discrete power transistor, semiconductor component 350 may be referred to as a discrete semiconductor device having a gate lead 396, a drain lead 398, and a source lead 366.

A portion of gate lead 396 is partially exposed external to semiconductor component 350 to provide electrical coupling of an external bias signal such as, for example, a voltage ranging from about one volt to about four volts, from an external source (not shown) to gate bond pads 100 (FIG. 7) of semiconductor die 90 via gate lead 396, wirebonds 416 (FIG. 41), MOSCAP 402 (FIG. 41), conductive structure 353 of leadframe interposer 351, and gate bumps 104 (FIG. 11). A portion of drain lead 398 is partially exposed external to semiconductor component 350 to provide electrical coupling of an external bias signal such as, for example, a voltage ranging from about 20 volts to about 100 volts, from an external source (not shown) to drain interconnect 99 (FIG. 41) of semiconductor die 90 via drain lead 398 and wirebonds 418 (FIG. 41). Flange 366 serves as a source lead and is partially exposed external to semiconductor component 350 to provide electrical coupling of an external bias signal such as, for example, ground, to source bond pads 102 (FIG. 7) of semiconductor die 90 via pedestal 380 of flange 366 and source bumps 106 (FIG. 11). Flange 366 is also partially exposed to allow coupling of flange 366 to a thermally conductive material having a relatively low thermal resistance such as, for example, a metal heat sink (not shown) to provide a thermal path for removing heat generated by semiconductor die 90.

Although the formation of a single semiconductor component 350 has been described, it should be understood that a leadframe may be used to form a plurality of non-singulated semiconductor components 350 similar to the leadframes 110 (FIG. 15) and 311 (FIG. 30) used to form semiconductor components 10 (FIG. 18) and 298 (FIG. 33), respectively.

Although semiconductor die 90 (FIG. 11) has been described as a power transistor in some embodiments, this is not a limitation of the present invention. In alternate embodiments, semiconductor die 90 may comprise a small-signal transistor. A small-signal transistor typically controls relatively small electrical currents such as, for example, less than about 100 mA of electrical current, and dissipate less than about one watt of power.

Figure 43:
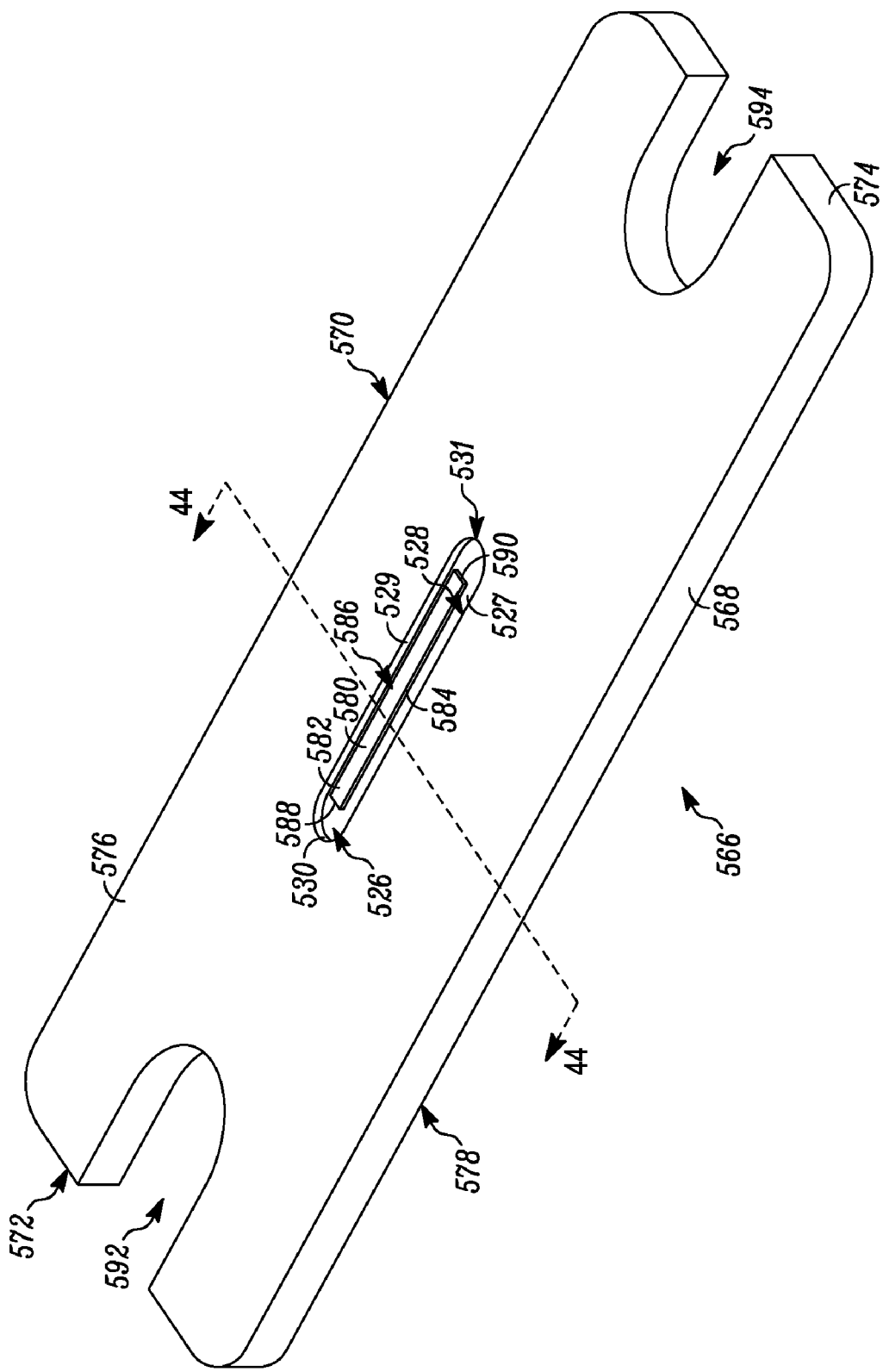
FIG. 43 is an isometric view of a flange in accordance with another embodiment of the present invention.

FIG. 43 is an isometric view of a flange 566 used in the manufacture of a semiconductor component 650 (FIG. 49) in accordance with another embodiment of the present invention. Flange 566 has opposing surfaces or sides 568 and 570 that are substantially parallel to each other, opposing sides 572 and 574 that are substantially parallel to each other, and opposing surfaces 576 and 578 that are substantially parallel to each other. Surface 576 may be referred to as a top surface of flange 566 and surface 578 may be referred to as a bottom surface of flange 566. In some embodiments, flange 566 is made from a material having a CTE matching, or substantially matching, that of silicon or ceramic. Examples of suitable materials for flange 566 include copper, an alloy such as a copper alloy, or a copper-tungsten alloy. In addition, the material for flange 566 may include metal laminates such as, for example, a copper-molybdenum-copper laminate. The material for flange 566 is not a limitation of the present invention. Thus, flange 566 can be made from materials having CTE's that do not match those of silicon or ceramic.

A slot, groove, or cavity 526 having a floor 527, sidewalls 528 and 529, and ends 530 and 531 is formed in flange 566. As may be appreciated, sidewalls 528 and 529 and ends 530 and 531 may be referred to as a single sidewall or surface. Floor 527 is a surface of flange 566 and cavity 526 extends inward from top surface 576 toward surface 527. In other words, cavity 526 extends from top surface 576 into flange 566. Surface 527 is parallel to, or substantially parallel to, surfaces 576 and 578. Surface 527 is a lower boundary of cavity 526.

Slot 526 may be formed by milling, etching, grinding, or stamping. Slot 526 may have a rectangular shape, a quadrilateral shape, or other polygonal shape. In addition, slot 526 may have an oval shape. The shape of slot 526 is not a limitation of the present invention; however, in some embodiments, it is desirable that slot 526 have at least one sidewall that is substantially straight.

A pedestal 580 is formed from flange 566. Pedestal 580 has a top surface 582, sidewalls 584 and 586 that are substantially parallel to each other, and ends 588 and 590 that are substantially parallel to each other.

Figure 44:
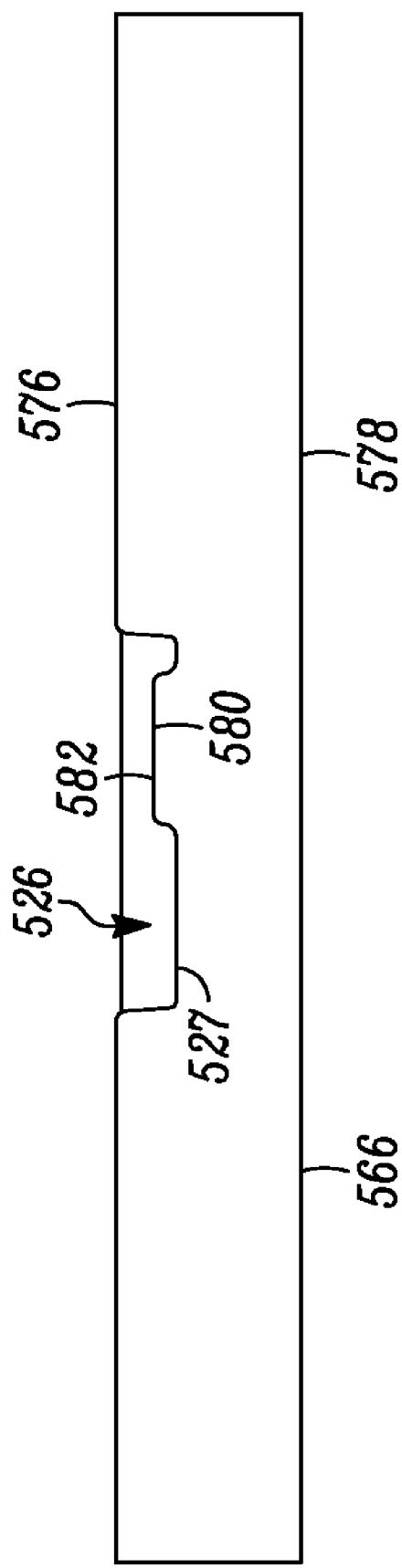
FIG. 44 is a cross-sectional side view of the flange of FIG. 43 taken along section line 44-44 of FIG. 43.

Turning briefly to FIG. 44, FIG. 44 is a cross-sectional side view of flange 566 of FIG. 43 taken along section line 44-44 of FIG. 43. Pedestal 580 is in cavity 526 and extends upward from surface 527 of flange 566. In other words, pedestal 580 extends upward from a lower portion of cavity 526. Pedestal 580 extends from surface 527 to a height this is below top surface 576 of flange 566. Surface 527 is parallel to, or substantially parallel to, surfaces 576 and 578 of flange 566. In addition, surface 527 is noncoplanar to surfaces 576 and 578 of flange 566.

Pedestal 580 may be formed by skiving flange 566 followed by stamping flange 566. Pedestal 580 is integral to flange 566 and may be referred to as a platform, a pedestal portion, a protrusion, a projection, a projection portion, or an extension portion.

Referring back to FIG. 43, notches 592 and 594 extend inward from sides 572 and 574, respectively, into flange 566 and are typically used for securing semiconductor component 650 (FIG. 49) to another structure such as, for example, a printed circuit board (PCB) or heat sink, using, for example, a fastener means such as a screw or bolt. Notches 592 and 594 are optional, as other means may be used to secure flange 566 to other structures.

Figure 45:
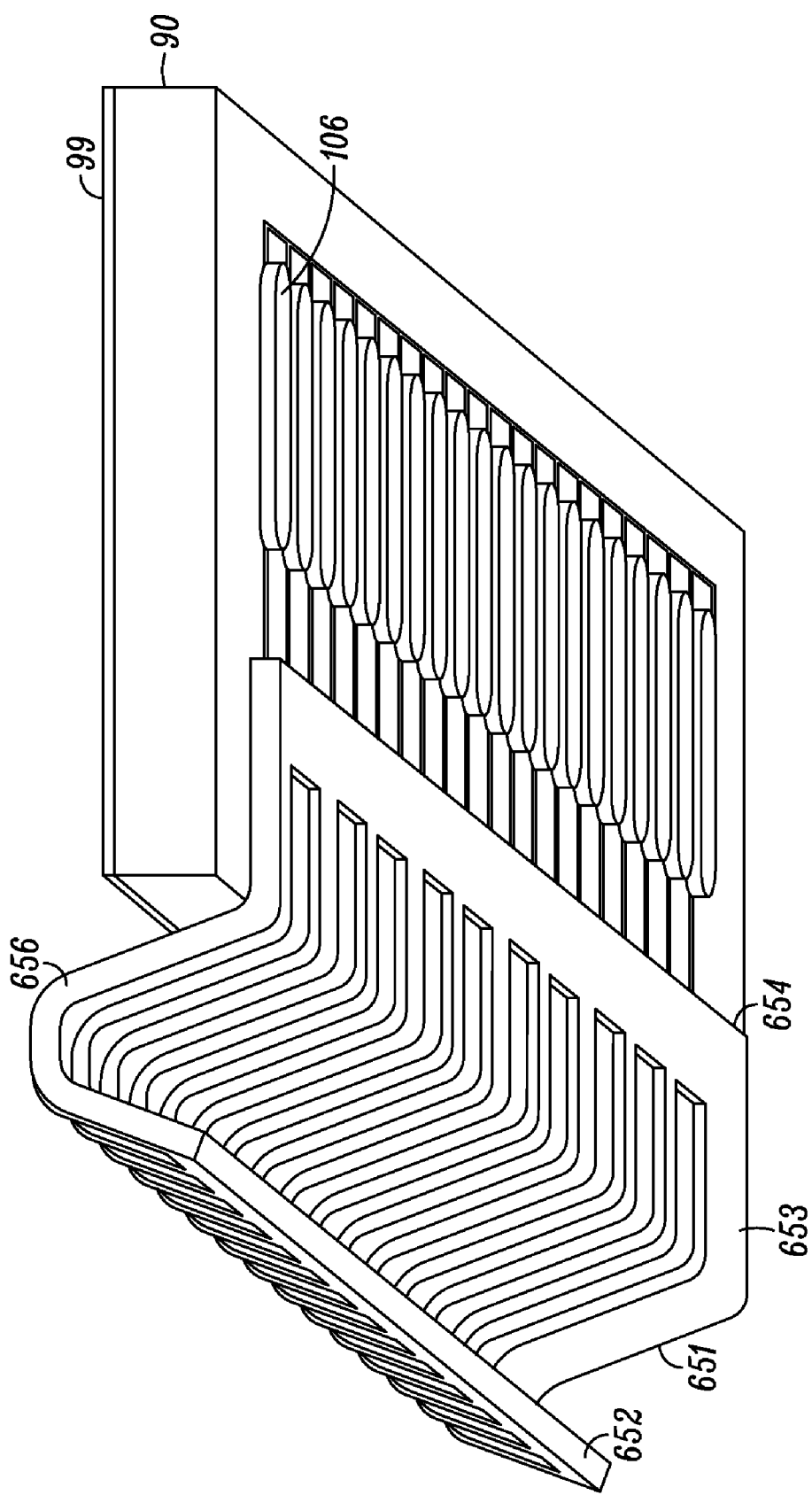
FIG. 45 is an isometric view of a leadframe interposer bonded to a semiconductor die in accordance with an embodiment of the present invention.
Figure 46:
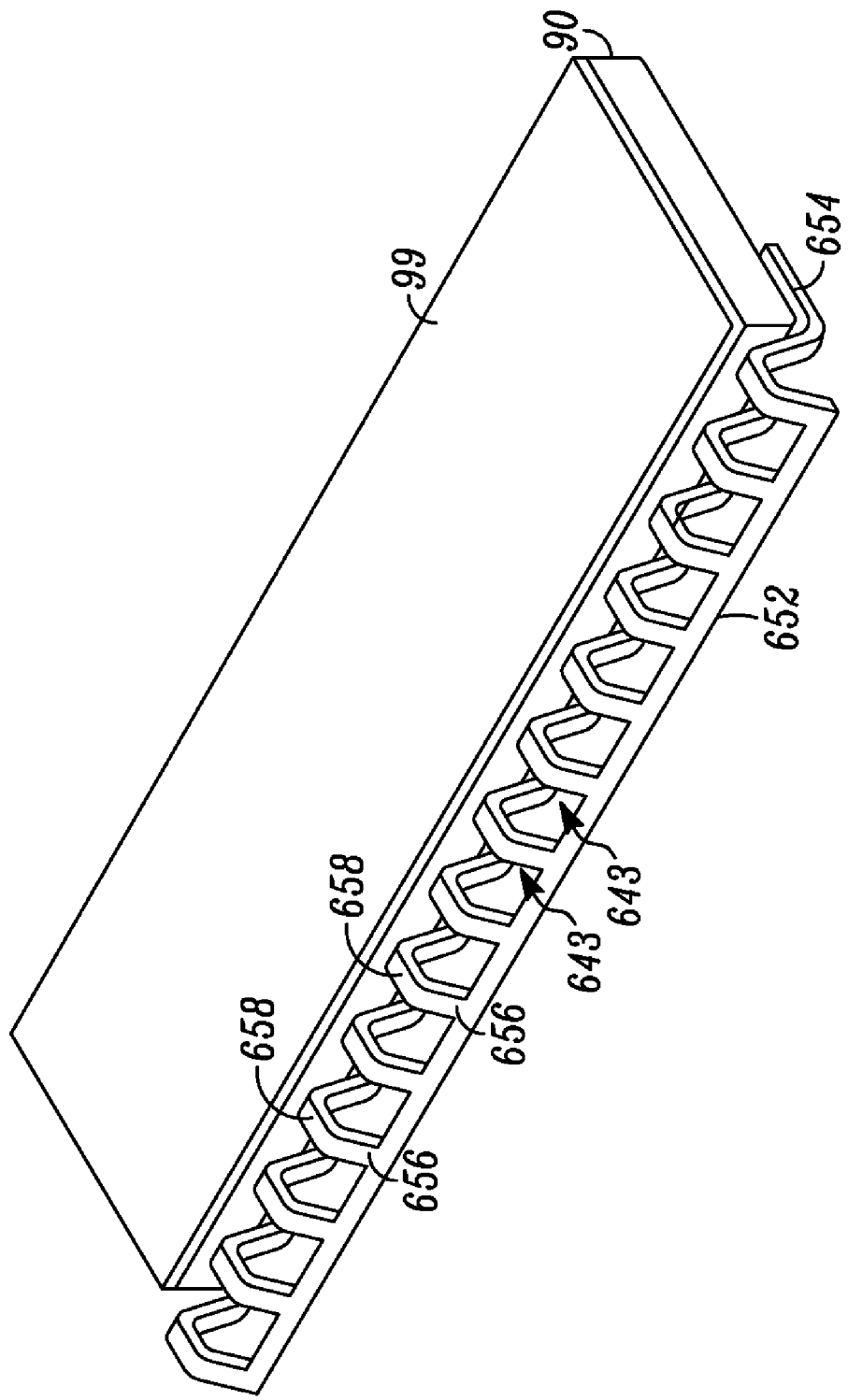
FIG. 46 is another isometric view of the subassembly of FIG. 45.

FIGS. 45 and 46 are isometric views of a leadframe interposer 651 bonded to semiconductor die 90. Leadframe interposer 651 comprises an electrically conductive structure 653 having openings 643, rail portions 652 and 654 connected by electrically conductive rail portions 656. Conductive rail portions 656 may be curved, bent, or raised and may have bonding pad portions 658 that may be used to couple leadframe interposer 651 to other structures. For example, bonding pad portions 658 may be used for attaching electrical interconnects such as bond wires to portions 658 of leadframe structure 651. Suitable materials for leadframe interposer 651 include copper, gold, silver, tantalum, or tungsten. Leadframe interposer 651 may also be referred to as a conductive leadframe structure.

Gate bumps 104 of die 90 are attached or bonded to rail portion 654 of leadframe interposer 651. As may be appreciated, it may be advantageous in some embodiments to attach the plurality of gate bumps 104 to a continuous conductive strip or rail portion such as rail portion 654, rather than to a plurality of conductive strips. Although not shown, in some embodiments, leadframe interposer 651 may be part of a larger structure having a plurality of leadframe interposers formed from a single electrically conductive material. In these embodiments, multiple semiconductor die 90 could be attached or bonded to the larger structure, and then this larger structure may be singulated or cut to form multiple subassemblies such as the subassembly shown in FIGS. 45 and 46 that comprises a leadframe interposer 651 bonded to a semiconductor die 90.

Figure 47:
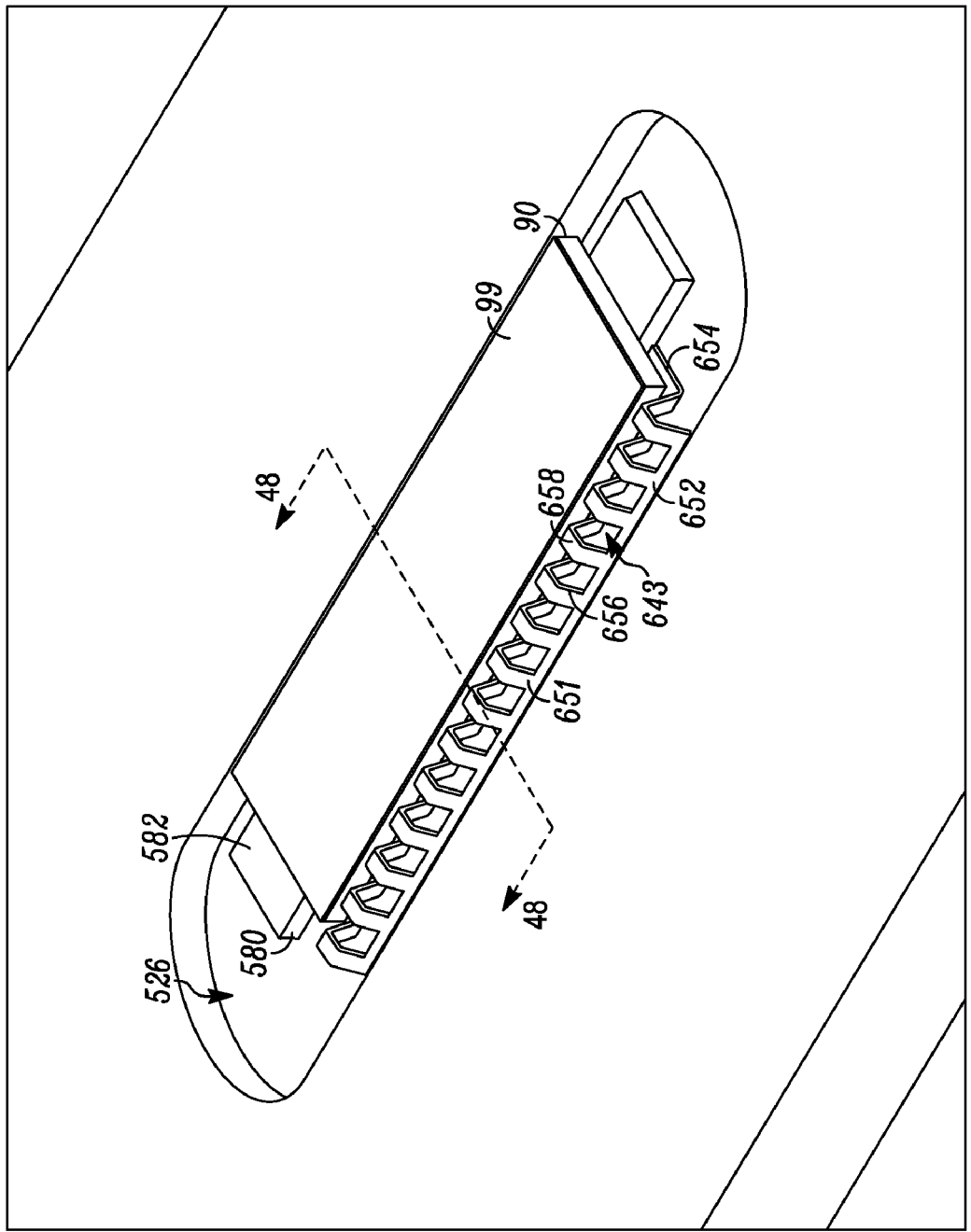
FIG. 47 is an isometric view of a portion of a subassembly that includes a flange, a semiconductor die, and a leadframe interposer in accordance with an embodiment of the present invention.

FIG. 47 is an isometric view of a portion of a subassembly that includes flange 566, semiconductor die 90, and leadframe interposer 651 in accordance with an embodiment of the present invention. The subassembly of FIG. 45 is attached to flange 566. In particular, source bumps 106 of die 90 are bonded to top surface 582 of pedestal 580 after rail portion 654 of leadframe interposer 651 is attached to gate bumps 104 of die 90.

Figure 48:
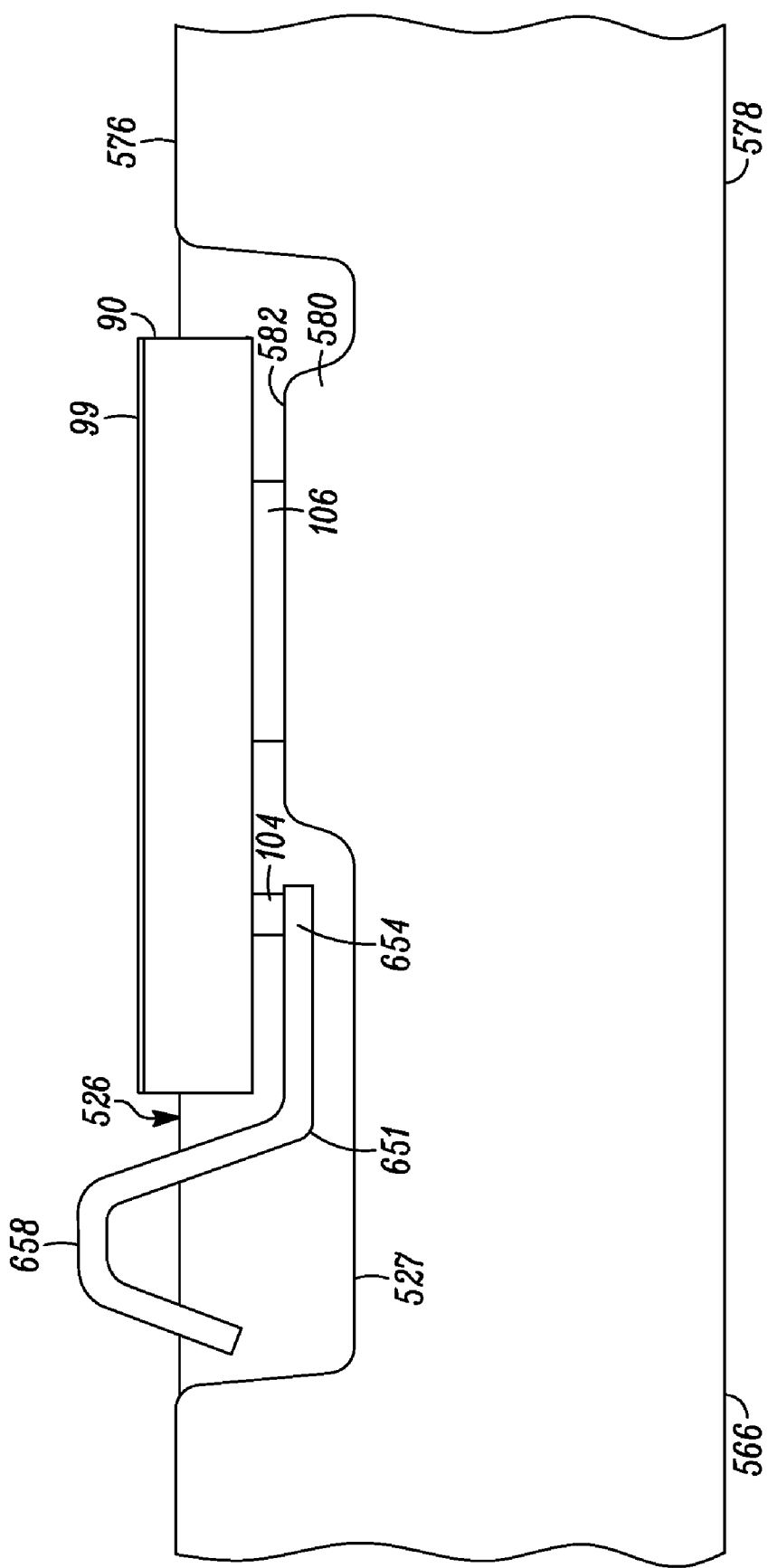
FIG. 48 is a cross-sectional side view of the subassembly of FIG. 47 taken along section line 48-48 of FIG. 47.

FIG. 48 is a cross-sectional side view of the subassembly of FIG. 47 taken along section line 48-48 of FIG. 47. In some embodiments, after the bonding of leadframe interposer 651 to gate bumps 104, gate bumps 106 of die 90 may be bonded to surface 582 of pedestal 580 using eutectic bonding. For example, a die bonder (not shown) may be used to pick up die 90 which has leadframe interposer 651 attached and place die 90 in contact with pedestal 580 of flange 566 so that source bumps 106 contact surface 582 of flange 566. Then, heat and pressure may be applied to form the eutectic bond at the points where source bumps 106 of die 90 contact surface 582 of pedestal 580.

As is shown in FIG. 48, leadframe interposer 651 is spaced apart from flange 566 and electrically isolated from flange 566. Electrical isolation of leadframe interposer 651 from flange 566 may be achieved in part by the shape of leadframe interposer 651 and in part by pedestal 580 which may be used to cause spacing between leadframe structure 651 and surface 527 of flange 566.

In some embodiments, the depth of cavity 526 of flange 566 is greater than a thickness of semiconductor die 90. Further, a portion of die 90 is in cavity 526 and a portion of die 90 extends outside of cavity 526 and above surface 576. Similarly, a portion of leadframe interposer 651 is in cavity 526 and a portion of leadframe interposer 651 is outside of cavity 526 extending to a height that is higher than surface 576. For example, portion 654 of leadframe interposer 651 is in cavity 526 and portions 658 of leadframe interposer 651 are outside of cavity 526.

Figure 49:
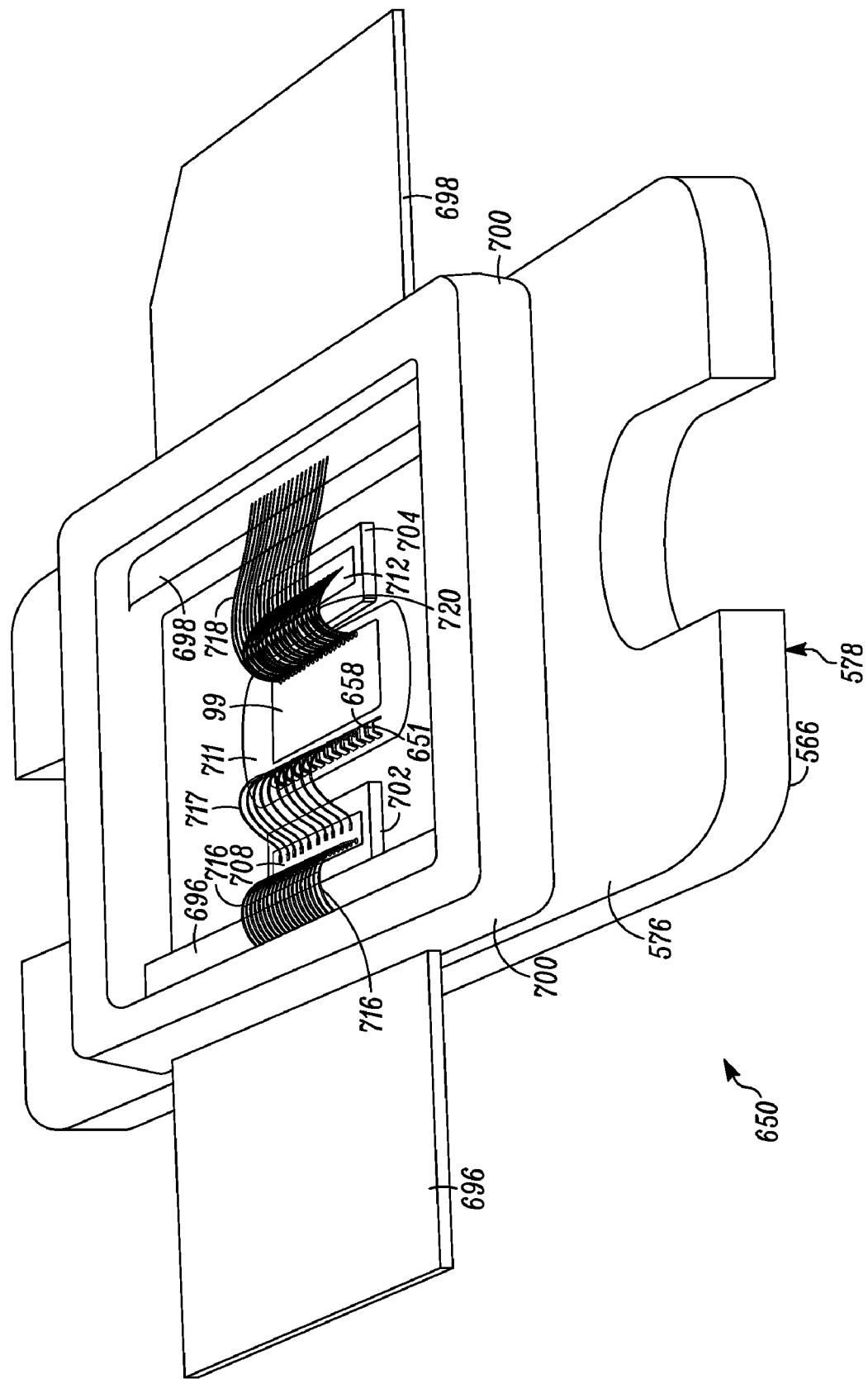
FIG. 49 is an isometric view of the semiconductor component of FIG. 48 further along in manufacture.

FIG. 49 is an isometric view of semiconductor component 650 at a later stage of assembly. Prior to attaching the subassembly shown in FIG. 47 to dielectric ring 700, dielectric ring 700 is formed, for example, by an injection molding process to couple dielectric ring 700 to leads 696 and 698. Examples of suitable materials for the dielectric ring 700 include ceramic, polyimide, or glass. In some embodiments, similar to the formation of leads 334 and 336 and dielectric rings 320 shown in FIG. 30, leads 696 and 698 may be part of a leadframe (not shown), and rings of dielectric material 700 may be formed on the leadframe that includes leads 696 and 698 using an injection molding process.

Prior to attaching the subassembly shown in FIG. 47 to dielectric ring 700, a dielectric material 711 may be formed in cavity 526 (FIG. 47). In some embodiments, dielectric material 711 may comprise a plastic or polymer material, and may be a glob top material or a mold compound. Dielectric material 711 may be viscous when it is deposited in cavity 526 and heat may subsequently be applied to the subassembly to cure dielectric material 711. Dielectric material 711 is formed in cavity 526 (FIG. 47) to surround portions of semiconductor die 90 and portions of leadframe structure 651, wherein drain terminal 99 of semiconductor die 90 is exposed after the forming of dielectric material 711 in cavity 526 and a portion of leadframe structure 651 is exposed after the forming of dielectric material 711 in cavity 526.

Dielectric material 711 holds leadframe structure 651 in place during wirebonding. In addition, dielectric material 711 creates a relatively solid physical structure which may reduce stresses in die 90 during temperature cycling of component 650. In addition, including dielectric material 711 in the spaces between flange 566, die 90, and leadframe interposer 651 may further increase the standoff voltage between the drain (e.g., edges of die 90) and the source (e.g., flange 566) and the drain (e.g., edges of die 90) and the gate (e.g., leadframe interposer 651), since the dielectric strength of dielectric material 711 is greater than the dielectric strength of air. Therefore, relatively higher breakdown voltages may be supported in semiconductor component 650.

Although not shown, the subassembly shown in FIG. 47 may also include MOSCAPs 702 and 704 attached to the top surface 576 of flange 566. MOSCAP 702 has a contact 708 on the top surface of MOSCAP 702 and MOSCAP 704 has a contact 712 on the top surface of MOSCAP 704. MOSCAPs 702 and 704 may have electrical contacts (not shown) on the bottom surfaces of MOSCAPs 702 and 704, and these contacts may be electrically bonded to the top surface 576 of flange 566.

After forming dielectric ring 700, the subassembly shown in FIG. 47 that includes flange 566, leadframe interposer 651, semiconductor die 90, and optionally MOSCAPs 702 and 704 may be attached to dielectric ring 700 using an epoxy. Heat may be applied to the subassembly shown in FIG. 49 to cure the epoxy. Dielectric ring 700 electrically isolates lead 696, lead 698, and flange 566 from each other.

As discussed above, in some embodiments, semiconductor die 90 is a discrete transistor and lead 696 is a gate lead electrically coupled to gate bumps 104 of die 90, lead 698 is a drain lead electrically coupled to drain terminal 99 of die 90, and flange 566 is a source contact electrically coupled to source bumps 106 of die 90. Lead 696 has a top surface that is coplanar to, or substantially coplanar to, a top surface of lead 698 and is noncoplanar to top surface 576 of flange 566 and bottom surface 578 of flange 566. In addition, lead 696 has a bottom surface that is coplanar to, or substantially coplanar to, a bottom surface of lead 698 and is noncoplanar to top surface 576 of flange 566 and bottom surface 578 of flange 566.

Contact 708 of MOSCAP 702 is wirebonded to gate lead 696 of semiconductor component 650 using a plurality of wirebonds 716. In addition, contact 708 of MOSCAP 702 is wirebonded to exposed portions 658 of leadframe structure 651 using a plurality of wirebonds 717. Contact 712 of MOSCAP 704 is wirebonded to drain terminal 99 of semiconductor die 90 by a plurality of wirebonds 720. Drain terminal 99 is wirebonded to drain lead 698 by a plurality of wirebonds 718. Although drain terminal 99 is shown as being coupled to drain lead 698 using wirebonds 718, the methods and apparatuses described herein are not limited in this regard. In other embodiments, a conductive structure such as, for example, conductive structure 351 (FIG. 36) may be used to couple drain terminal 99 to drain lead 698. Using conductive structure 351 to couple drain terminal 99 to drain lead 698 may increase the current handling capability of semiconductor component 650.

MOSCAP 702, wirebonds 716 and 717, and interposer 651 may be used to provide an input matching network to the circuitry of die 90, as these elements have passive element characteristics. For example, interposer 651 may be an inductor of the first stage of an input low pass matching network. MOSCAP 704 and wirebonds 718 and 720 may be used to provide an output matching network to the circuitry of die 90, as these elements have passive element characteristics. MOS-CAPs 702 and 704 are optional, depending on whether or not input and output impedance matching elements are included in semiconductor component 650.

As may be appreciated, including openings 643 in leadframe interposer 651 may reduce gate-to-drain parasitic capacitance that may result between the edge of die 90 and leadframe interposer 651.

Although not shown, a lid such as lid 459 (FIG. 42) comprising a dielectric material such as, for example, ceramic or plastic, may be attached to dielectric ring 700 using for example, an epoxy, thereby completing the assembly of semiconductor component 650.

Although semiconductor components 10 (FIG. 18), 198 (FIG. 26), 298 (FIG. 33), 350 (FIG. 42), and 650 (FIG. 49) and semiconductor die 90 (FIG. 11) are described as a discrete devices in some embodiments, this is not a limitation of the present invention. In alternate embodiments, semiconductor die 90 may be an integrated circuit (IC) rather than a discrete device. For example, semiconductor die 90 may be an integrated circuit having high density digital logic and a power device such as, for example, a power transistor, integrated together on the same die. In the example wherein semiconductor die 90 is an IC, semiconductor components 10 (FIG. 18), 198 (FIG. 26), 298 (FIG. 33), 350 (FIG. 42), 650 (FIG. 49) comprising IC die 90 may be referred to as an integrated circuit or integrated component and may have more than three leads.

Accordingly, the packages described above may provide cost, electrical, and thermal performance advantages, such as providing a relatively low thermal resistance path to remove heat generated by semiconductor die 90. Further, electrical performance may be improved by not using wire bonds in some embodiments. Not using wire bonds may reduce parasitic inductance. In the embodiment wherein components use a plastic packaging material or mold compound to encapsulate die 90, this may be relatively cheaper compared to using a ceramic material to encapsulate die 90. Further some of the package configurations described above may allow for relatively high breakdown voltages. In addition, some of the package configurations described above may provide a relatively low interelectrode parasitic capacitance between the gate and drain, thereby increasing the operating frequency of the semiconductor component.

Although specific embodiments have been disclosed herein, it is not intended that the invention be limited to the disclosed embodiments. Those skilled in the art will recognize that modifications and variations can be made without departing from the spirit of the invention. It is intended that the invention encompass all such modifications and variations as fall within the scope of the appended claims.

What is claimed is:

1. A semiconductor component, comprising:
a heat spreader having a first surface and a cavity extending inward from the first surface; a semiconductor die, wherein a first portion of the semiconductor die is over the first surface and a second portion of the semiconductor die is over the cavity; and
an interposer, wherein at least a portion of the interposer is in the cavity and wherein the interposer comprises:
a dielectric material having a top surface and a bottom surface that is parallel to, or substantially parallel to, the top surface of the dielectric material;
a plurality of conductive strips over the top surface of the dielectric material; and a leadframe structure coupled to at least one terminal of the semiconductor die;
wherein a depth of the cavity of the heat spreader is greater than a thickness of the semiconductor die and wherein the leadframe structure has at least one opening;
wherein a first conductive strip of the plurality of conductive strips has a surface that is coplanar to, or substantially coplanar to, the first surface of the heat spreader.

2. A semiconductor component, comprising:
a heat spreader having a thickness, a first surface and a cavity extending a depth inward from the first surface, wherein the thickness of the heat spreader underneath the cavity is reduced by the depth of the cavity as compared to the thickness of the heat spreader that is not underneath the cavity;
a semiconductor die, wherein a first portion of the semiconductor die is over the first surface and a second portion of the semiconductor die is over the cavity;
an interposer having a thickness, wherein at least a portion of the interposer is in the cavity below a plane that is coplanar to, or substantially coplanar to, the first surface of the heat spreader and wherein the depth of the cavity is greater than the thickness of the interposer;
a leadframe structure coupled to at least one terminal of the semiconductor die; and
a polymer material in at least a portion of the cavity to surround the semiconductor die and the leadframe structure;
wherein the depth of the cavity of the heat spreader is greater than a thickness of the semiconductor die and wherein the leadframe structure has at least one opening.

3. The semiconductor component of claim 2, wherein the interposer comprises a dielectric material and a plurality of electrically conductive strips on the dielectric material.

4. A semiconductor component, comprising:
a heat spreader having a thickness, a first surface and a cavity extending a depth inward from the first surface, wherein the thickness of the heat spreader underneath the cavity is reduced by the depth of the cavity as compared to the thickness of the heat spreader that is not underneath the cavity;
a semiconductor die, wherein a first portion of the semiconductor die is over the first surface and a second portion of the semiconductor die is over the cavity; and
an interposer, wherein at least a portion of the interposer is in the cavity and wherein the interposer comprises:
a dielectric material having a top surface and a bottom surface that is parallel to, or substantially parallel to, the top surface of the dielectric material;
a plurality of conductive strips over the top surface of the dielectric material; and
a leadframe structure coupled to at least one terminal of the semiconductor die;
wherein a depth of the cavity of the heat spreader is greater than a thickness of the semiconductor die and wherein the leadframe structure has at least one opening.

5. The semiconductor component of claim 4, wherein the semiconductor die has a top surface and a bottom surface that is parallel to, or substantially parallel to, the top surface of the semiconductor die, the semiconductor die has a first terminal on the top surface of the semiconductor die and contacting a first conductive strip of the plurality of conductive strips, a second terminal on the top surface of the semiconductor die and contacting the first surface of the heat spreader, and a third terminal on the bottom surface of the semiconductor die, wherein the first terminal, the second terminal, and the third terminal are electrically isolated from each other.

6. The semiconductor component of claim 4, wherein the dielectric material comprises a ceramic, a polyimide, or a polymer material.

7. A semiconductor component, comprising:
a heat spreader having a thickness, a first surface and a cavity extending a depth inward from the first surface, wherein the thickness of the heat spreader underneath the cavity is reduced by the depth of the cavity as compared to the thickness of the heat spreader that is not underneath the cavity;
a semiconductor die, wherein a first portion of the semiconductor die is over the first surface and a second portion of the semiconductor die is over the cavity;
an interposer, wherein at least a portion of the interposer is in the cavity and wherein the interposer comprises a flexible dielectric material; and
a leadframe structure coupled to at least one terminal of the semiconductor die;
wherein the depth of the cavity of the heat spreader is greater than a thickness of the semiconductor die and wherein the leadframe structure has at least one opening;
wherein the semiconductor die is a discrete transistor having a first terminal which is a gate terminal, a second terminal which is a source terminal, and a third terminal which is a drain terminal;
wherein a gate lead is coupled to the gate terminal, a source lead is coupled to the source terminal, and a drain lead is coupled to the drain terminal;
wherein a first surface of the gate lead is coplanar to, or substantially coplanar to, a first surface of the source lead; and
wherein the first surface of the source lead is coplanar to, or substantially coplanar to, a first surface of the drain lead.

8. The semiconductor component of claim 7, wherein the semiconductor die has a top surface and a bottom surface that is parallel to, or substantially parallel to, the top surface of the semiconductor die and the first terminal is on the top surface of the semiconductor die and coupled to the interposer, the second terminal on the top surface of the semiconductor die and coupled to the first surface of the heat spreader, and the third terminal on the bottom surface of the semiconductor die, wherein the first terminal, the second terminal, and the third terminal are electrically isolated from each other.

9. The semiconductor component of claim 7, wherein the flexible dielectric material comprises polyimide.

10. The semiconductor component of claim 7, wherein the interposer further comprises a plurality of electrically conductive strips on the dielectric material.

11. A semiconductor component, comprising:
a heat sink having a thickness, a first surface, a second surface that is parallel to, or substantially parallel to, the first surface of the heat sink, and a cavity extending a depth from the first surface of the heat sink into the heat sink, wherein the thickness of the heat sink underneath the cavity is reduced by the depth of the cavity as compared to the thickness of the heat sink that is not underneath the cavity;
a semiconductor die having a first surface and a second surface that is parallel to, or substantially parallel to, the first surface of the semiconductor die, wherein the semiconductor die comprises a first terminal adjacent to the first surface of the semiconductor die, a second terminal adjacent to the first surface of the semiconductor die, and a third terminal adjacent to the second surface of the semiconductor die, and wherein the first terminal is electrically isolated from the second terminal and the third terminal and the second terminal is electrically isolated from the third terminal, wherein at least a portion of the semiconductor die is in the cavity and the second terminal is coupled to the heat sink;
a leadframe structure coupled to the first terminal of the semiconductor die; and
a dielectric material in at least a portion of the cavity, wherein the dielectric material surrounds a first portion of the leadframe structure and a first portion of the semiconductor die;
wherein the depth of the cavity of the heat sink is greater than a thickness of the semiconductor die and wherein the leadframe structure has at least one opening;
wherein a first lead coupled to a second portion of the leadframe structure; and a second lead coupled to the third terminal of the semiconductor die;
wherein the first lead is electrically isolated from the second lead;
wherein the first lead has a first surface that is coplanar to, or substantially coplanar to, a first surface of the second lead and is noncoplanar to the first and second surfaces of the heat sink;
wherein the semiconductor die is a discrete transistor; and
wherein the first terminal is a gate terminal, the second terminal is a source terminal, and the third terminal is a drain terminal.

12. The semiconductor component of claim 11, wherein the dielectric material is a glob top material or a mold compound.

13. The semiconductor component of claim 11, wherein the heat sink further comprises a pedestal portion in the cavity and extending from a lower portion of the cavity.

14. The semiconductor component of claim 13, wherein the pedestal portion has a first surface that is noncoplanar to the first and second surfaces of the heat sink and is parallel to, or substantially parallel to, the first and second surfaces of the heat sink.

15. The semiconductor component of claim 14, wherein the first surface of the pedestal portion extends from the lower portion of the cavity to a height that is below the first surface of the heat sink; and wherein the second terminal is coupled to the first surface of the pedestal portion of the heat sink.

* * * * *